(12) United States Patent  (10) Patent No.: US 7,533,960 B2
Yasuda et al.  (45) Date of Patent: May 19, 2009

(54) LIQUID DISCHARGE HEAD, AND METHOD OF MANUFACTURING LIQUID DISCHARGE HEAD

(75) Inventors: Junji Yasuda, Kawasaki (JP);
Katsuhiko Takano, Yokohama (JP);
Manabu Sueoka, Yokohama (JP);
Shigeo Takenaka, Kamakura (JP);
Katsumasa Nishikawa, Tokyo (JP);
Kenta Udagawa, Yokohama (JP);
Toshiaki Hirosawa, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 60 days.

(21) Appl. No.: 11/567,987

(22) Filed: Dec. 7, 2006

(65) Prior Publication Data

US 2007/0139469 A1 Jun. 21, 2007

(30) Foreign Application Priority Data

Dec. 15, 2005 (JP) ............................. 2005-361183
Mar. 10, 2006 (JP) ............................. 2006-066322
Oct. 18, 2006 (JP) ............................. 2006-283800
Nov. 27, 2006 (JP) ............................. 2006-318358

(51) Int. Cl.
*B41J 2/205* (2006.01)
(52) U.S. Cl. .......................................... 347/40; 347/58
(58) Field of Classification Search .................. 347/40, 347/43, 50, 58, 59; 29/890.1
See application file for complete search history.

(56) References Cited

U.S. PATENT DOCUMENTS

| 5,398,053 | A | 3/1995 | Hirosawa et al. |
| 5,485,185 | A | 1/1996 | Sueoka et al. |
| 6,024,439 | A | 2/2000 | Sueoka et al. |
| 6,062,675 | A | 5/2000 | Hirosawa et al. |
| 6,209,988 | B1 | 4/2001 | Sueoka et al. |
| 6,371,604 | B1 | 4/2002 | Yamane et al. |
| 6,471,901 | B1 | 10/2002 | Kawamura et al. |
| 6,609,782 | B2 | 8/2003 | Mori |
| 6,686,945 | B1 * | 2/2004 | Takizawa et al. ............ 347/208 |
| 6,877,839 | B2 * | 4/2005 | Kawamura et al. ............ 347/50 |
| 7,118,199 | B2 * | 10/2006 | Mori ............................. 347/58 |
| 2006/0027937 | A1 | 2/2006 | Benson et al. |
| 2007/0242101 | A1 | 10/2007 | Hirosawa et al. |

FOREIGN PATENT DOCUMENTS

JP 10-776 1/1998
JP 2002-19120 1/2002

* cited by examiner

*Primary Examiner*—Lamson D Nguyen
(74) *Attorney, Agent, or Firm*—Fitzpatrick, Cella, Harper & Scinto

(57) ABSTRACT

A liquid discharge head comprises: a discharge element substrate including a discharge port for discharging liquid and a discharge energy generating element; an electrical wiring substrate for inputting an electrical signal to the discharge energy generating element; a supporting mechanism for supporting the discharge element substrate and the electrical wiring substrate; an electrical connection portion for electrically connecting the discharge element substrate with the electrical wiring substrate; a sealant coated on the electrical connection portion; and a film-like member coating the electrical connection portion along the shape of the electrical connection portion through the sealant. Thus, the liquid discharge head resultingly includes the electrical connection portion on which the height of the sealant is suppressed and lowered sufficiently so as to prevent a problem that the electrical connection portion is damaged and/or exposed due to its height.

6 Claims, 45 Drawing Sheets

LIQUID DISCHARGE HEAD, AND METHOD OF MANUFACTURING LIQUID DISCHARGE HEAD

BACKGROUND OF THE INVENTION

1. Field of the Invention

The present invention relates to a liquid discharge head which discharges liquids such as ink or the like, and a method of manufacturing the relevant liquid discharge head.

2. Description of the Related Art

As an energy generating element (liquid discharge element) which generates energy for discharging liquids from a liquid discharge port provided on a liquid discharge head, the element which uses an electromechanical transducer such as a piezoelectric element or the like and the element which uses an electrothermal transducer for heating liquids through a heat generating resistor are used.

Besides, discharge energy generating elements, circuits for driving the discharge energy generating elements, a temperature sensor and the like are formed on a liquid discharge substrate. Further, to drive the liquid discharge elements at appropriate timing and to read information from the temperature sensor, the liquid discharge substrate exchanges digital signals, driving power, analog signals and the like with the outside of the liquid discharge head. Therefore, an electrical wiring substrate which is composed of a flexible circuit substrate and the like is used as measures for establishing such electrical connections.

More specifically, an external connection terminal of a recording element substrate and a terminal of the electrical wiring substrate are first set to be close to each other, and then wire bonding, inner lead bonding (ILB), an anisotropic conductive film (ACF) or the like is used to establish the electrical connection between these terminals.

The electrical connection portion between the liquid discharge substrate and the electrical wiring substrate is coated with a sealing resin so as to be protected from corrosion of the electrical connection portion due to liquid and disconnection of the wirings due to external force (see Japanese Patent Application Laid-Open No. 2002-019120). Typically, as shown in FIG. 44, the sealing portion of the electrical connection portion is formed by linearly applying a thixotropic sealant 511a along the line of electrical connection portions 510 with use of a needle 520 of the dispenser for applying the sealant (see Japanese Patent Application Laid-Open No. H10-000776). As shown in FIG. 44, the height of the sealing portion of the electrical connection portion 510 can be determined based on the position of the end of the needle 520 set at the time of applying the sealant. Thus, to prevent a risk that the end of the needle comes into contact with the electrical connection portion and thus damages it, in consideration of tolerance of parts, errors of device operations, and the like, the sealant 511a is applied in the state that a certain level of clearance between the end of the needle and the electrical connection portion is maintained.

In recent years, the liquid discharge head is requested to discharge liquid droplets with a high degree of accuracy of impact. Furthermore, according as the size of a liquid droplet becomes small, a possibility of being influenced by disturbances such as air stream and the like becomes high if a discharge distance of the ink droplet is long. As a result of consideration, it has been found that, to suppress errors of impact positions, it is most effective to further shorten the distance between the opening surface of the liquid discharge port and the medium to which the ink droplet is impacted. At this time, since the portion in the liquid discharge head closest to the medium is the top of the sealant of sealing the electrical connection portion, it is necessary in a liquid discharge device which is equipped with the liquid discharge head to suppress and thus lower the relative height between the opening surface of the liquid discharge port and the top of the sealant so that the sealant and the medium satisfy the position relation that the sealant is not in contact with the medium. However, in this case, if the height of the sealant is suppressed by a conventional method, there occurs a problem that the electrical connection portion is damaged and/or exposed.

SUMMARY OF THE INVENTION

An object of the present invention is to provide a liquid discharge head which includes an electrical connection portion on which the height of a sealant is suppressed, and a liquid discharge device which is equipped with the relevant liquid discharge head.

Another object of the present invention is to provide a liquid discharge head comprising: a discharge element substrate including a discharge port for discharging liquid and a discharge energy generating element; an electrical wiring substrate adapted to input an electrical signal to the discharge energy generating element; a supporting mechanism adapted to support the discharge element substrate and the electrical wiring substrate; an electrical connection portion adapted to electrically connect the discharge element substrate with the electrical wiring substrate; a sealing resin coated on the electrical connection portion; and a film-like member coating the electrical connection portion along a shape of the electrical connection portion through the sealing resin.

Still another object of the present invention is to provide a method of manufacturing a liquid discharge head, comprising: a step of electrically connecting a discharge element substrate including a discharge port for discharging liquid and a discharge energy generating element, with an electrical wiring substrate; a step of applying a sealing resin to an electrical connection portion between the discharge element substrate and the electrical wiring substrate; a step of adhering a film-like member to the sealing resin applied to the electrical connection portion; and a step of heating the sealing resin to which the film-like member was adhered, and fluxing the heated sealing resin to the periphery of the discharge element substrate.

Still another object of the present invention is to provide a method of manufacturing a liquid discharge head, comprising: a step of electrically connecting a discharge element substrate including a discharge port for discharging liquid and a discharge energy generating element, with an electrical wiring substrate; a step of applying a sealing resin to an electrical connection portion between the discharge element substrate and the electrical wiring substrate; and a step of reducing a protrusion amount of the sealing resin by depressing a mold member before the sealing resin applied to the electrical connection portion is cured.

Still another object of the present invention is to provide a liquid discharge head comprising: a recording element substrate on which plural nozzles for discharging liquid are arranged and plural recording elements for generating discharge energy to discharge the liquid from the nozzles are arranged; and an electrical wiring substrate electrically connected with the recording element substrate, wherein an electrical connection portion between the recording element substrate and the electrical wiring substrate is coated with a sealing resin, and the sealing resin is coated with an extension portion formed by stretching a cover film provided on a surface of the electrical wiring substrate.

Still another object of the present invention is to provide a method of manufacturing a liquid discharge head which comprises a recording element substrate on which plural nozzles for discharging liquid are arranged and plural recording elements for generating discharge energy to discharge the liquid from the nozzles are arranged, and comprises an electrical wiring substrate electrically connected with the recording element substrate, and in which an electrical connection portion between the recording element substrate and the electrical wiring substrate is coated with a sealing resin, and the sealing resin is coated with an extension portion formed by stretching a cover film of a surface of the electrical wiring substrate, the method comprising: a first step of applying the sealing resin to the electrical connection portion between the recording element substrate and the electrical wiring substrate; and a second step of coating the sealing resin with the extension portion of the cover film before the sealing resin is completely cured.

Still another object of the present invention is to provide a method of manufacturing a liquid discharge head which comprises a recording element substrate on which plural nozzles for discharging liquid are arranged and plural recording elements for generating discharge energy to discharge the liquid from the nozzles are arranged, and comprises an electrical wiring substrate electrically connected with the recording element substrate, and in which an electrical connection portion between the recording element substrate and the electrical wiring substrate is coated with a sealing resin, and the sealing resin is coated with an extension portion formed by stretching a cover film of a surface of the electrical wiring substrate, the method comprising: a first step of applying the sealing resin to the cover film; and a second step of coating the electrical connection portion with the cover film before the sealing resin is completely cured.

Further features of the present invention will become apparent from the following description of exemplary embodiments (with reference to the attached drawings).

BRIEF DESCRIPTION OF THE DRAWINGS

FIG. 2A is the exterior perspective view of the recording head, and FIG. 2B is the exploded perspective view thereof.

FIG. 3A is the perspective view of the recording element substrate, and FIG. 3B is the cross sectional view along the line 3B-3B shown in FIG. 3A.

FIG. 5A is the perspective view showing the recording element substrate of the recording head and the periphery thereof, and FIG. 5B is the cross sectional view along the line 5B-5B shown in FIG. 5A.

FIG. 6A is the perspective view showing the recording element substrate of the recording head and the periphery thereof, and FIG. 6B is the cross sectional view along the line 6B-6B shown in FIG. 6A.

FIG. 8A is the perspective view showing the recording element substrate of the recording head and the periphery thereof, and FIG. 8B is the cross sectional view along the line 8B-8B shown in FIG. 8A.

FIG. 9A is the perspective view showing the recording element substrate of the recording head and the periphery thereof, and FIG. 9B is the cross sectional view along the line 9B-9B shown in FIG. 9A.

FIG. 10A is the perspective view showing a recording element substrate of the recording head and the periphery thereof, and FIG. 10B is the cross sectional view along the line 10B-10B shown in FIG. 10A.

FIG. 11A is the perspective view showing the recording element substrate of the recording head and the periphery thereof, and FIG. 11B is the cross sectional view along the line 11B-11B shown in FIG. 11A.

FIG. 12A is the perspective view showing the recording element substrate of the recording head and the periphery thereof, and FIG. 12B is the cross sectional view along the line 12B-12B shown in FIG. 12A.

FIG. 13A is the perspective view showing the recording element substrate of the recording head and the periphery thereof, and FIG. 13B is the cross sectional view along the line 13B-13B shown in FIG. 13A.

FIG. 14A is the perspective view showing a recording element substrate of the recording head and the periphery thereof, and FIG. 14B is the cross sectional view along the line 14B-14B shown in FIG. 14A.

FIG. 15A is the perspective view showing the recording element substrate of the recording head and the periphery thereof, and FIG. 15B is the cross sectional view along the line 15B-15B shown in FIG. 15A.

FIG. 16A is the perspective view showing a recording element substrate of the recording head and the periphery thereof, and FIG. 16B is the cross sectional view along the line 16B-16B shown in FIG. 16A.

FIG. 17A is the perspective view showing the recording element substrate of the recording head and the periphery thereof, and FIG. 17B is the cross sectional view along the line 17B-17B shown in FIG. 17A.

FIG. 18A is the perspective view showing the recording element substrate of the recording head and the periphery thereof, and FIG. 18B is the cross sectional view along the line 18B-18B shown in FIG. 18A.

FIG. 19A is the perspective view showing a recording element substrate of the recording head and the periphery thereof, and FIG. 19B is the cross sectional view along the line 19B-19B shown in FIG. 19A.

FIG. 20A is the perspective view showing the recording element substrate of the recording head and the periphery thereof, and FIG. 20B is the cross sectional view along the line 20B-20B shown in FIG. 20A.

FIG. 21A is the perspective view showing a recording element substrate of the recording head and the periphery thereof, and FIG. 21B is the cross sectional view along the line 21B-21B shown in FIG. 21A.

FIG. 22A is the perspective view showing a recording element substrate of the recording head and the periphery thereof, and FIG. 22B is the cross sectional view along the line 22B-22B shown in FIG. 22A.

FIG. 25A is the cross sectional view showing a state of applying a sealant, FIG. 25B is the cross sectional view showing suppression of the height of a sealing portion and the reshaping process, and FIG. 25C is the cross sectional view showing a state of the sealing portion after curing.

FIG. 26A is the cross sectional view showing a state of applying the sealant, FIG. 26B is the cross sectional view showing suppression of the height of a sealing portion and the reshaping process, and FIG. 26C is the cross sectional view showing a state of the sealing portion after curing.

FIG. 27A is the cross sectional view showing a state of applying the sealant, FIG. 27B is the cross sectional view showing suppression of the height of a sealing portion and the reshaping process, and FIG. 27C is the cross sectional view showing a state of the sealing portion after curing.

FIG. 28A is the perspective view showing a recording element substrate of the recording head and the periphery thereof, and FIG. 28B is the cross sectional view along the line 28B-28B shown in FIG. 28A.

FIG. 29A is the perspective view showing a recording element substrate of the recording head and the periphery thereof, and FIG. 29B is the cross sectional view along the line 29B-29B shown in FIG. 29A.

FIG. 30A is the perspective view showing a recording element substrate of the recording head and the periphery thereof, and FIG. 30B is the cross sectional view along the line 30B-30B shown in FIG. 30A.

FIG. 31A is the perspective view showing the recording element substrate of the recording head and the periphery thereof, and FIG. 31B is the cross sectional view along the line 31B-31B shown in FIG. 31A.

FIG. 32A is the perspective view showing the recording element substrate of the recording head and the periphery thereof, and FIG. 32B is the cross sectional view along the line 32B-32B shown in FIG. 32A.

FIG. 33A is the perspective view showing the recording element substrate of the recording head and the periphery thereof, and FIG. 33B is the cross sectional view along the line 33B-33B shown in FIG. 33A.

FIG. 34A is the perspective view showing the recording element substrate of the recording head and the periphery thereof, and FIG. 34B is the cross sectional view along the line 34B-34B shown in FIG. 34A.

FIG. 35A is the perspective view showing a recording element substrate of the recording head and the periphery thereof, and FIG. 35B is the cross sectional view along the line 35B-35B shown in FIG. 35A.

FIG. 36A is the perspective view showing the recording element substrate of the recording head and the periphery thereof, and FIG. 36B is the cross sectional view along the line 36B-36B shown in FIG. 36A.

FIG. 37A is the perspective view showing the recording element substrate of the recording head and the periphery thereof, and FIG. 37B is the cross sectional view along the line 37B-37B shown in FIG. 37A.

FIG. 38A is the perspective view showing a recording element substrate of the recording head and the periphery thereof, and FIG. 38B is the cross sectional view along the line 38B-38B shown in FIG. 38A.

FIG. 39A is the perspective view showing the recording element substrate of the recording head and the periphery thereof, and FIG. 39B is the cross sectional view along the line 39B-39B shown in FIG. 39A.

FIG. 40A is the perspective view showing the recording element substrate of the recording head and the periphery thereof, and FIG. 40B is the cross sectional view along the line 40B-40B shown in FIG. 40A.

FIG. 41A is the perspective view showing a recording element substrate of the recording head and the periphery thereof, and FIG. 41B is the cross sectional view along the line 41B-41B shown in FIG. 41A.

FIG. 42A is the perspective view showing the recording element substrate of the recording head and the periphery thereof, and FIG. 42B is the cross sectional view along the line 42B-42B shown in FIG. 42A.

FIG. 43A is the perspective view showing the recording element substrate of the recording head and the periphery thereof, and FIG. 43B is the cross sectional view along the line 43B-43B shown in FIG. 43A.

DESCRIPTION OF THE EMBODIMENTS

Subsequently, embodiments of the present invention will be explained with reference to the attached drawings. Incidentally, it should be noted that the present invention is useful for a driving system of any mode. Here, the present invention will be explained by use of an inkjet recording head of a system for discharging ink from a discharge port by generating bubbles in the ink by means of heat energy generated from an electrothermal transducer.

Embodiment 1

A first embodiment of the present invention will be explained with reference to FIGS. 1 to 21B.

Figure 1:
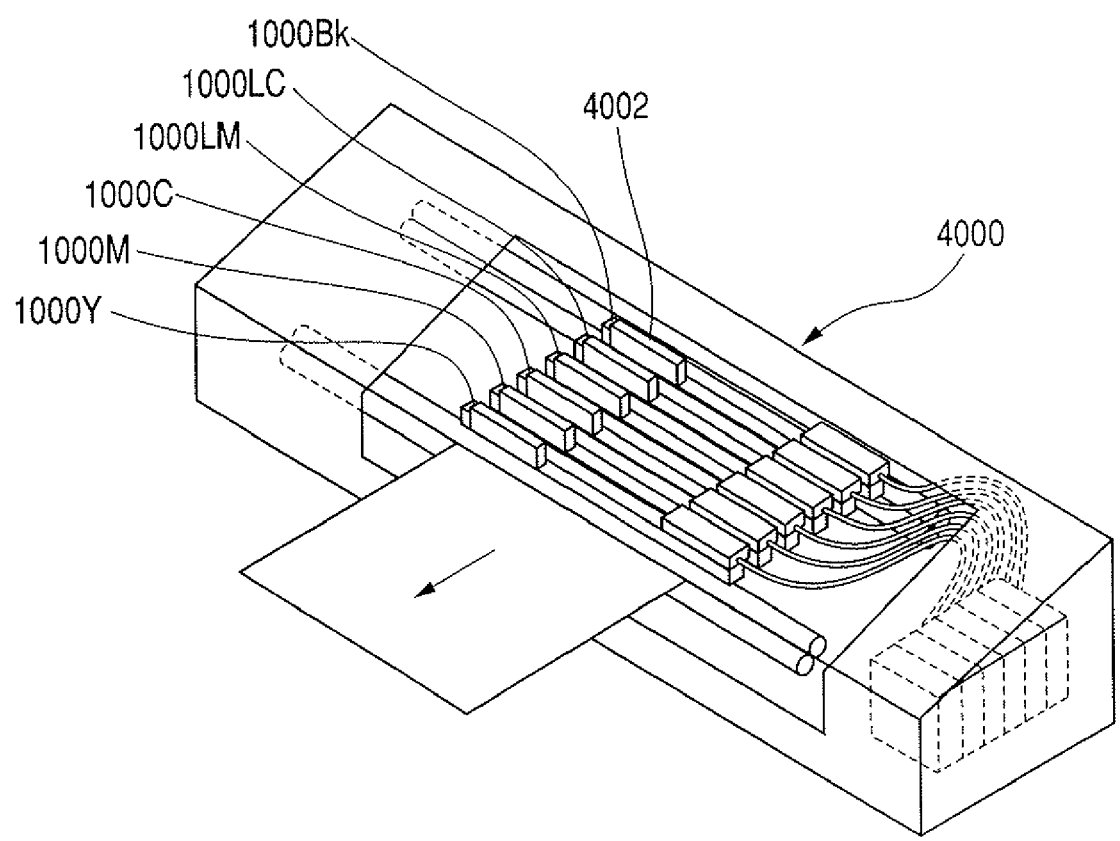
FIG. 1 is a view for explaining a recording device of full-line type.

As shown in FIG. 1, the main body of a recording device 4000 (for convenience, called a recording device main body 4000 hereinafter) acting as a liquid discharge device according to the embodiment of the present invention is equipped with, for example, recording heads of six colors in correspondence with recording of photographic image quality. A recording head 1000Bk is the recording head for a black ink, a recording head 1000C is the recording head for a cyan ink, a recording head 1000M is the recording head for a magenta ink, a recording head 1000Y is the recording head for an yellow ink, a recording head 1000LC is the recording head for a light cyan ink, and a recording head 1000LM is the recording head for a light magenta ink. It should be noted that, in the following, the recording heads 1000Bk, 1000C, 1000M, 1000Y, 1000LC and 1000LM might collectively be called simply as the recording head 1000 for convenience of explanation. The recording head 1000 is mounted on the recording device main body 4000 in the state capable of being electrically conductive to an electrical contact 4002. Then, the recording head 1000 is controlled by means of the driving circuit provided in the recording device main body 4000, whereby recording is executed to a recording medium transported by a transport mechanism. Incidentally, the recording device shown in FIG. 1 is equipped with the recording head of full-line type on which nozzles are disposed over the length corresponding to the width of the recording medium. Since the recording head is fixed, the recording is executed by scanning (transporting) the recording medium in the direction indicated by the arrow.

Figure 2A:
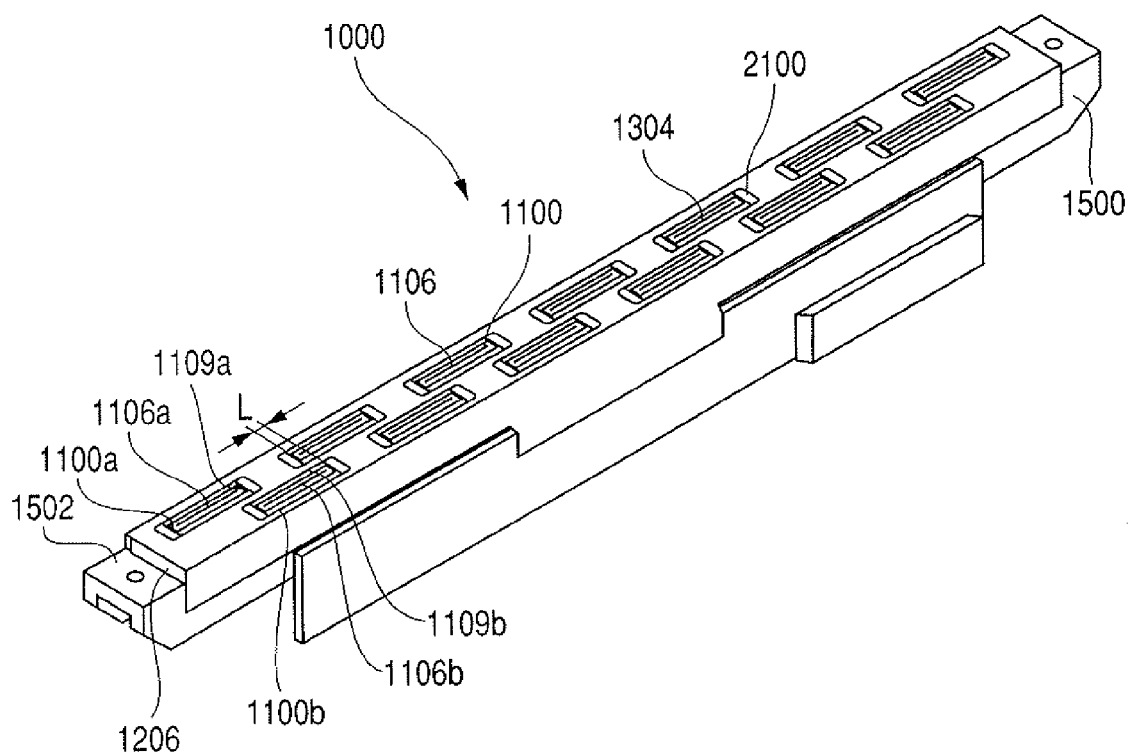
FIGS. 2A and 2B are views for explaining a recording head according to the embodiments of the present invention. More specifically.

FIG. 2A is the perspective view showing the recording head 1000 which executes the recording by throwing ink. The end of a nozzle group 1106 of each recording element substrate 1100 is provided with an area width L which overlaps, in the recording direction, the end of the nozzle group of the recording element substrate adjacent in zigzag, thereby preventing gaps occurred in the printing by each recording element substrate. For example, overlapping areas 1109a and 1109b are provided respectively on nozzle groups 1106a and 1106b of recording element substrates 1100a and 1100b.

Figure 2B:
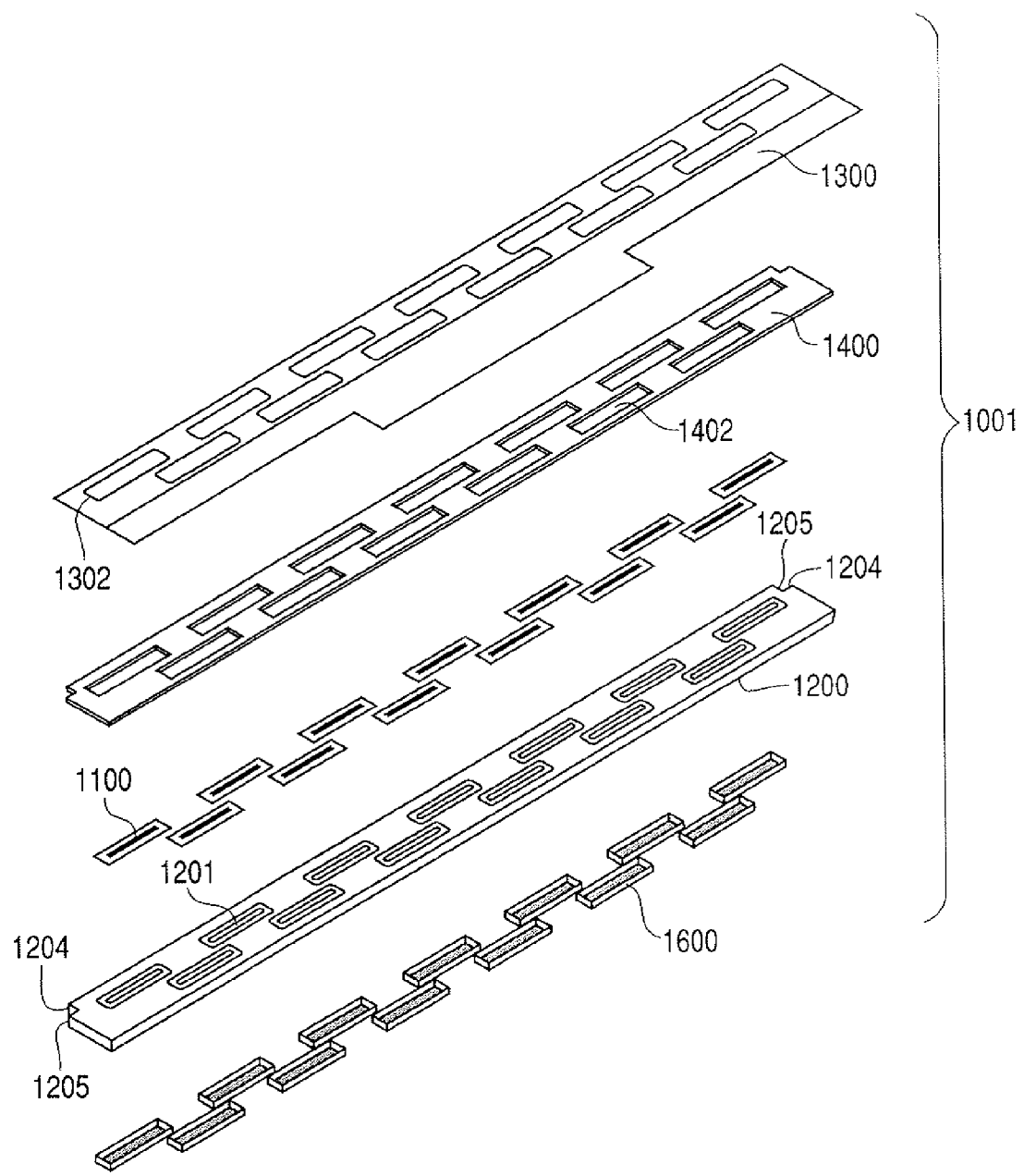

As shown in the perspective view of FIG. 2B, a recording element unit 1001 comprises the recording element substrate 1100 acting as the discharge element substrate, a first plate 1200, an electrical wiring substrate 1300, a second plate 1400 constituting the supporting mechanism together with the first plate 1200, and the like.

Figure 3A:
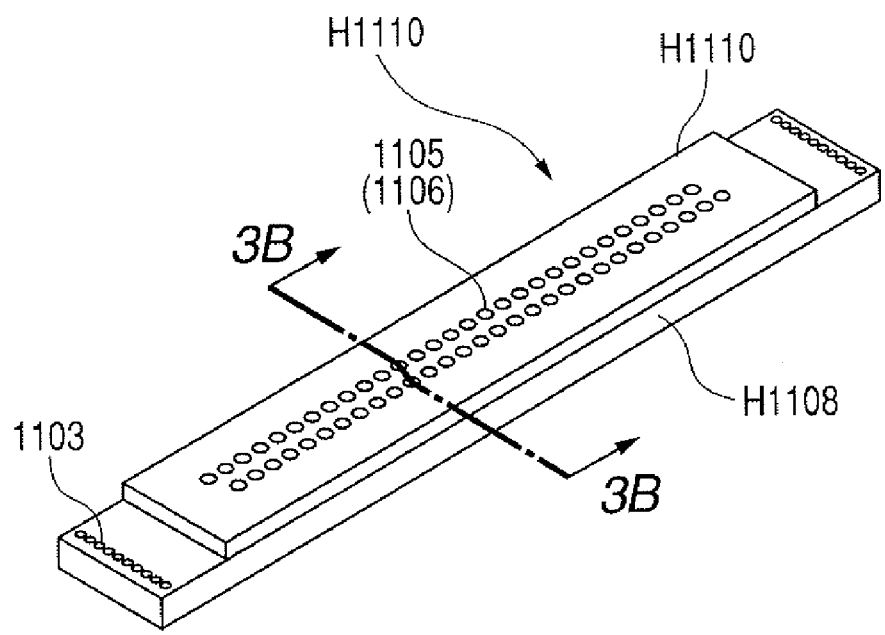
FIGS. 3A and 3B are views showing the recording element substrate of the recording head shown in FIGS. 2A and 2B. More specifically.
Figure 3B:
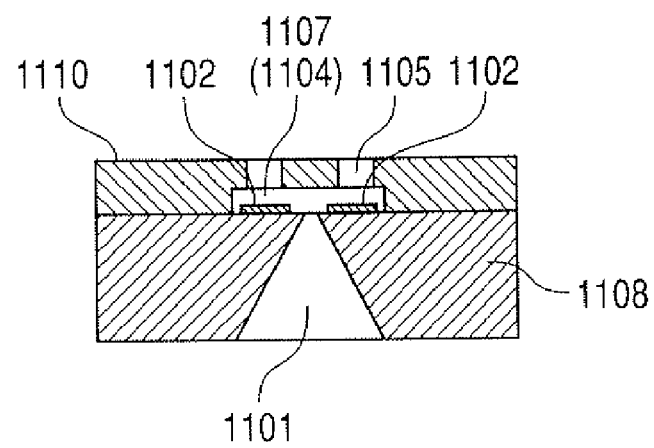

FIG. 3A is the perspective view showing the constitution of the recording element substrate 1100, and FIG. 3B is the cross sectional view along the line 3B-3B shown in FIG. 3A. As illustrated in FIG. 3B, an ink supply port 1101 which is a through-port of long-groove type is formed as an ink flow path, and an electrothermal transducer 1102 which acts as the discharge energy generating element is disposed in line at each of both the sides of the ink supply port 1101. Further, an electrode 1103 for inputting/outputting electrical signals and supplying power to drive the electrothermal transducer 1102 is provided.

A discharge port formed surface 1110 is provided on a Si substrate 1108. Further, an ink flow path 1104 corresponding to the electrothermal transducers 1102, a nozzle group 1106 consisting of plural nozzles (discharge ports) 1105, and a bubble generating chamber 1107 are formed on the Si substrate 1108 by a photolithography technique. The nozzles 1105 are provided so as to be opposite to the electrothermal transducer 1102, and bubbles are generated, by the electrothermal transducer 1102, in the ink supplied from the ink supply port 1101, thereby discharging the ink.

An ink supply port 1201 for supplying the ink to the recording element substrate 1100 is formed on the first plate 1200. The recording element substrate 1100 is adhered and fixed to the first plate 1200 with a high degree of positional accuracy so that the ink supply port 1101 of the recording element substrate 1100 corresponds to the ink supply port 1201 of the first plate 1200. It is preferable for the adhesive to be used in this case to have, for example, low viscosity, a thin adhesive layer formed on the contact surface, a relatively high degree of hardness after curing, and ink resistivity. For example, a thermosetting adhesive mainly composed of epoxy resin or a thermosetting adhesive also acting as a UV cured adhesive is preferable, and the thickness of the relevant adhesive layer is preferably 50 μm or less. Moreover, the first plate 1200 has X-direction bases 1204 and Y-direction bases 1205 acting as the bases for positioning, a Z-direction basis 1206 abutted against a Z basis 1502 of an ink supply member 1500, and the like, and the first plate 1200 is fixed to the ink supply member 1500 by an adhesive 1503.

The electrical wiring substrate 1300, which is to apply electrical signals for ink discharge to the recording element substrate 1100, has the openings into which the recording element substrates 1100 are fit respectively. The second plate 1400 is adhered and fixed to the rear surface of the electrical wiring substrate 1300. Furthermore, the electrical wiring substrate 1300 is equipped with an electrode terminal 1302 corresponding to the electrode 1103 of the recording element substrate 1100, an external signal input terminal positioned at the end of the wiring substrate to receive electrical signals from the recording device main body, and the like. For example, a flexible wiring substrate comprising double-structure wirings is used as the material of the electrical wiring substrate 1300, and the surface of the electrical wiring substrate 1300 is coated with polyimide.

The second plate 1400 comprises the recording element substrates 1100 respectively adhered and fixed to the first plate 1200 and openings 1402 into which the recording element substrates 1100 are fit respectively, and the second plate 1400 is adhered and fixed to the first plate 1200.

Moreover, a filter member 1600 for eliminating foreign matters mixed in the ink is adhered and fixed to the ink supply port 1201 on the rear surface of the first plate 1200.

A sealant 1304 is filled in the groove formed by the opening of the second plate 1400 and the side surface of the recording element substrate 1100, so as to seal the packaging portions of the electrical wiring substrate 1300. Furthermore, the electrode 1103 of the recording element substrate 1100 and the like are sealed by a sealing resin 2000 and a film-like member 2100 both described later so as to protect the electrical connection portion from corrosion due to ink and external impact.

Figure 4:
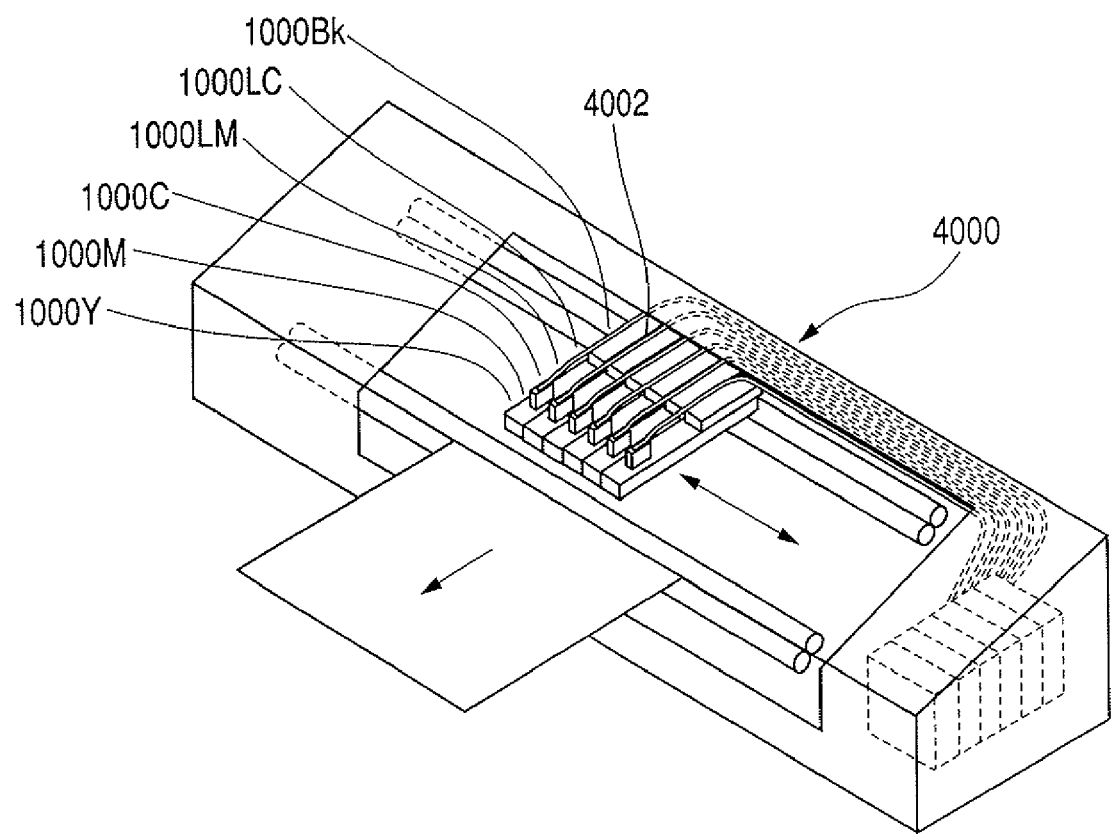
FIG. 4 is a view for explaining a recording device of serial scan type.

Incidentally, the above-described recording head is also applicable to an inkjet recording device of serial scan type, as shown in FIG. 4, which executes recording in the longitudinal direction of a recording medium as reciprocating the carriage comprising the recording head in the width direction of the recording medium.

Subsequently, the electrical connection portion between the recording element substrate 1100 and the electrical wiring substrate 1300 and the protection thereof will be explained in detail with reference to FIGS. 5A to 21B. Incidentally, in the present embodiment, the height of the sealing resin for sealing the electrical connection portion between the external connection terminal of the recording element substrate and the terminal of the electrical wiring substrate is suppressed by use of the film-like member. Furthermore, although a method using wire bonding, a method using inner lead bonding (ILB), a method using an anisotropic conductive film (ACF) or the like is practically used as a concrete electrical connection method, it should be noted that the present embodiment is applicable to any method.

Moreover, although a polyimide film, an aramid film, a PET (polyethylene terephthalate) film and the like are applicable as the material of the film-like member 2100, the material having high resistivity for the ink to be used in the inkjet recording is preferable even in this case. The thickness of the film-like member 2100 is suitably 3 µm or more and 10 µm or less. However, with the object of handling in manufacturing and ease in reshaping according to the shape of the surface of the sealant, it is preferable to have the thickness of 5 µm or more and 8 µm or less. Considering the object of the present embodiment, the film-like member 2100 preferably has the thickness of at least 200 µm or less. Besides, on the surface of the film-like member 2100, it is all the more effective if the adhesive force on the side to be adhered to the sealing resin 2000 is increased through plasma treatment, corona treatment, blasting treatment or the like to be executed as a pre-process. In any case, it should be noted that the above matters concerning the film-like member 2100 are all applicable to the present embodiment.

Figure 5A:
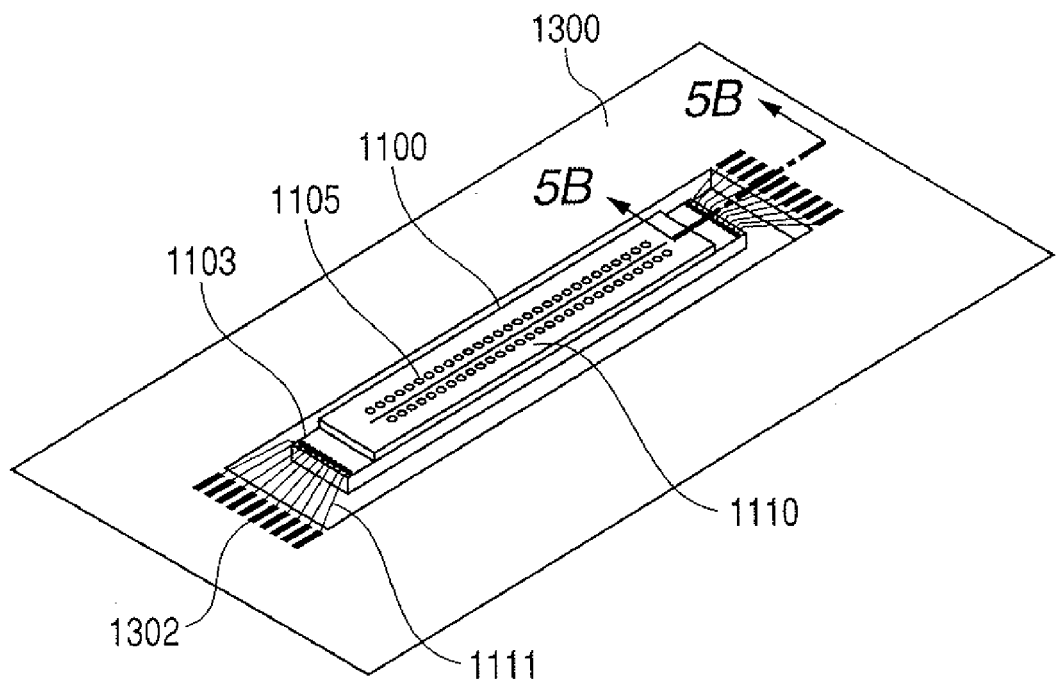
FIGS. 5A and 5B are views for explaining the manufacturing process of the recording head shown in FIG. 4. More specifically.
Figure 5B:
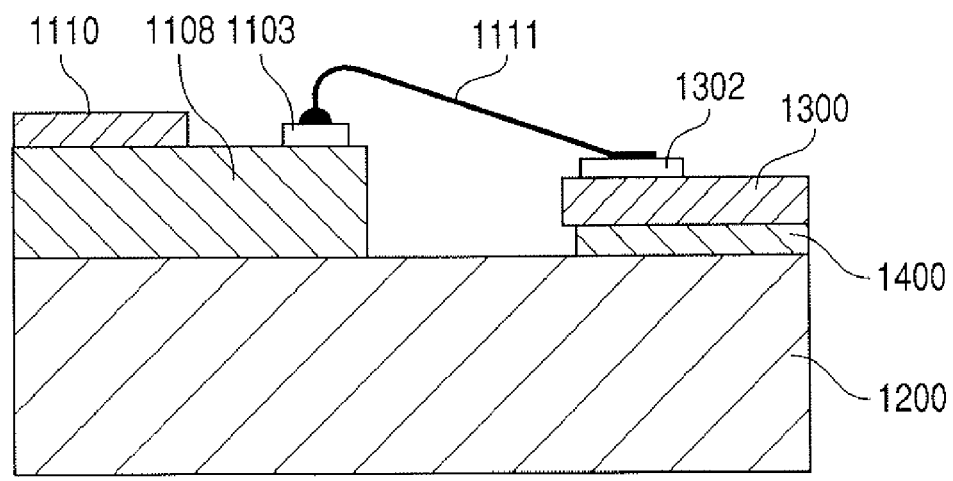

FIG. 5A is the perspective view enlargedly showing one of the recording element substrates 1100 of the recording head 1000 and the periphery thereof, and FIG. 5B is the cross sectional view along the line 5B-5B shown in FIG. 5A. Here, it should be noted that each of FIGS. 6 and 8 to 21 is likewise composed of the perspective view and the cross sectional view.

The electrode 1103, through which inputting/outputting of electrical signals and supplying of electrical power are executed for the recording element substrate 1100, and the electrical wiring substrate 1300 are mutually connected through bonding wires 1111 formed by the wire bonding method, whereby conductive connection is established between the electrode 1103 and the electrical wiring substrate 1300.

Figure 6A:
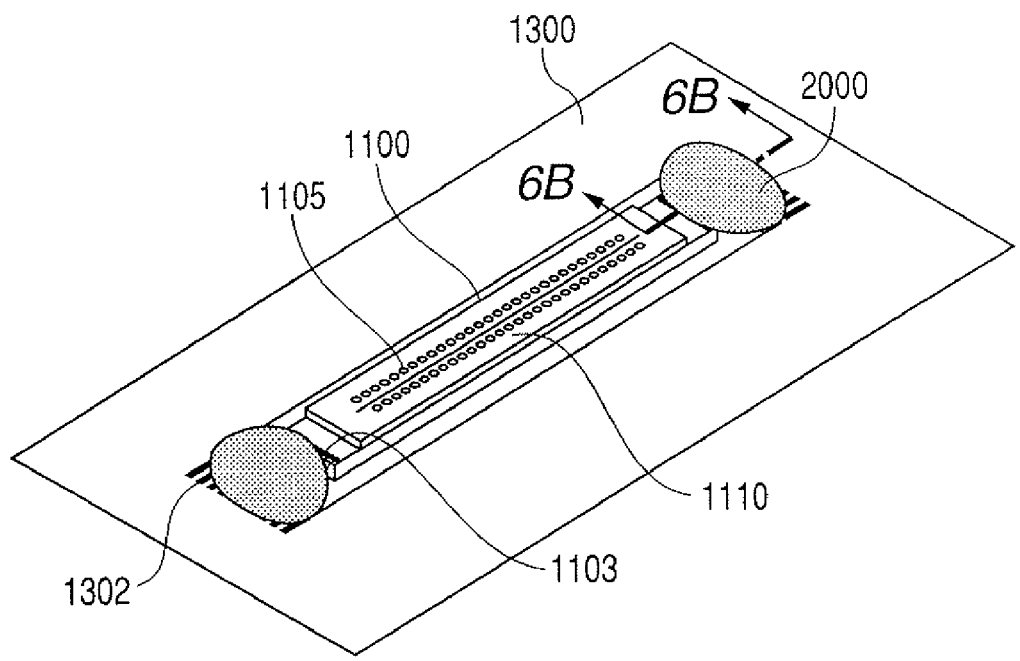
FIGS. 6A and 6B are views for explaining the manufacturing process of the recording head shown in FIG. 4. More specifically.
Figure 6B:
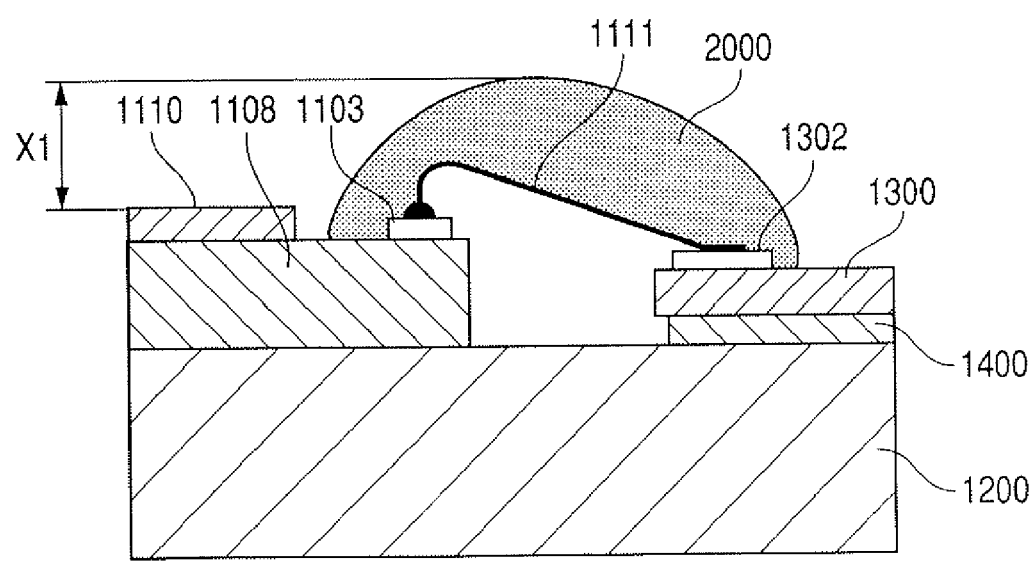

As the next step in the electrical connection process by the wire bonding, as shown in FIGS. 6A and 6B, the sealing resin 2000 composed of a non-solvent epoxy resin and the like is applied so as to be able to coat the bonding wires 1111.

Figure 7:
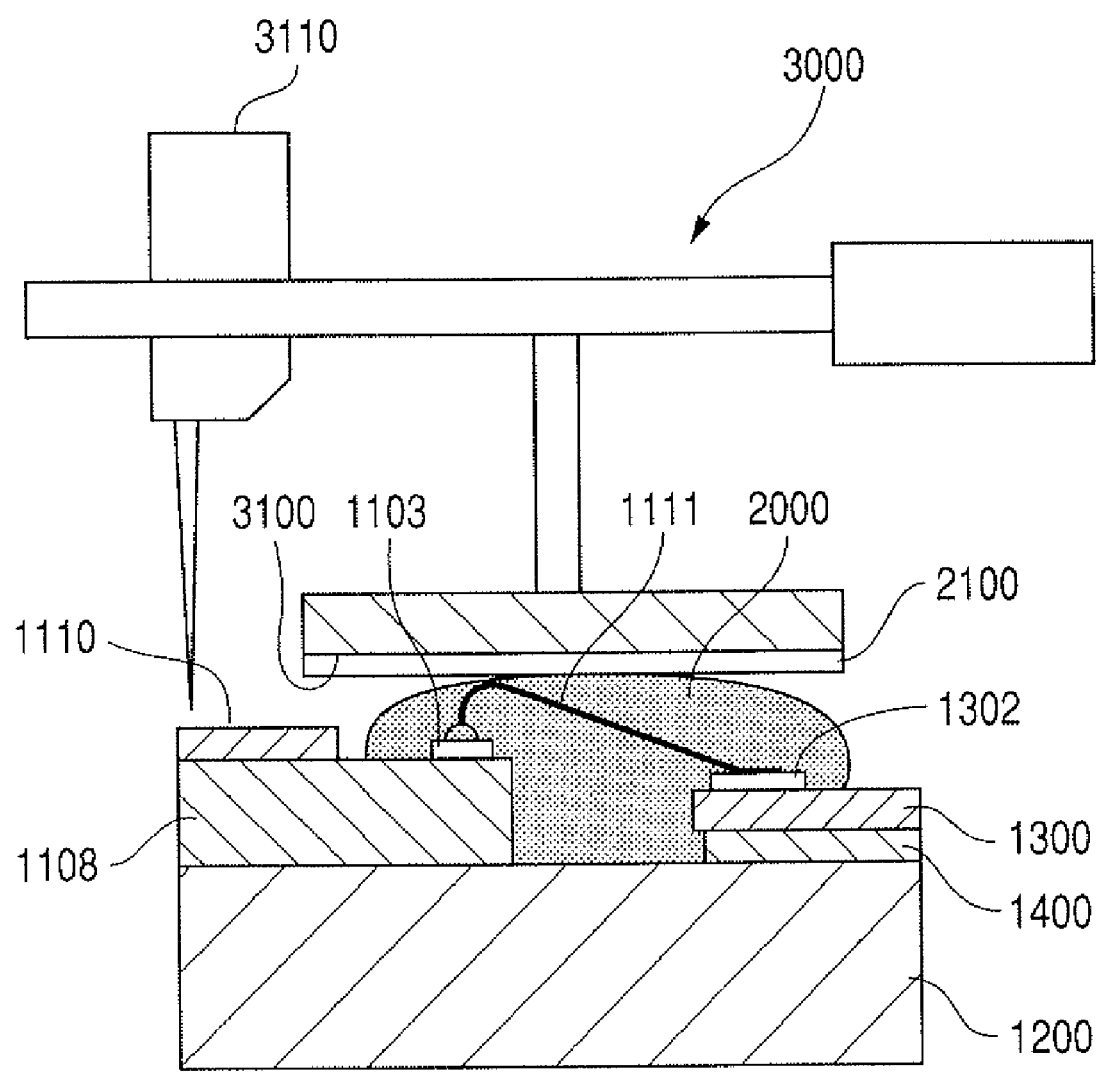
FIG. 7 is a view for explaining a device which puts a film-like member on a sealant.

Next, the film-like member 2100 composed of polyimide is applied and set on the upper surface of the sealing resin 2000 by using a device 3000 as shown in FIG. 7.

The film-like member 2100 can be moved upward and downward below by the device 3000, and an absorption surface 3100 capable of absorbing the film-like member by suction pressure is provided on the lower surface of the film-like member 2100. The absorption surface 3100 is moved downward so that the film-like member 2100 comes close to the sealing resin 2000. Then, the absorption surface 3100 is stopped at the position where the film-like member 2100 slightly depresses the sealing resin 2000. At that time, the depression by the film-like member 2100 is controlled so that a height (protrusion amount) X1 of the sealing resin 2000 is reduced to a height X2 (FIG. 8B) corresponding to a desired distance from the uppermost surface layer of the discharge port formed surface 1110. Here, as shown in FIG. 7, the controlling is executed to first move the absorption surface 3100 downward as measuring the distance from the uppermost surface layer of the discharge port formed surface 1110 by use of a laser measuring machine 3110. At that time, the downward movement of the absorption surface 3100 is controlled so that the protrusion amount X1 of the depressed sealing resin 2000 becomes the desired height X2 from the uppermost surface layer of the discharge port formed surface 1110. Besides, another controlling might be executed so as to previously acquire the position of the absorption surface 3100 from the discharge port formed surface before the downward movement thereof, and then stop the absorption surface 3100 at the height X2 by measuring a downward movement amount from the previously acquired position. However, any controlling is possible if the height of the depressed sealing resin 2000 becomes the desired distance (that is, the distance close to the discharge port formed surface 1110 as much as possible insofar as the coating of the electrical connection portion by the sealing resin 2000 is not damaged) from the uppermost surface layer of the discharge port formed surface 1110.

In the circumstances, the suction pressure of the absorption surface 3100 is released to release the holding state of the film-like member 2100, and the absorption surface 3100 is then moved upward to be apart from the sealing resin 2000.

Subsequently, the process for suppressing the height of the sealing resin 2000 from the surface of the recording element substrate to the desired height and adhering the film-like member 2100 to the surface of the sealing resin 2000 coating the bonding wires 1111 (that is, the process for coating the electrical connection portion by the film-like member) will be explained hereinafter.

Figure 8A:
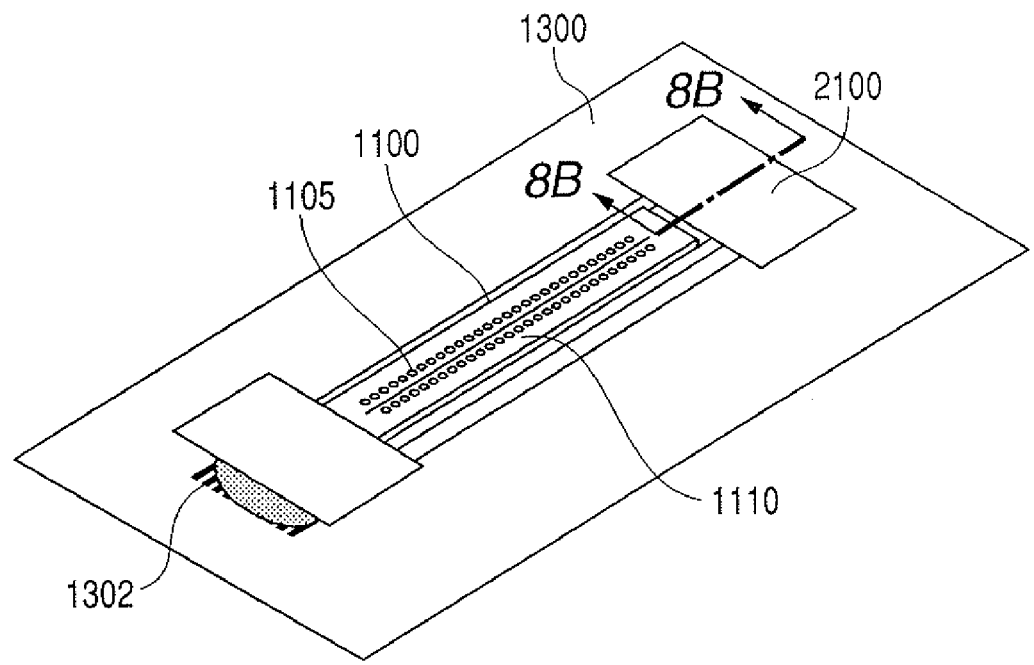
FIGS. 8A and 8B are views for explaining the manufacturing process of the recording head shown in FIG. 4. More specifically.
Figure 8B:
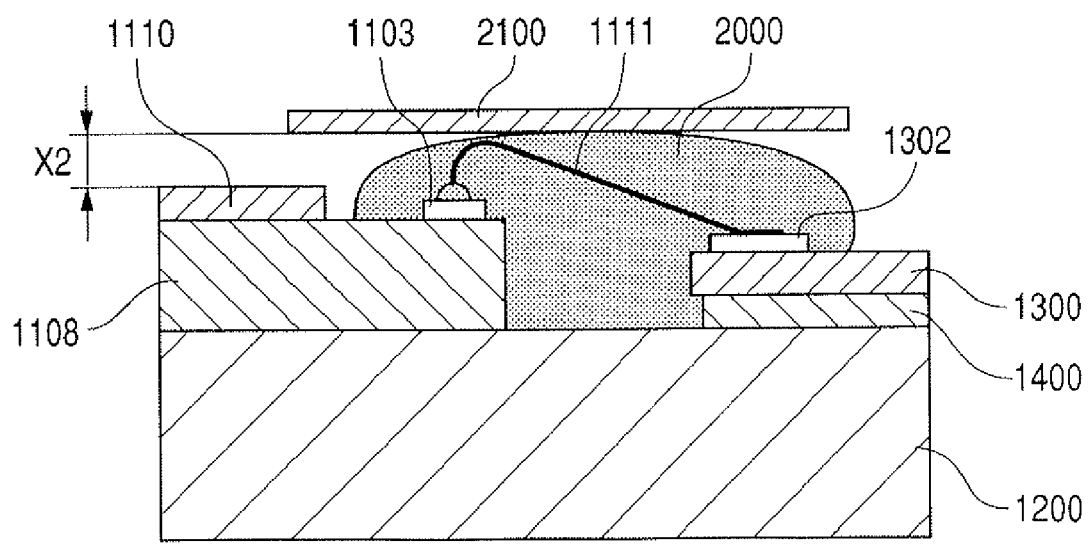

As shown in FIGS. 8A and 8B, heating of about 60° C. is executed to flux the sealing resin 2000, so that the sealing resin 2000 flows below the bonding wire 1111 and into the gap between the recording element substrate 1100 and the electrical wiring substrate 1300. Then, according as the sealing resin 2000 softened by heat comes down, the film-like member 2100 adhered to the surface of the sealing resin 2000 likewise comes down, whereby the film-like member 2100 comes close to the bonding wire 1111. Here, it should be noted that the heating in this fluxing process is executed to expedite the fluxion and shorten the process. Although a heating temperature and a heating time depend on the material of the sealing resin 2000, it is necessary to set them insofar as cure of the resin does not start. Of course, since the sealing resin 2000 fluxes even if there is no heat, such a heating process might be omitted.

Figure 9A:
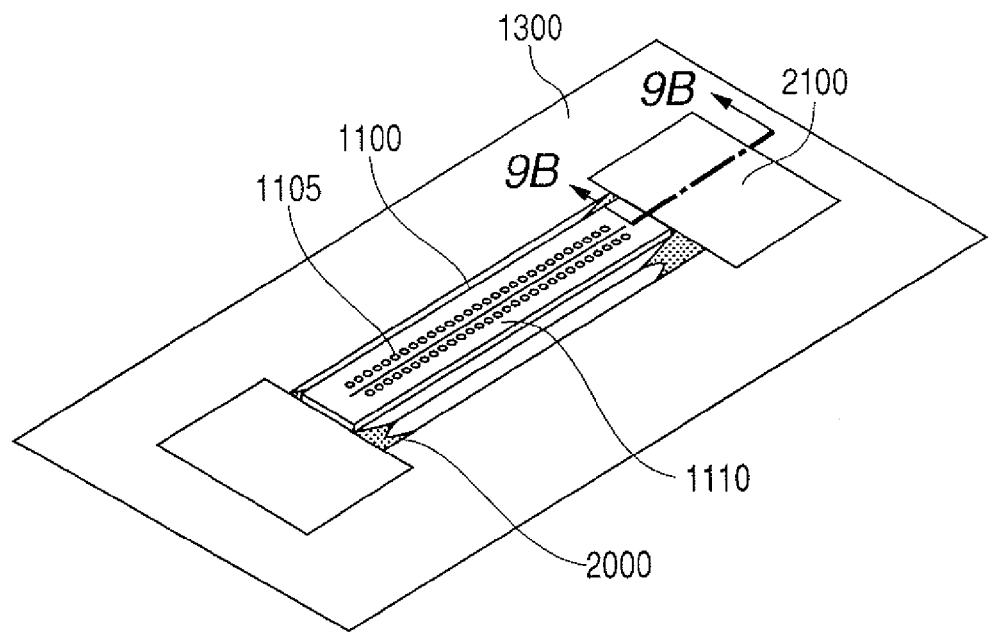
FIGS. 9A and 9B are views for explaining the manufacturing process of the recording head shown in FIG. 4. More specifically.
Figure 9B:
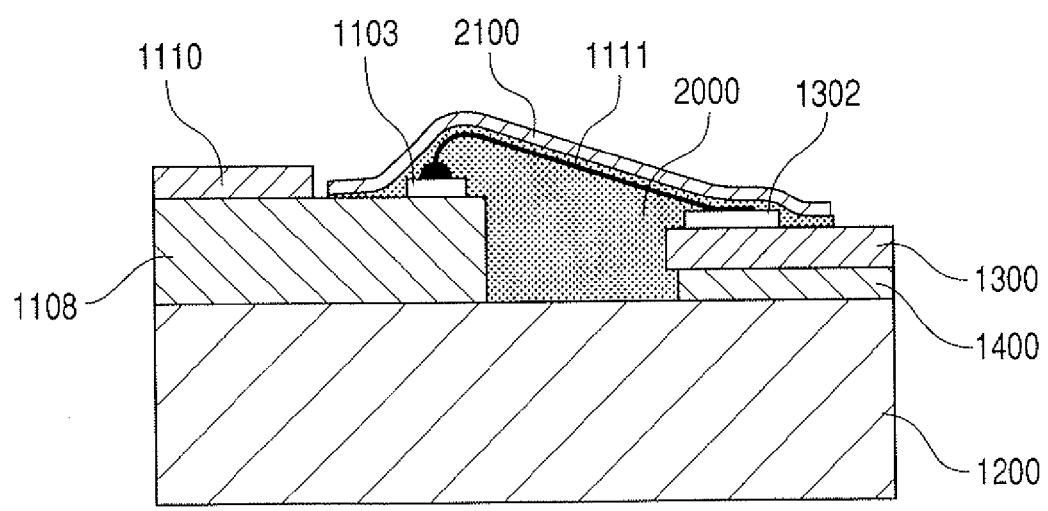

If the fluxion of the sealing resin 2000 continues, as shown in FIGS. 9A and 9B, the sealing resin 2000 flows along the longitudinal side of the recording element substrate 1100, and the film-like member 2100 adhered to the surface of the sealing resin 2000 further comes down according as the sealing resin 2000 comes down. Thus, the film-like member 2100 is adhered to the bonding wires 1111 being the electrical connection portion over the whole length thereof along the angular shape of the bonding wires 1111, through the sealing resin 2000 coating the bonding wires 1111. The fluxion of the sealing resin 2000 approximately stops at this moment. Heating of about 80° C. is executed for five consecutive hours in this state to cure the sealing resin 2000, and the process for coating the electrical connection portion is then completed. Incidentally, it should be noted that the heating temperature and the heating time are different according to the material of the sealing resin 2000.

In the present embodiment, the height X1 of the sealing resin 2000 from the discharge port formed surface 1110 in FIG. 6B is about 300 μm, and the height of the wire bonding 1111 from the discharge port formed surface 1110 in FIG. 6B is about 70 μm. On the other hand, the upper surface of the sealing resin 2000 is depressed by the absorption surface 3100 until the height of the film-like member 2100 from the discharge port formed surface 1110 becomes about 100 μm. Finally, since the sealing resin 2000 softens and thus comes down, the film-like member 2100 comes close to the position more close to the wire bonding 1111 through the sealing resin 2000. The above is the explanation of the process for coating the electrical connection portion by the film-like member.

Next, the embodiment in which a flying lead is used instead of the above bonding wire will be explained. Here, the whole constitution of the recording head, the sealing resin, the material, the shape and the thickness of the film-like member, the device for putting the film-like member on the sealing resin, and the like are approximately the same as those in the above explanation, whereby the explanations thereof will be omitted. In addition, the same constituent elements as those in the above explanation are represented respectively by the same numerals and symbols as those in the above explanation.

Figure 10A:
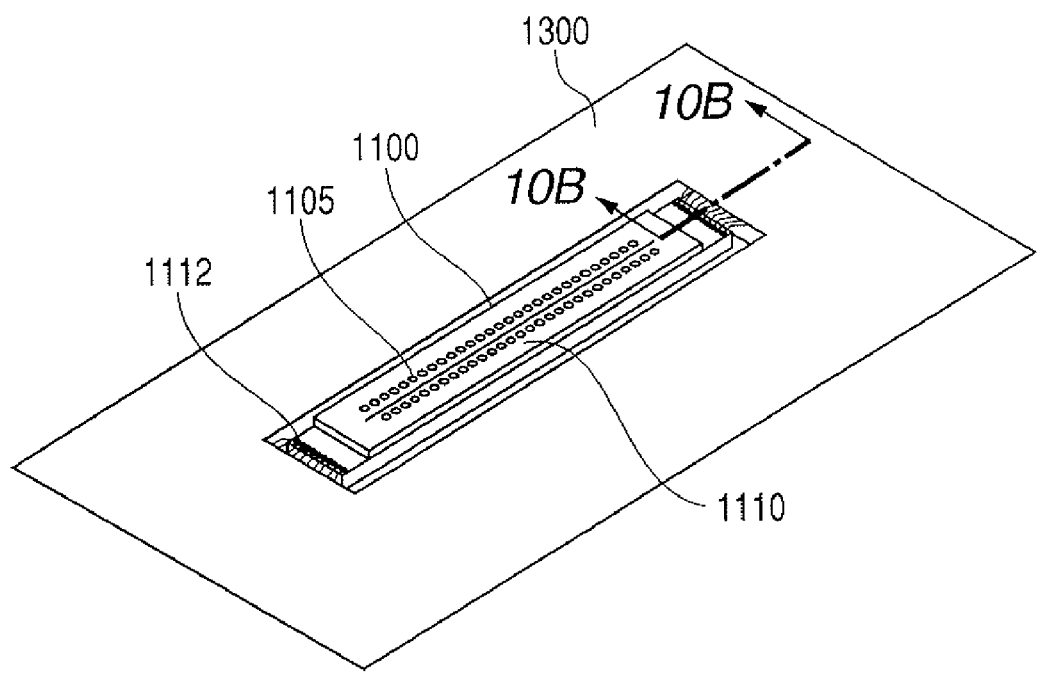
FIGS. 10A and 10B are views for explaining the manufacturing process of a recording head according to another aspect of the embodiment 1. More specifically.
Figure 10B:
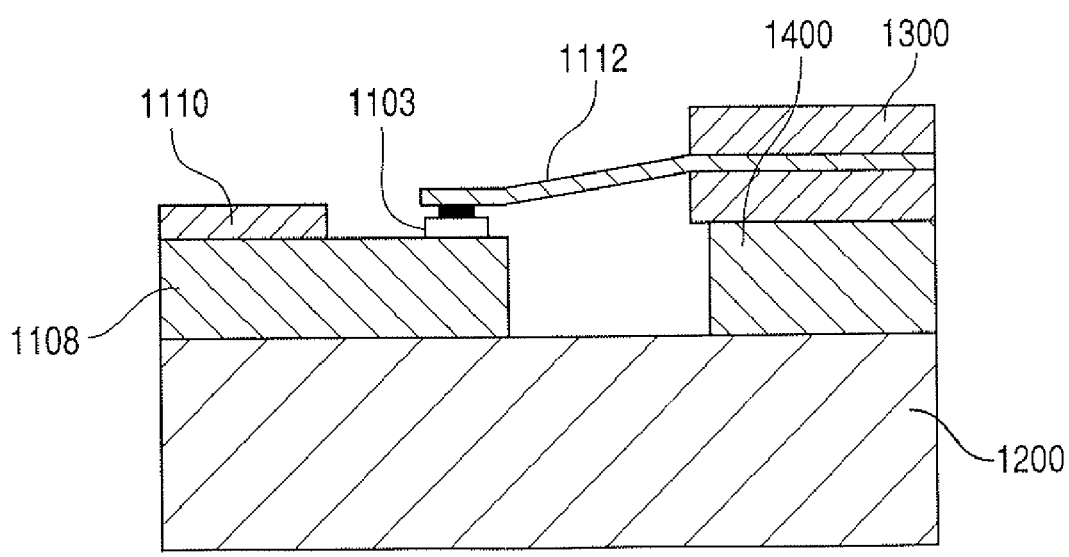

As shown in FIGS. 10A and 10B, the electrode 1103, through which inputting/outputting of electrical signals and supplying of electrical power are executed for the recording element substrate 1100, and the electrical wiring substrate 1300 are mutually connected by a bonding method of heating a flying lead 1112, and then adding ultrasonic waves and pressure thereto, whereby conductive connection is established between the electrode 1103 and the electrical wiring substrate 1300.

Figure 11A:
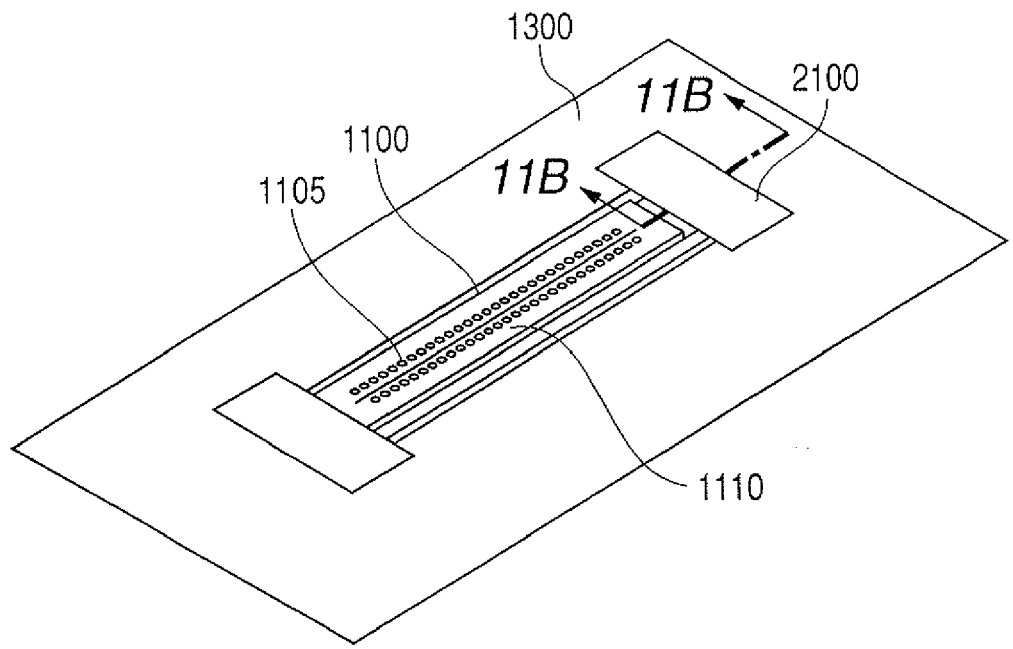
FIGS. 11A and 11B are views for explaining the manufacturing process of the recording head shown in FIGS. 10A and 10B. More specifically.
Figure 11B:
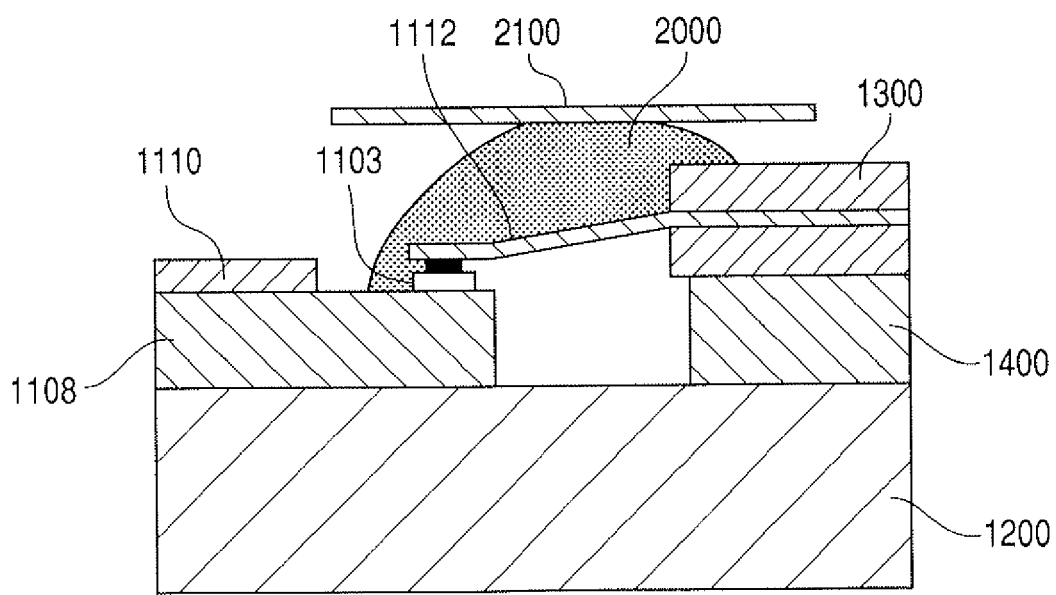

As the next step, as shown in FIGS. 11A and 11B, the sealing resin 2000 composed of a non-solvent epoxy resin and the like is applied so as to be able to coat the flying lead 1112.

Then, the film-like member 2100 composed of polyimide is applied and set on the sealing resin 2000.

Subsequently, the process for suppressing the height of the sealing resin 2000 from the surface of the recording element substrate to a desired height and adhering the film-like member 2100 to the surface of the sealing resin 2000 coating the flying lead 1112 (that is, the process for coating the electrical connection portion by the film-like member) will be explained hereinafter.

Figure 12A:
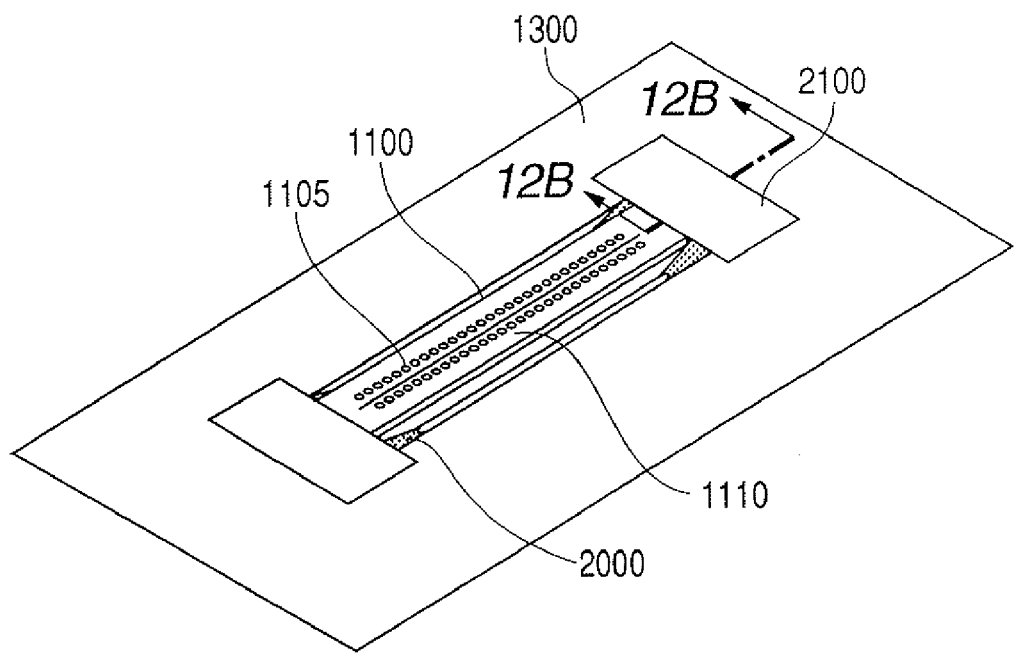
FIGS. 12A and 12B are views for explaining the manufacturing process of the recording head shown in FIGS. 10A and 10B. More specifically.
Figure 12B:
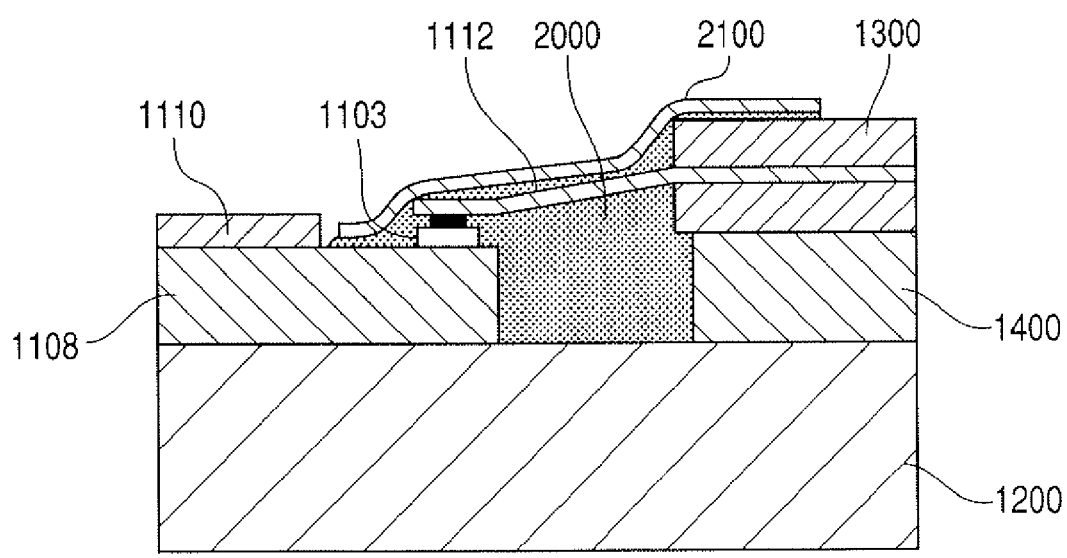

As shown in FIGS. 12A and 12B, heating of about 60° C. is executed to flux the sealing resin 2000, so that the sealing resin 2000 flows below the flying lead 1112 and into the gap between the recording element substrate 1100 and the electrical wiring substrate 1300. Then, according as the sealing resin 2000 comes down, the film-like member 2100 likewise comes down, whereby the film-like member 2100 comes close to the flying lead 1112. Here, it should be noted that the heating in this fluxing process is executed to expedite the fluxion and shorten the process. Although a heating temperature and a heating time depend on the material of the sealing resin 2000, it is necessary to set them insofar as cure of the resin does not start. Of course, since the sealing resin 2000 fluxes even if there is no heat, such a heating process might be omitted. The sealing resin 2000 flows along the longitudinal side of the recording element substrate 1100, and the film-like member 2100 adhered to the surface of the sealing resin 2000 further comes down according as the sealing resin 2000 comes down. Thus, the film-like member 2100 is adhered to the flying lead 1112 being the electrical connection portion over the whole length thereof along the shape of the upper surface of the flying lead 1112, through the sealing resin 2000 coating the flying lead 1112. The fluxion of the sealing resin 2000 approximately stops at this moment. Heating of about 80° C. is executed for five consecutive hours in this state to cure the sealing resin 2000, and the process for coating the electrical connection portion by the film-like member is then completed. Incidentally, it should be noted that the heating temperature and the heating time depend on the material of the sealing resin 2000.

Subsequently, the embodiment in which an electrical connection mechanism of pressure bonding type using an anisotropic conductive film (ACF), an anisotropic conductive paste (ACP), a nonconductive paste (NCP), a nonconductive film (NCF) or the like is used instead of the bonding wire and the flying lead both described above will be explained. Here, the whole constitution of the recording head, the sealing resin, the material, the shape and the thickness of the film-like member, the device for putting the film-like member on the sealing resin, and the like are approximately the same as those in the above explanation, whereby the explanations thereof will be omitted. In addition, the same constituent elements as those in the above explanation are represented respectively by the same numerals and symbols as those in the above explanation.

Figure 13A:
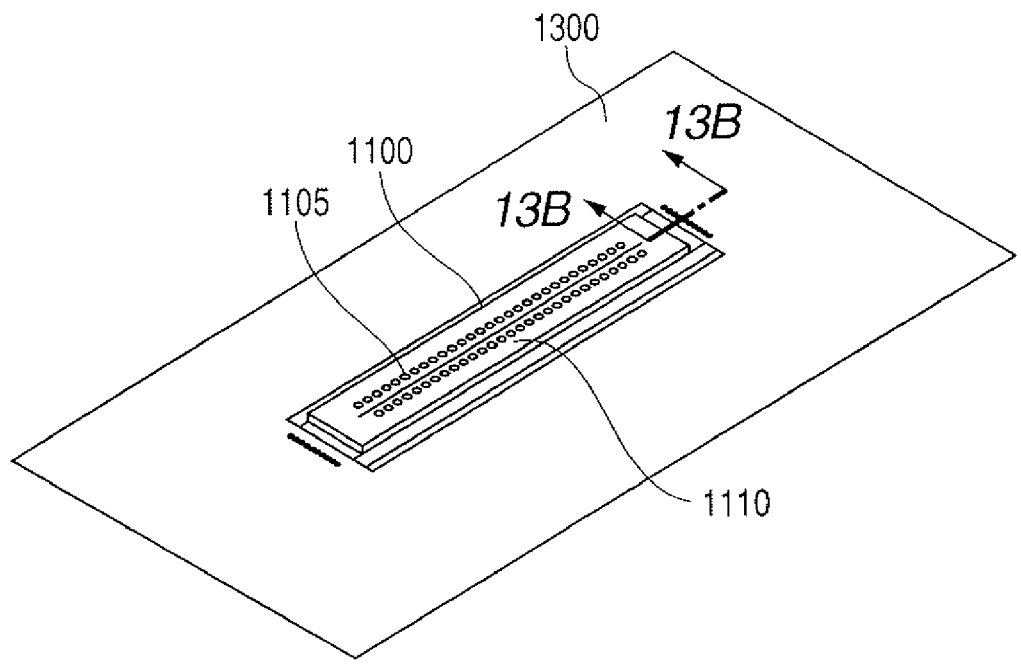
FIGS. 13A and 13B are views for explaining the manufacturing process of the recording head shown in FIGS. 10A and 10B. More specifically.
Figure 13B:
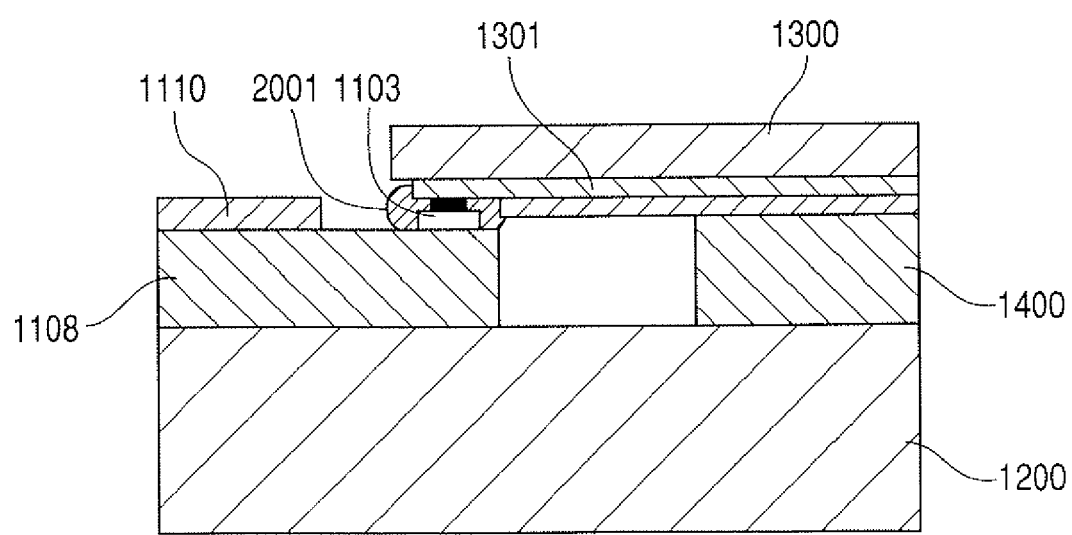

As shown in FIGS. 13A and 13B, the electrode 1103, through which inputting/outputting of electrical signals and supplying of electrical power are executed for the recording element substrate 1100, and a corresponding wiring 1301 of the electrical wiring substrate 1300 are mutually connected by an electrical bonding adhesive 2001 composed of the ACF, the ACP, the NCF, the NCP or the like, whereby conductive connection is established between the electrode 1103 and the electrical wiring substrate 1300.

Figure 14A:
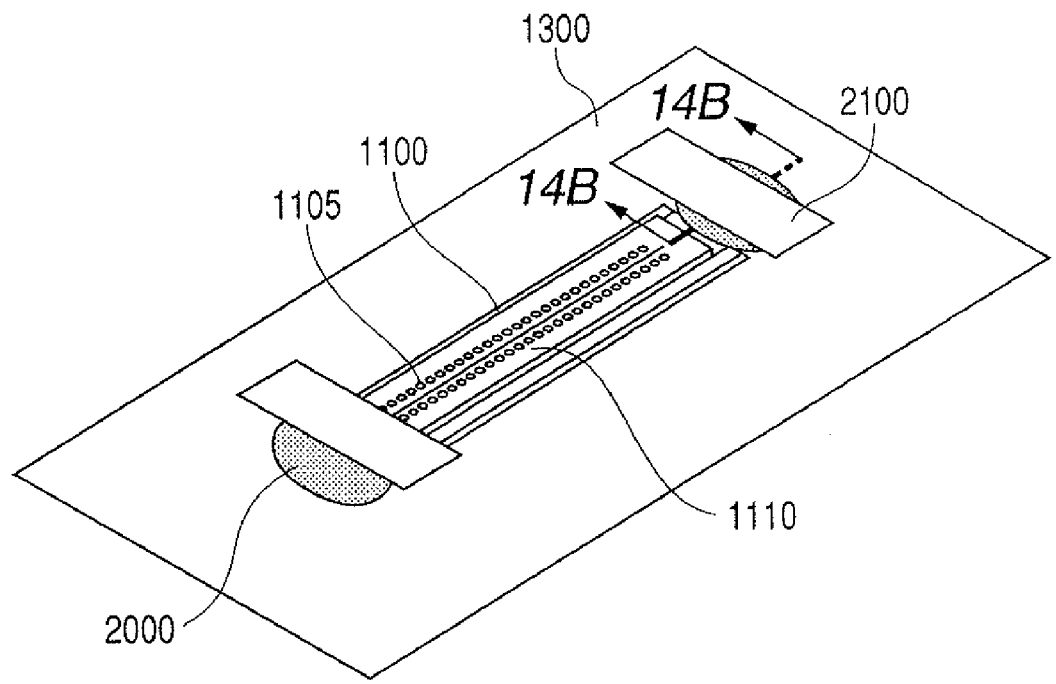
FIGS. 14A and 14B are views for explaining the manufacturing process of a recording head according to another aspect of the embodiment 1. More specifically.
Figure 14B:
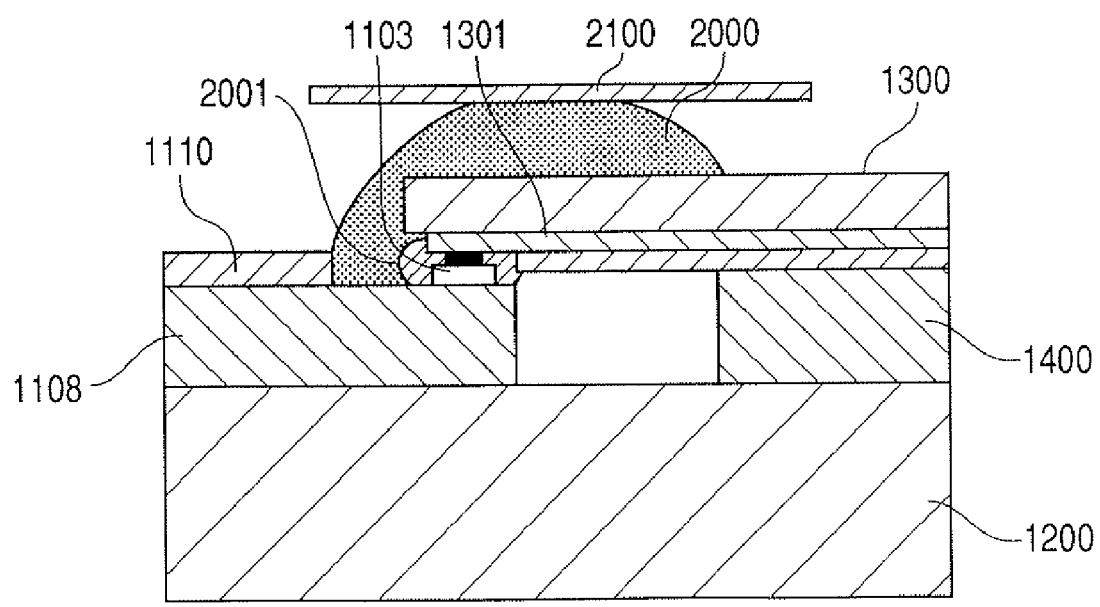

As the next step in the electrical bonding method, as shown in FIGS. 14A and 14B, the sealing resin 2000 composed of a non-solvent epoxy resin and the like is applied so as to be able to coat the electrical connection portion. Then, the film-like member 2100 composed of polyimide is applied and set on the sealing resin 2000.

Figure 15A:
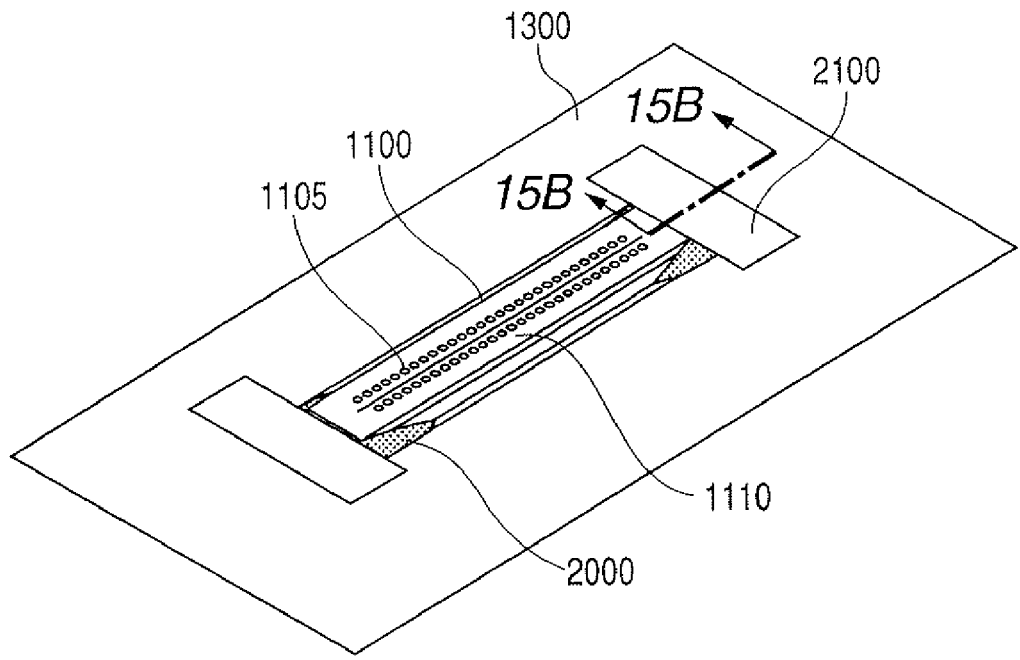
FIGS. 15A and 15B are views for explaining the manufacturing process of the recording head shown in FIGS. 14A and 14B. More specifically.
Figure 15B:
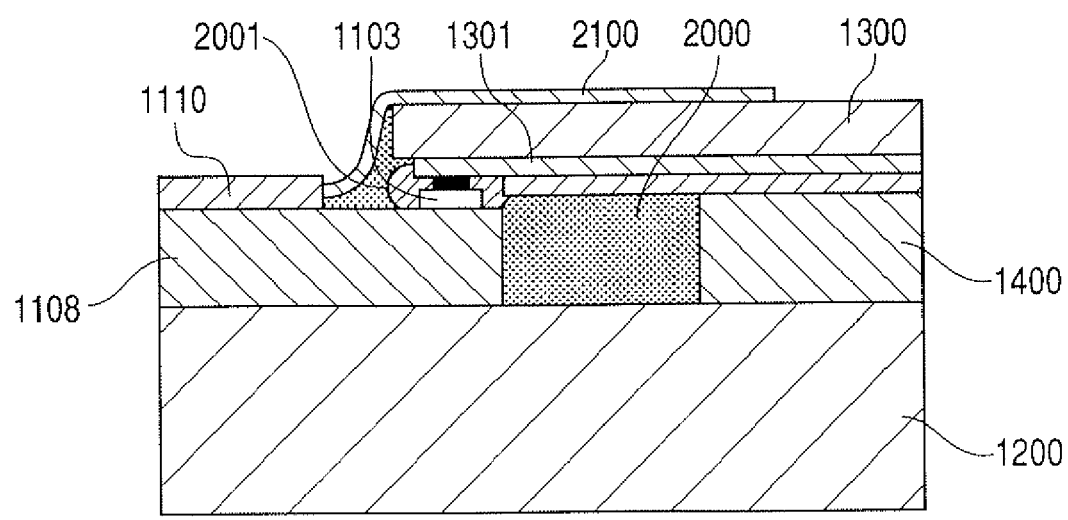

Next, as shown in FIGS. 15A and 15B, heating of about 60° C. is executed to flux the sealing resin 2000, so that the sealing resin 2000 flows into the gap between the recording element substrate 1100 and the electrical wiring substrate 1300. Then, according as the sealing resin 2000 comes down, the film-like member 2100 likewise comes down, whereby the film-like member 2100 comes close to the electrical wiring substrate 1300. Here, it should be noted that the heating in this fluxing process is executed to expedite the fluxion and shorten the process. Although a heating temperature and a heating time depend on the material of the sealing resin 2000, it is necessary to set them insofar as cure of the resin does not start. Of course, since the sealing resin 2000 fluxes even if there is no heat, such a heating process might be omitted. The sealing resin 2000 flows along the longitudinal side of the recording element substrate 1100, and the film-like member 2100 further comes down according as the sealing resin 2000 comes down. Thus, the film-like member 2100 is adhered to the electrical wiring substrate 1300 and the recording element substrate 1100 along the shapes of them so as to cover the electrical connection portion between the electrical wiring substrate 1300 and the recording element substrate 1100, through the sealing resin 2000 coating the relevant electrical connection portion. The fluxion of the sealing resin 2000 approximately stops at this moment. Heating of about 80° C. is executed for five consecutive hours in this state to cure the sealing resin 2000, and the process for coating the electrical connection portion by the film-like member is then completed. Incidentally, it should be noted that the heating temperature and the heating time depend on the material of the sealing resin 2000.

Subsequently, the embodiment in which the electrical connection portion of the plural recording element substrates is sealed by an individual film-like member will be explained. Here, the whole constitution of the recording head, the sealing resin, the material, the shape and the thickness of the film-like member, the device for putting the film-like member on the sealing resin, and the like are approximately the same as those in the above explanation, whereby the explanations thereof will be omitted. Further, the same constituent elements as those in the above explanation are represented respectively by the same numerals and symbols as those in the above explanation. Furthermore, although the electrical bonding method in this embodiment will be explained through the wire bonding method, the method using a flying lead, or a method using an electrical bonding adhesive (ACF, ACP, NCF, NCP) might be used as the electrical connection method.

Figure 16A:
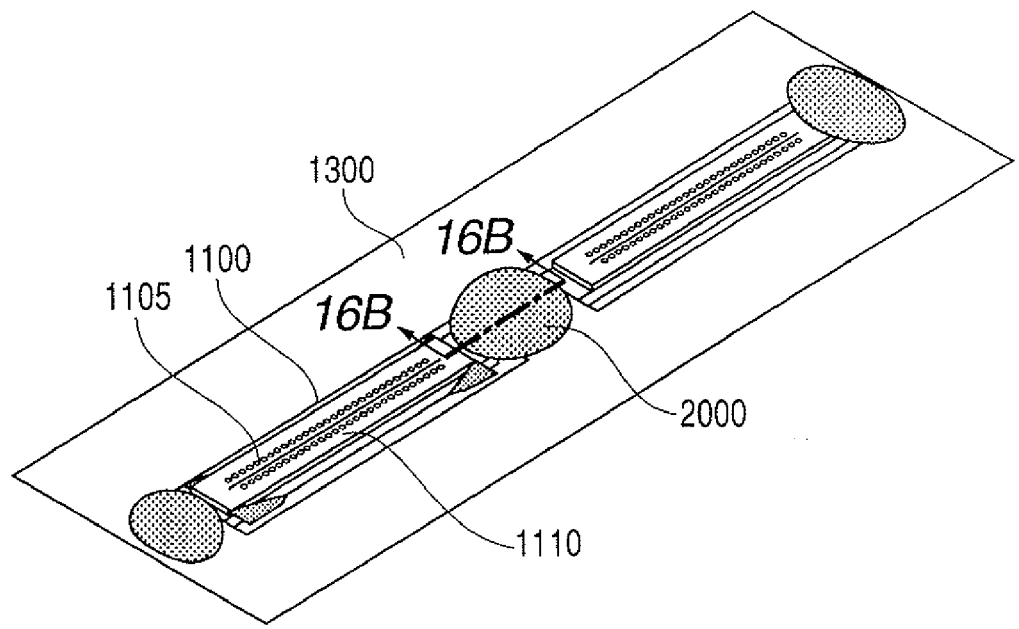
FIGS. 16A and 16B are views for explaining the manufacturing process of a recording head according to another aspect of the embodiment 1. More specifically.
Figure 16B:
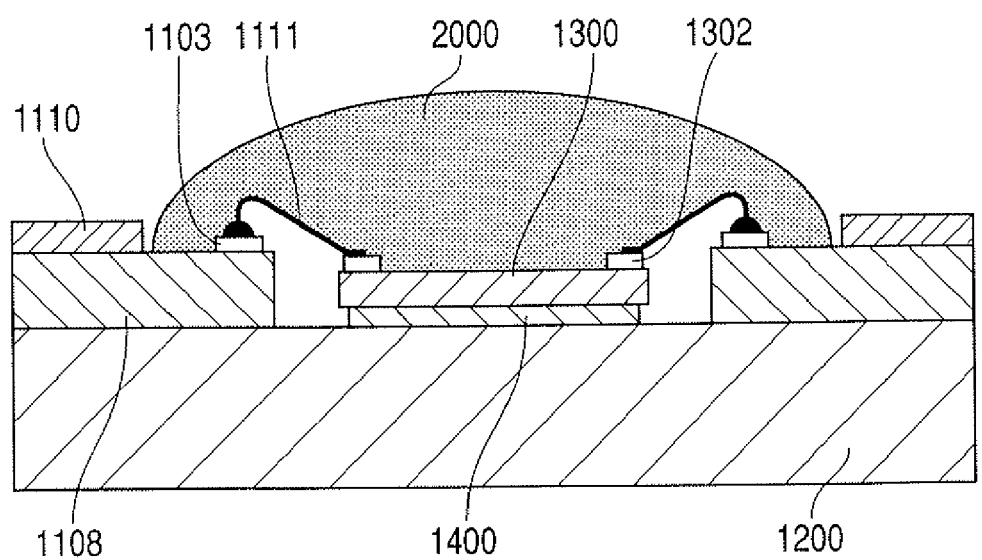

As shown in FIGS. 16A and 16B, the electrode 1103, through which inputting/outputting of electrical signals and supplying of electrical power are executed for the recording element substrate 1100, and the electrical wiring substrate 1300 are mutually connected by the bonding wire 1111 provided by the wire bonding method, whereby conductive connection is established between the electrode 1103 and the electrical wiring substrate 1300.

Figure 17A:
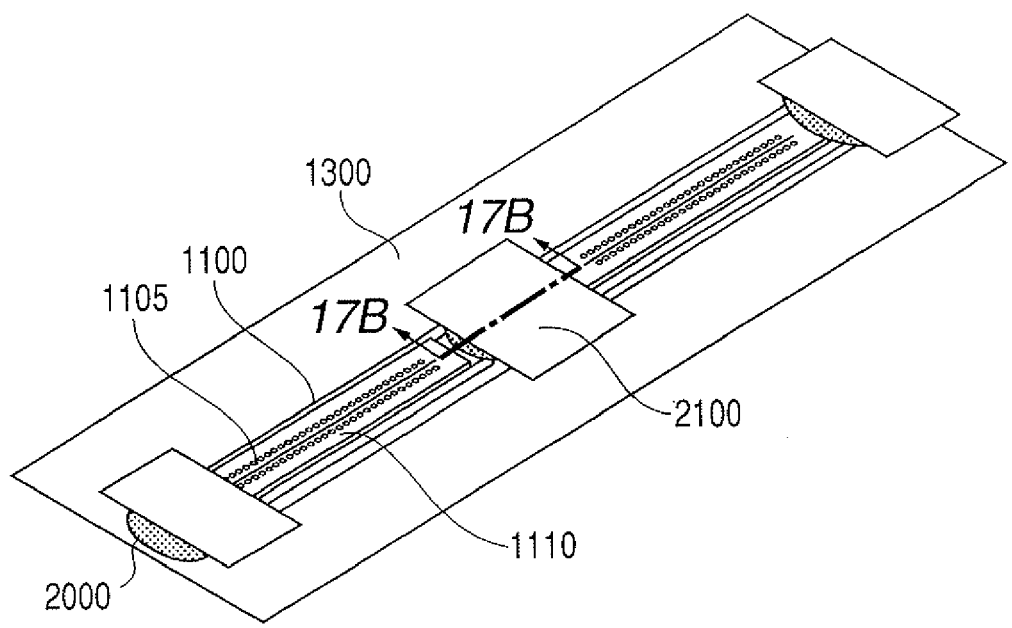
FIGS. 17A and 17B are views for explaining the manufacturing process of the recording head shown in FIGS. 16A and 16B. More specifically.
Figure 17B:
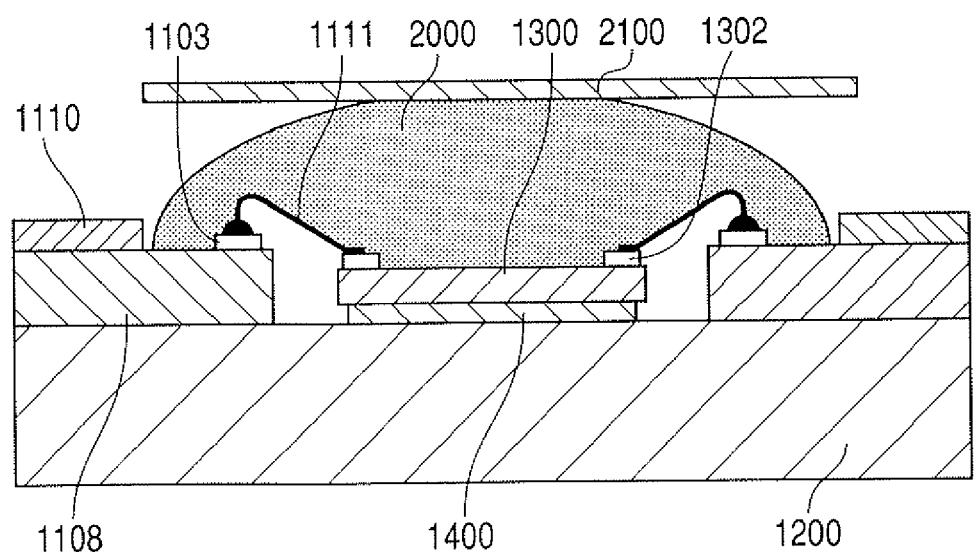
Figure 18A:
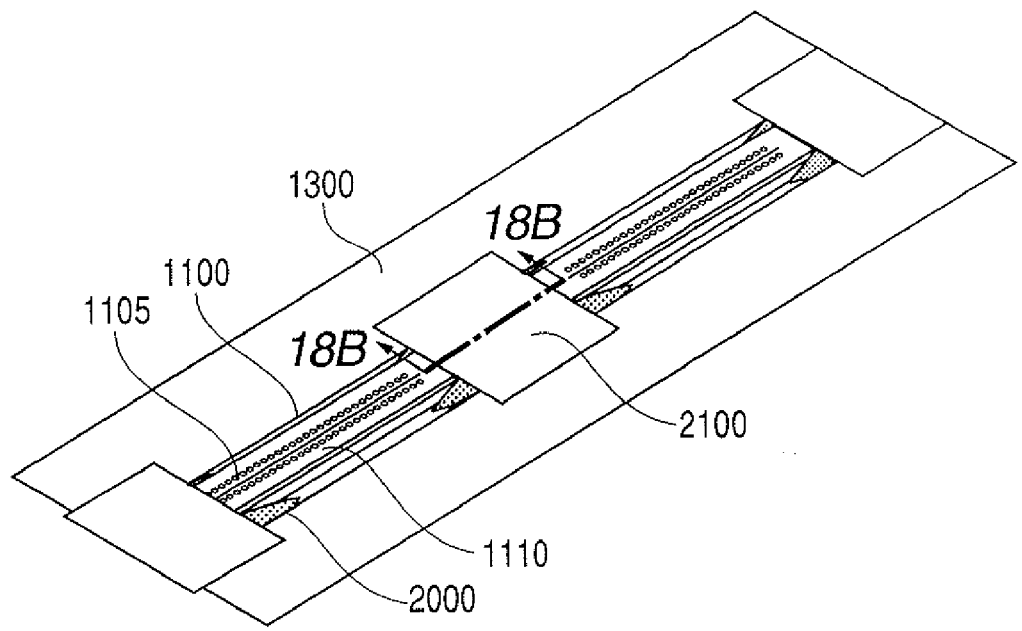
FIGS. 18A and 18B are views for explaining the manufacturing process of the recording head shown in FIGS. 16A and 16B. More specifically.
Figure 18B:
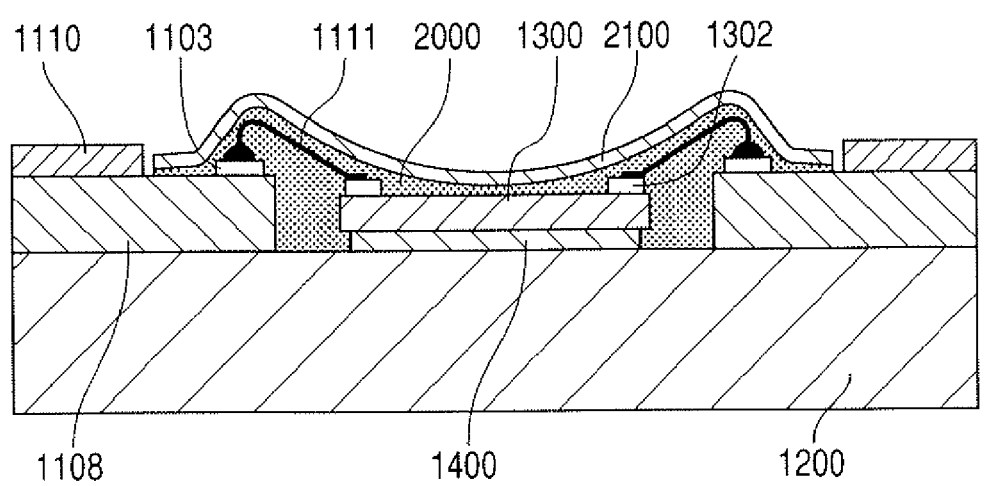

The sealing resin 2000 composed of a non-solvent epoxy resin and the like is applied so as to be able to coat the bonding wires of the adjacent two recording element substrates 1100. Then, as shown in FIGS. 17A and 17B, the film-like member 2100 composed of polyimide is applied and set on the sealing resin 2000. Here, the film-like member shown at the center of each of FIGS. 17A and 17B has the shape and the size capable of coating the electrical connection portion between the adjacent two recording element substrates 1100 only by itself. Incidentally, since the following processes such as heating and the like and the behavior of the sealing resin and the film-like member according to these processes are approximately the same as those described in the above embodiment, whereby the explanations thereof will be omitted. Finally, as shown in FIGS. 18A and 18B, the film-like member 2100 is cured in the shape adhered to the respective bonding wires 1111 in the electrical connection portion between the two recording element substrates 1100 over the whole length thereof. The film-like member 2100 at that time has the shape to be adhered to the bonding wires 1111 being the electrical connection portion along the angular shape thereof, through the sealing resin 2000 coating the bonding wires 1111.

Subsequently, the embodiment in which the film-like member 2100 for protecting the electrical connection portion is fixed to the electrical wiring substrate 1300 by use of an adhesive 2200 will be explained. Here, the whole constitution of the recording head, the sealing resin, the material, the shape and the thickness of the film-like member, the device for putting the film-like member on the sealing resin, and the like are approximately the same as those in the above explanation, whereby the explanations thereof will be omitted. Further, the same constituent elements as those in the above explanation are represented respectively by the same numerals and symbols as those in the above explanation. Furthermore, although the electrical bonding method in this embodiment will be explained through the wire bonding method, the method using a flying lead, or a method using an electrical bonding adhesive (ACF, ACP, NCF, NCP) might be used as the electrical connection method.

Figure 19A:
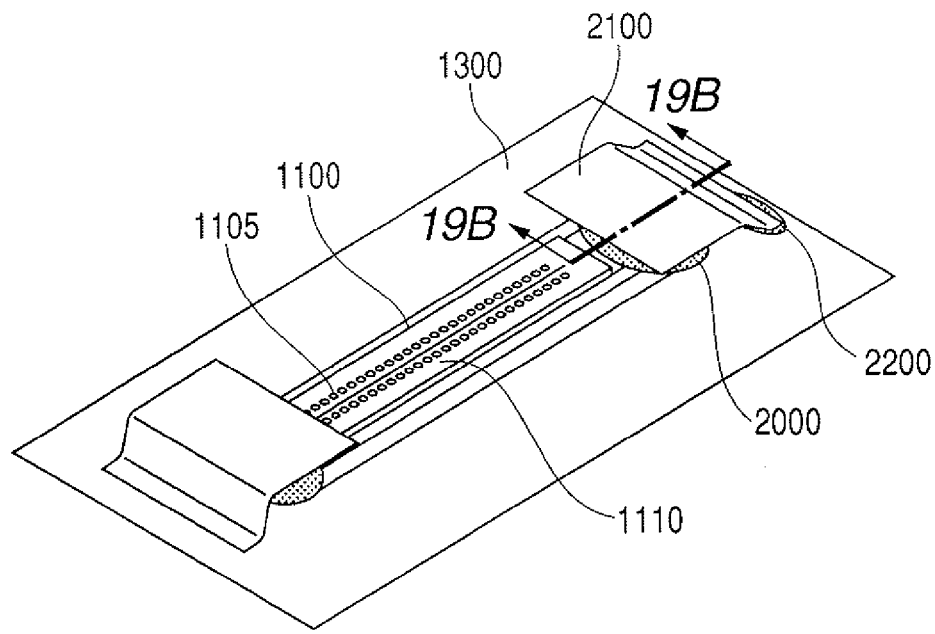
FIGS. 19A and 19B are views for explaining the manufacturing process of a recording head according to another aspect of the embodiment 1. More specifically.
Figure 19B:
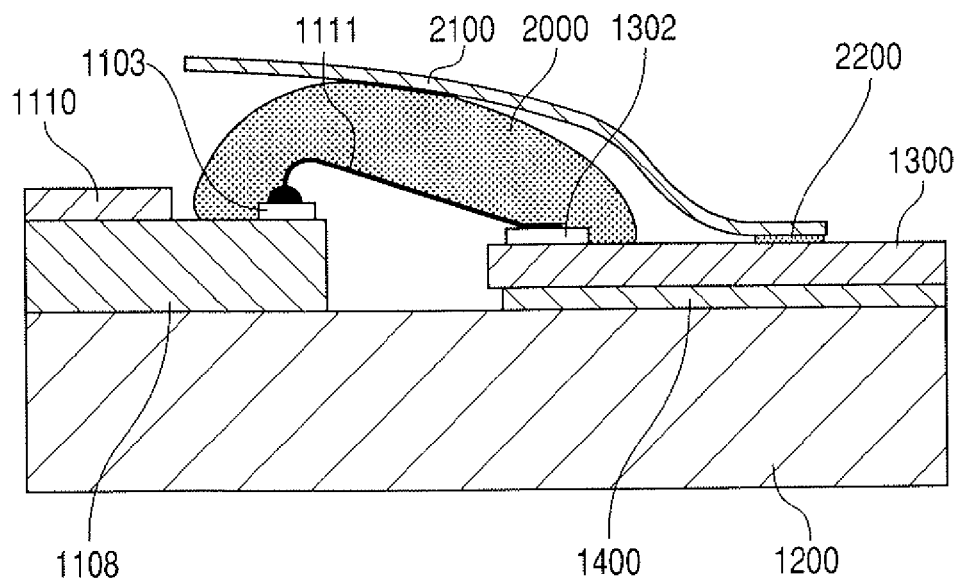

As shown in FIGS. 19A and 19B, the electrode 1103, through which inputting/outputting of electrical signals and supplying of electrical power are executed for the recording element substrate 1100, and the electrical wiring substrate 1300 are mutually connected by the bonding wire 1111 provided by the wire bonding method, whereby conductive connection is established between the electrode 1103 and the electrical wiring substrate 1300.

Further, the sealing resin 2000 composed of a non-solvent epoxy resin and the like is applied so as to be able to coat the bonding wire 1111, and the adhesive 2200 is applied over the electrical wiring substrate 1300. Then, the film-like member 2100 composed of polyimide is applied over the sealing resin 2000, and one side thereof is adhered by the adhesive 2200. Here, it is preferable to use the adhesive 2200 of thermosetting type or UV cured type. Thus, in the later process for fluxing the sealing resin 2000, the adhesive 2200 functions to prevent that the film-like member 2100 is shifted from the position where the electrical connection portion is coated with the film-like member 2100 so as not to be in contact with ink or the like. For this purpose, the adhesive 2200 is cured before the process for fluxing the sealing resin 2000 is executed.

Figure 20A:
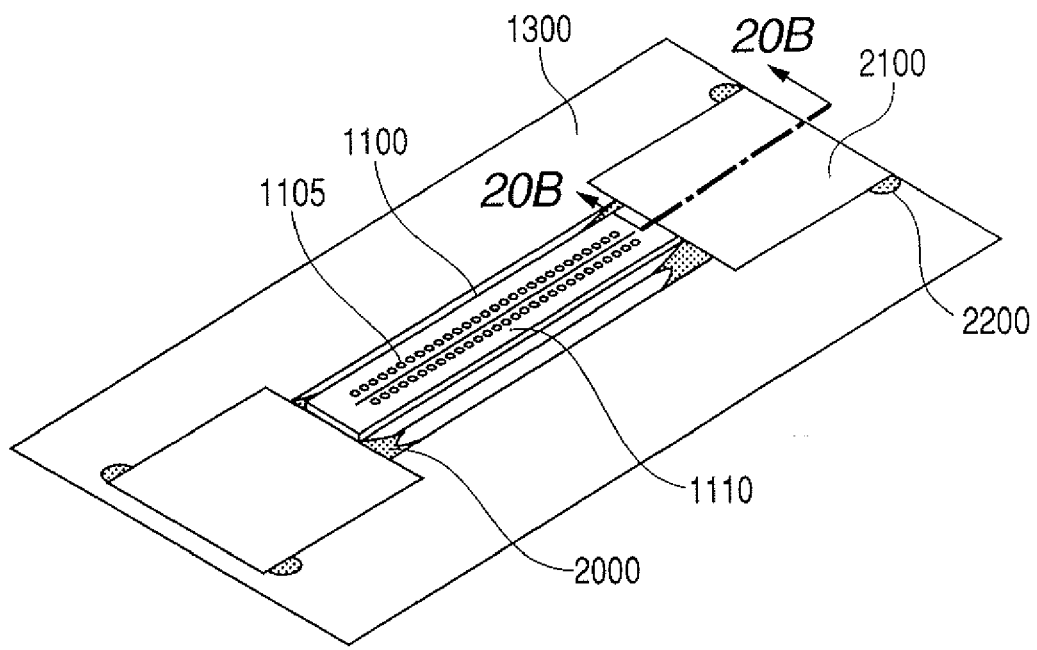
FIGS. 20A and 20B are views for explaining the manufacturing process of the recording head shown in FIGS. 19A and 19B. More specifically.
Figure 20B:
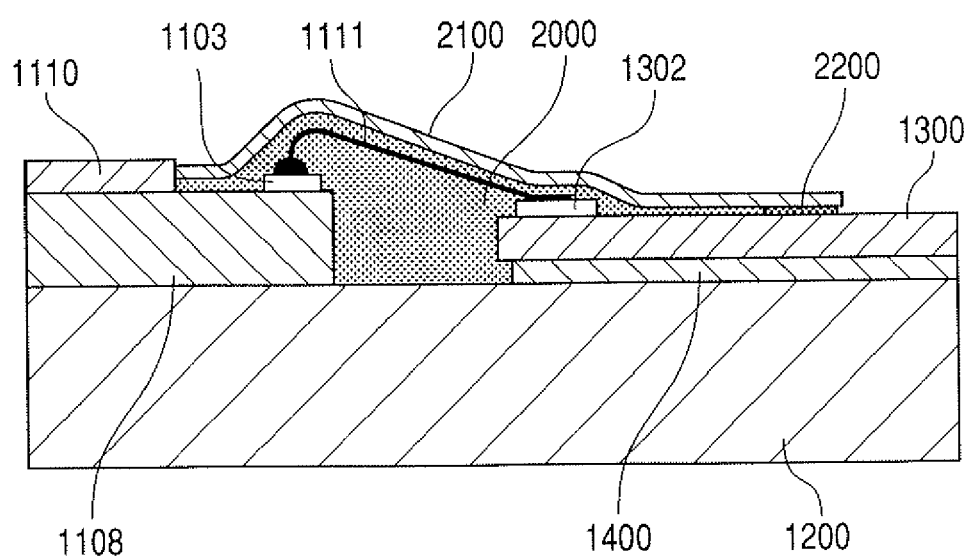

Then, through the process same as the above heating process, the film-like member 2100 is cured in the shape as shown in FIGS. 20A and 20B. In other words, the film-like member 2100 is cured in the shape to be adhered to the bonding wires 1111 being the electrical connection portion along the angular shape thereof, through the sealing resin 2000 coating the bonding wires 1111.

Figure 21A:
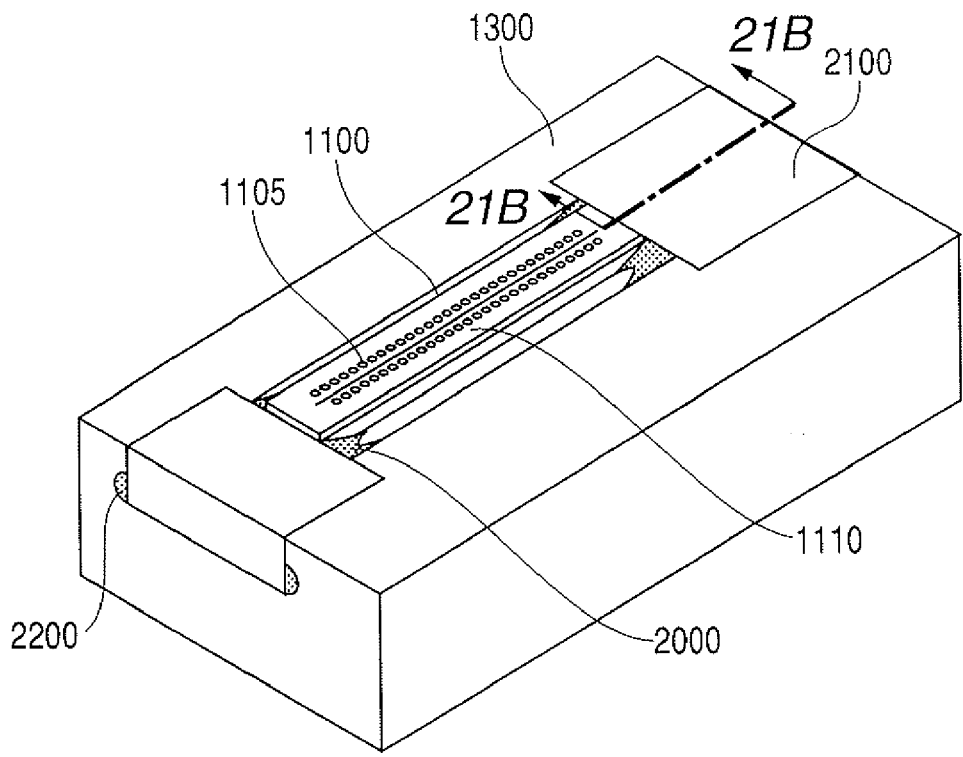
FIGS. 21A and 21B are views for explaining a recording head according to another aspect of the embodiment 1. More specifically.
Figure 21B:
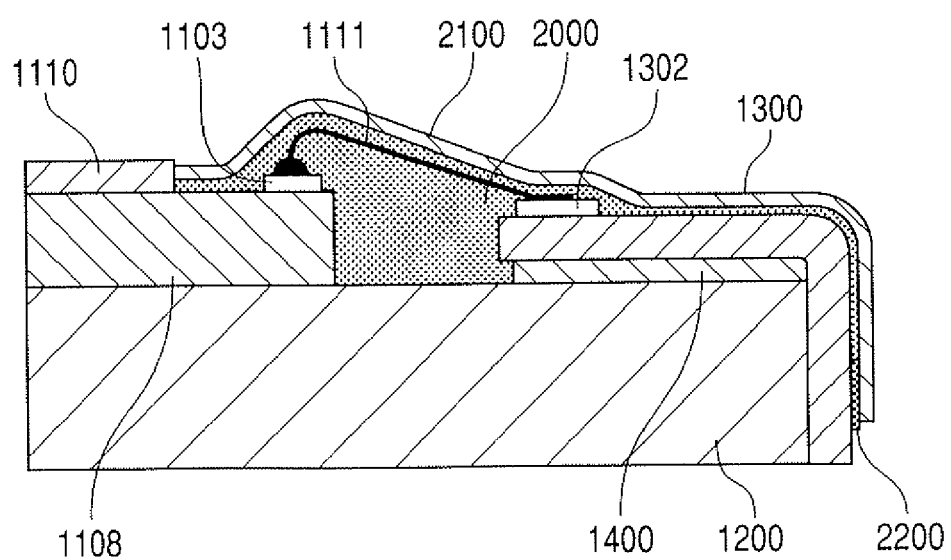

Besides, as shown in FIGS. 21A and 21B, the location where the film-like member 2100 is fixed by the adhesive 2200 might be on the surface different from the surface (discharge port formed surface 1110) on which the ink discharge ports of the recording head have been formed. For example, in a case where the end of the film-like member 2100 is fixed to the side surface of the recording head, it is possible to make the size of the discharge port formed surface 1110 smaller than that in the case where the film-like member 2100 is fixed to the discharge port formed surface 1110.

According to the above embodiment 1, the protrusion amount of the sealing portion by the sealing resin can be suppressed as smaller as possible, whereby the electrical connection portion can be protected more certainly. Therefore, since the distance between the discharge port formed surface 1110 and the recording medium can be shortened by the liquid discharge head of this type, the accuracy of impact of liquids can be improved.

In addition, to secure cleanness on the periphery of the discharge ports in the inkjet recording device, ink droplets, dust and the like attached on the surface such as the discharge port formed surface 1110 or the like are wiped out by a plate-like elastic member such as a rubber plate or the like. According to the present embodiment, since the electrical connection portion is coated with the film-like member, the damage to the electrical connection portion can be suppressed even if the plate-like elastic member is slidably rubbed on the electrical connection portion.

Embodiment 2

Subsequently, a second embodiment of the present invention will be explained with reference to FIGS. 22A to 29B.

Figure 22A:
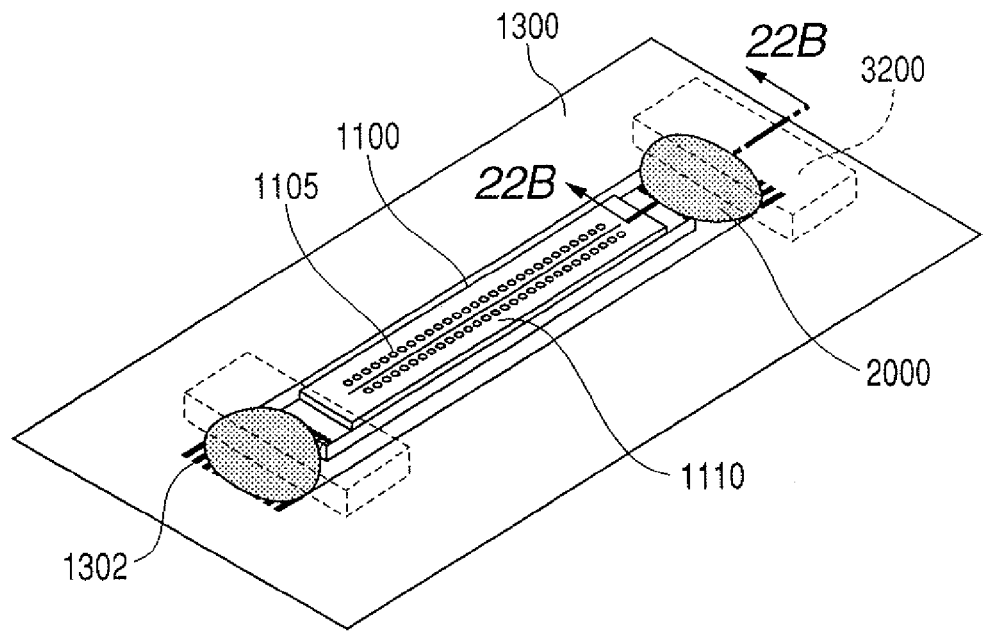
FIGS. 22A and 22B are views for explaining the manufacturing process of a recording head according to the embodiment 2. More specifically.
Figure 22B:
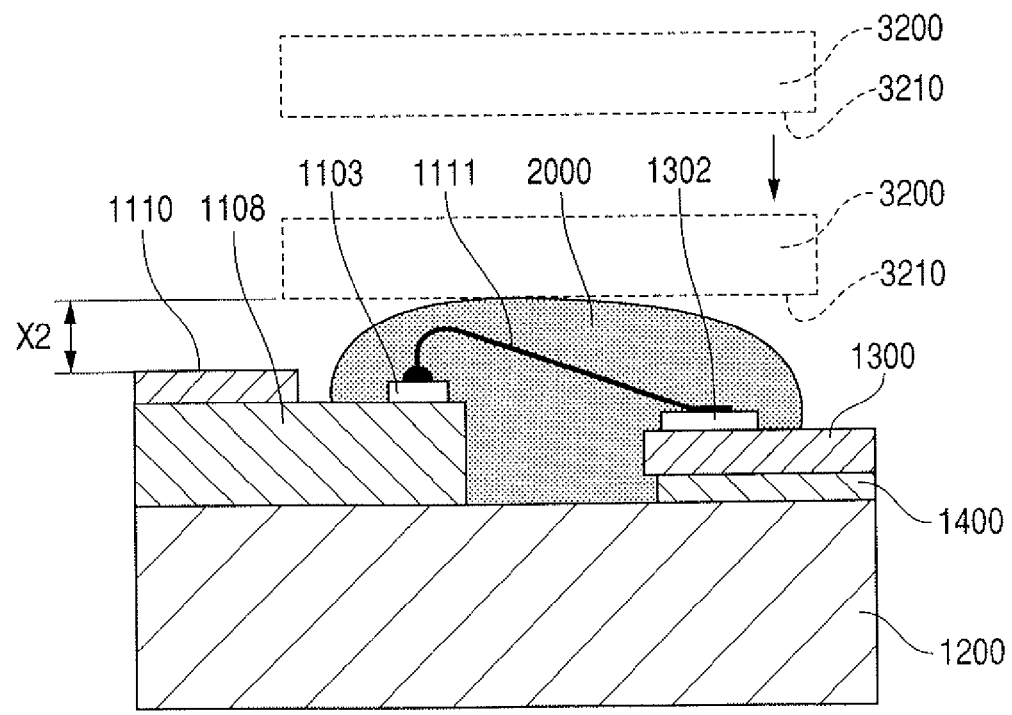

FIG. 22A is the perspective view showing one recording element substrate 1100 of the recording head 1000 and the enlarged periphery thereof, and FIG. 22B is the cross sectional view along the line 22B-22B shown in FIG. 22A. Here, it should be noted that each of FIGS. 28 and 29 is likewise composed of the perspective view and the cross sectional view.

Incidentally, although a method using wire bonding, a method using inner lead bonding (ILB), a method using an anisotropic conductive film (ACF) or the like is practically used as a concrete electrical connection method, it should be noted that the present embodiment is applicable to any method.

An electrode 1103, through which inputting/outputting of electrical signals and supplying of electrical power are executed for the recording element substrate 1100, and an electrical wiring substrate 1300 are mutually connected through bonding wires 1111 formed by the wire bonding method, whereby conductive connection is established between the electrode 1103 and the electrical wiring substrate 1300.

First, a sealing resin 2000 composed of a non-solvent epoxy resin and the like is applied so as to be able to coat the bonding wires 1111. Then, as shown in FIG. 22B, the upper surface of the sealing resin 2000 is depressed by a depression member 3200 being a mold member. At that time, it is controlled to reduce the height (protrusion amount) X1 of the sealing resin 2000 to a height X2 corresponding to a desired distance from the uppermost surface layer of the discharge port formed surface 1110. Here, the controlling is executed so as to move the absorption surface 3100 up to a depression surface 3210 of the depression member 3200 by use of the device 3000 as shown in FIG. 7.

Figure 23:
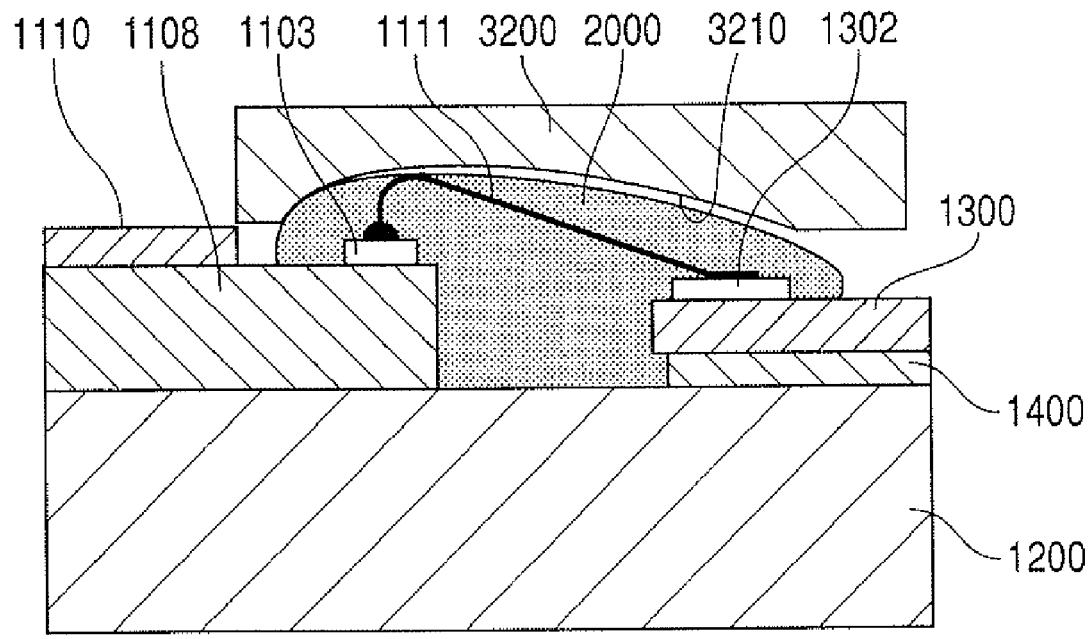
FIG. 23 is a view showing a modification example of the depression member shown in FIGS. 22A and 22B.

Further, as shown in FIG. 23, it is effective to set the shape of the depression surface 3210, abutted against the sealing resin 2000 of the depression member 3200, to have the shape along the outer angular shape of the bonding wires 1111. Furthermore, it is also effective to provide a heating mechanism in the depression member 3200 to cure the sealing resin 2000.

As the next step in the process shown in FIGS. 22A, 22B and 23, heating of about 60° C. is executed to flux the sealing resin 2000, so that the sealing resin 2000 flows below the bonding wires 1111 and into the gap between the recording element substrate 1100 and the electrical wiring substrate 1300. Here, it should be noted that the heating in this fluxing process is executed to expedite the fluxion and shorten the process. Although a heating temperature and a heating time depend on the material of the sealing resin 2000, it is necessary to set them insofar as cure of the resin does not start. Of course, since the sealing resin 2000 fluxes even if there is no heat, such a heating process might be omitted.

If the sealing resin 2000 further fluxes, the sealing resin 2000 flows along the longitudinal side of the recording element substrate 1100. The fluxion of the sealing resin 2000 approximately stops at this moment. Heating of about 80° C. is executed for five consecutive hours in this state to cure the sealing resin 2000. Incidentally, it should be noted that the heating temperature and the heating time depend on the material of the sealing resin 2000.

The depression member 3200 might be released after the surface of the sealing resin 2000 was cured (even if the inside thereof is not yet cured), or after the inside of the sealing resin 2000 was cured. Further, the depression of the sealing resin 2000 by the depression member 3200 might be executed before the sealing resin 2000 is cured completely, for example, the depression might be executed soon after the heating was started. If the depression member 3200 is released, the sealing resin 2000 comes into the state being reduced to the desired height X2.

Incidentally, the height of the sealing resin 2000 determined through the depression of the depression member 3200 might be controlled independently for each sealing portion in the recording head 1000, or controlled in a lump for all the sealing portions in the recording head 1000. Further, such height control might of course be executed after the sealing portions were divided into several blocks. Namely, the height control might be executed in any order and/or method if the height of the sealing resin 2000 comes to the desired height.

Furthermore, to improve releasability from the sealing resin 2000, it is preferable to use, as the depression surface 3210 abutted against at least the sealing resin 2000 of the depression member 3200, an anti-tack mechanism by applying a fluoroplastic process, applying a fluoroplastic film, and the like. By doing so, it is possible to make the depression member 3200 easy to be released from the sealing resin 2000. Also, it is possible not to damage planarity and smoothness of the surface abutted against the sealing resin 2000.

Subsequently, another modification of the depression member will be explained with reference to FIG. 24.

Figure 24:
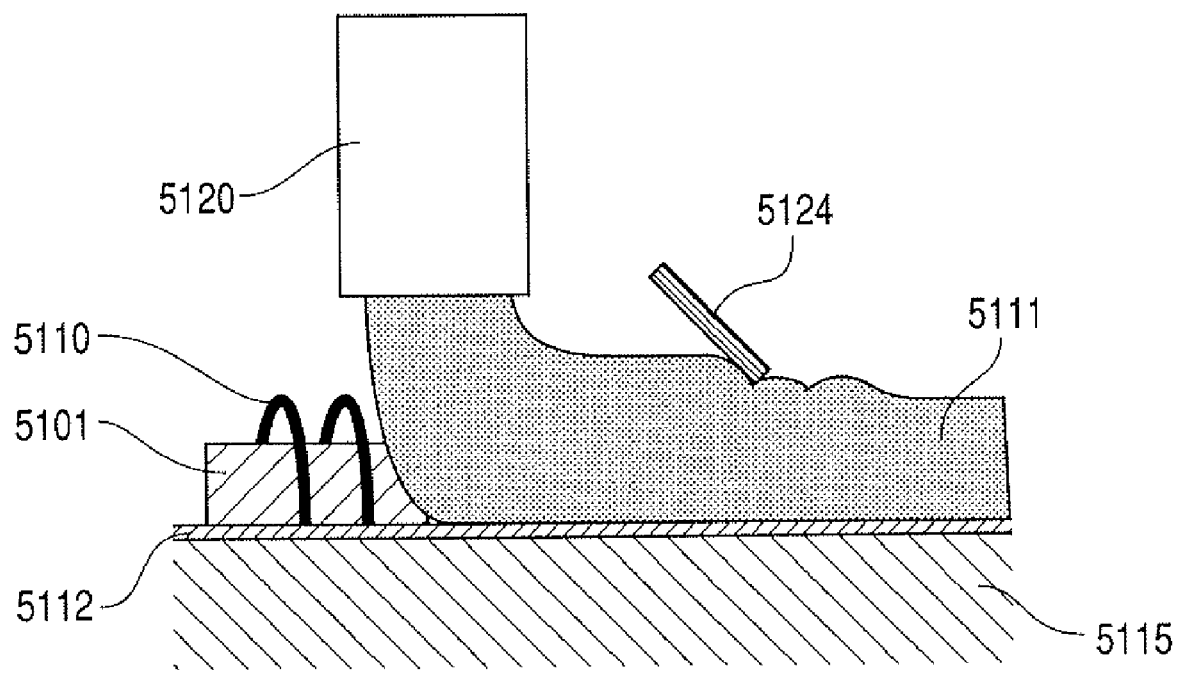
FIG. 24 is a view showing another modification example of the depression member.

In FIG. 24, numeral 5101 denotes a heater board, numeral 5110 denotes an electrical connection portion such as bonding wires or the like, numeral 5112 denotes a TAB (Tape Automated Bonding), numeral 5115 denotes a chip plate, numeral 5111 denotes a sealant, and numeral 5120 denotes a needle for applying the sealant. Further, numeral 5124 denotes a squeegee for suppressing the height of the sealant 5111 to a desired height as fairing the surface thereof.

As shown in FIG. 24, when the sealant 5111 is applied on the chip plate 5115, the position of the needle 5120 is set to maintain a certain level of clearance with respect to the electrical connection portion 5110, in consideration of tolerance of parts, errors of device operations, and the like. This is to prevent a risk that the end of the needle 5120 comes into contact with the electrical connection portion 5110 and thus damages it.

However, the height of the sealant 5111 is excessive if judging from only the purpose of coating the electrical connection portion 5110. Consequently, as shown in FIG. 24, the squeegee 5124 is set to follow the movement of the needle 5120, so that the surface of the sealant 5111 applied on the electrical connection portion 5110 is held down by the squeegee 5124 immediately after the sealant 5111 is applied by the needle 5120.

The squeegee 5124 is elastic. Thus, when the squeegee 5124 moves as fairing the surface of the sealant 5111, the end portion of the squeegee 5124 moves up and down (in the direction along which the height from the discharge port formed surface increases and decreases) in accordance with concavities and convexities of the electrical connection portion 5110. Consequently, it is possible to suppress the height of the sealant 5111 to the desired height (that is, the height by which it is possible to coat the electrical connection portion in height as minimum as possible) as preventing the electrical connection portion 5110 from being damaged.

Moreover, the curved surface corresponding to the bonding wires attached as the electrical connection portion 5110 is formed at the end of the squeegee 5124, whereby the groove according to the shape of the surface of the electrical connection portion 5110 can be formed on the surface of the sealant. Consequently, it is possible to suppress the height of the sealant to the above-described desired height.

Subsequently, the process for manufacturing the recording head according to another aspect of the embodiment 2 with reference to FIGS. 25A, 25B and 25C. Here, FIG. 25A is the cross sectional view showing the state of applying the sealant, FIG. 25B is the cross sectional view showing the suppression of the height of the sealing portion and the reshaping process, and FIG. 25C is the cross sectional view showing the state of the sealing portion after curing.

Figure 25A:
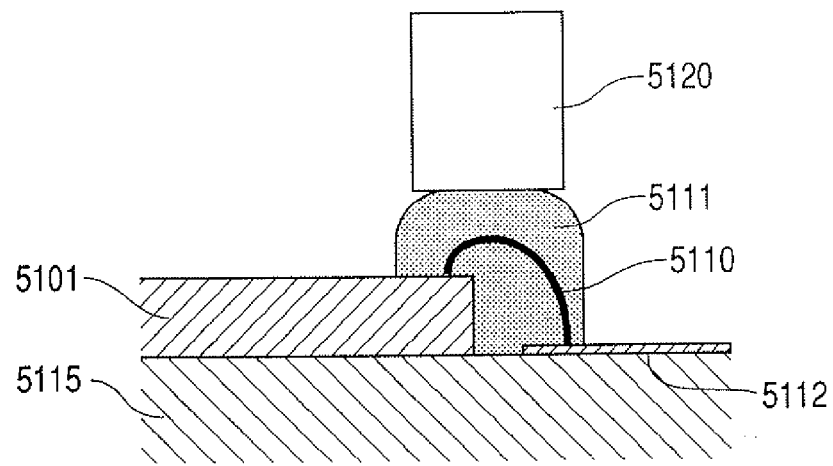
FIGS. 25A, 25B and 25C are views for explaining the manufacturing process of a recording head according to another aspect of the embodiment 2. More specifically.

In FIG. 25A, numeral 5101 denotes the heater board, numeral 5110 denotes the electrical connection portion such as the bonding wires or the like, numeral 5112 denotes the TAB, numeral 5115 denotes the chip plate, numeral 5111 denotes the thixotropic sealant, and numeral 5120 denotes the needle for applying the sealant. Further, in FIG. 25B, numeral 5121 denotes a sealing cover.

As shown in FIG. 25A, when the sealant 5111 is applied on the chip plate 5115 so as to coat the electrical connection portion 5110, the position of the needle 5120 is set to maintain a certain level of clearance with respect to the electrical connection portion 5110, in consideration of tolerance of parts, errors of device operations, and the like. For this reason, the height of the sealant 5111 is excessive if judging from only the purpose of coating the electrical connection portion 5110.

Figure 25B:
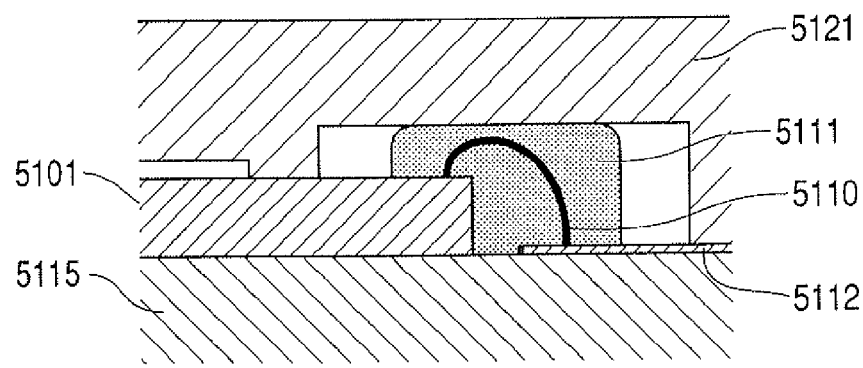
Figure 25C:
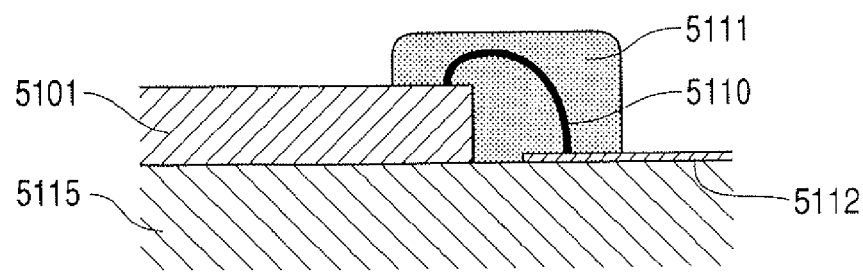

Consequently, as shown in FIG. 25B, the sealing cover 5121 for suppressing the height of the sealant 5111 is put on the surface of the sealant 5111. At that time, the height of the surface of the sealant 5111 is suppressed by means of the surface of the sealing cover 5121, and the sealant 5111 is reshaped to have the surface according to the surface of the heater board 5101 (head substrate). In FIG. 25B, parts of the sealing cover 5121 are abutted against the surface of the heater board 5101 and the surface of the TAB 5112 respectively, whereby the height of the sealant is defined on the basis of these surfaces. Further, it should be noted that the portion where the sealing cover 5121 is abutted against the heater board 5101 has the shape which is kept away from the portion, such as the discharge port on the heater board, which affects the discharge performance if the cover comes into contact with it. Furthermore, the surface of the sealing cover 5121 which is being in contact with the sealant 5111 is processed by Teflon™ or the like to prevent the sealant 5111 from being adhered.

Then, as shown in FIG. 25C, the sealing cover 5121 is removed after the sealant 5111 was cured. Thus, it is possible to suppress the height of the sealing portion from the member to the desired height more uniformly.

Subsequently, the process for manufacturing the recording head according to another aspect of the embodiment 2 will be explained with reference to FIGS. 26A, 26B and 26C. Here, FIG. 26A is the cross sectional view showing the state of applying the sealant, FIG. 26B is the cross sectional view showing the suppression of the height of the sealing portion and the reshaping process, and FIG. 26C is the cross sectional view showing the state of the sealing portion after curing.

Since the thermal expansion coefficients of the heater board 5101 and the TAB 5112 are typically different from each other, the distance between the heater board 5101 and the TAB 5112 changes accordingly if a temperature changes. On the other hand, if the electrical connection portion 5110 is sealed or coated only by the sealant which is not elastic after it was cured, a deformation due to a change in distance according to thermal expansion does not occur easily in the sealing portion, whereby it is feared that the sealant peels or the heater board cracks. Such an adverse effect can be suppressed by using a sealant which is highly elastic after is was cured, thereby absorbing the change in distance due to thermal expansion. Typically, such a high-elastic sealant often has high fluidity when it is not cured yet.

Figure 26A:
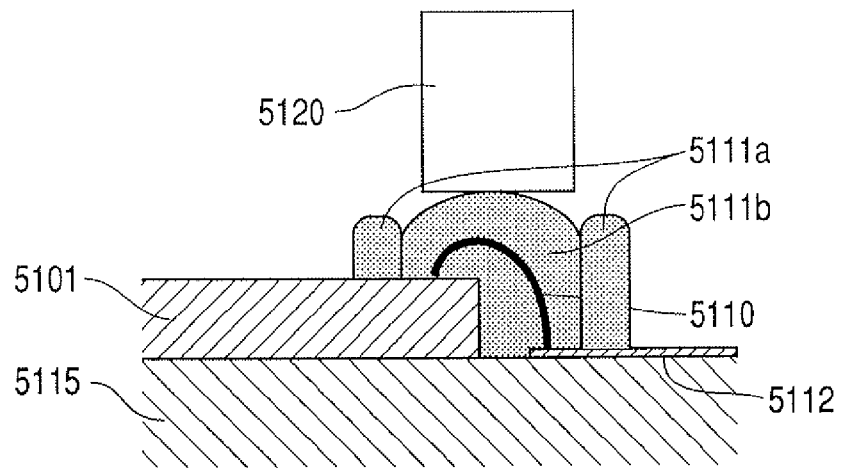
FIGS. 26A, 26B and 26C are views for explaining the manufacturing process of a recording head according to another aspect of the embodiment 2. More specifically.
Figure 26B:
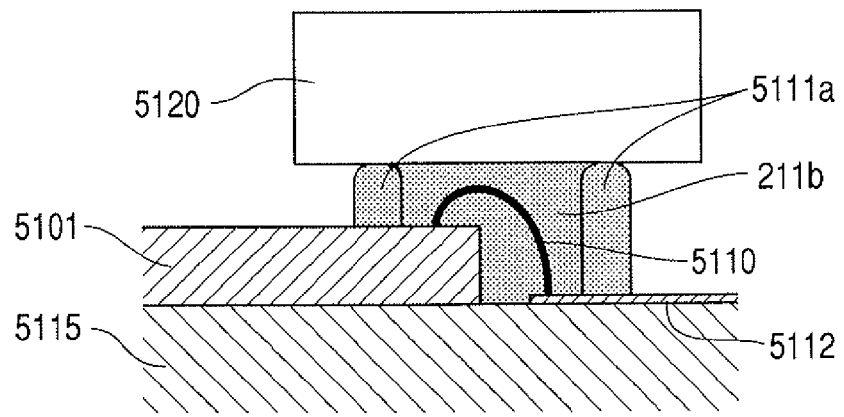

Therefore, as shown in FIG. 26A, the dams are first formed on the periphery of the electrical connection portion 5110 by a thixotropic sealant 5111a. Namely, a high-fluidity sealant 5111b later applied is stemmed by these dams. Incidentally, when the sealant 5111a is applied, the above-described method of suppressing the height of the sealant might be used. Then, after the sealant 5111a was cured, the sealant 5111b, which has high fluidity and is elastic after it was cured, is poured through the needle 5120 inside the dams formed by the sealant 5111a. However, if nothing is executed, the height of the sealant 5111b is unstable due to fluidity of materials, surface tension, and the like, whereby there is a possibility that the sealant 511b slants if the sealing portion cannot be maintained horizontally while the sealant is being cured. For this reason, as shown in FIG. 26B, the sealing cover 5121 for suppressing the height of the sealant 5111b is put on the sealant 5111b. At that time, the height of the surface of the sealant 5111b is suppressed by means of the surface of the sealing cover 5121, and the sealant 5111b is reshaped to have the surface along in parallel the surface of the heater board 5101.

Figure 26C:
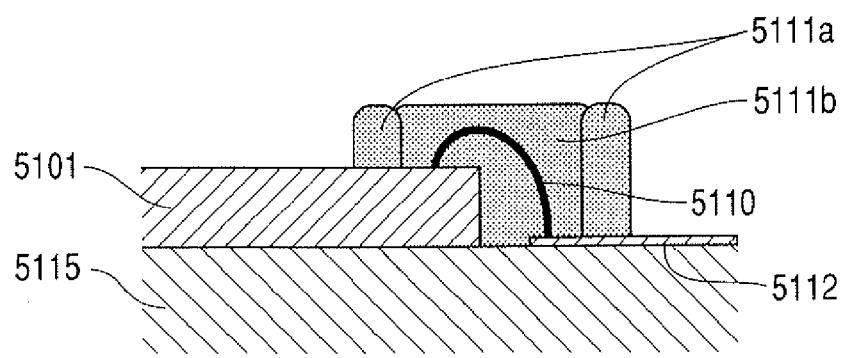

After that, as shown in FIG. 26C, the sealing cover 5121 is removed after the sealant 5111b was cured.

Thus, it is possible through the above process to suppress the height of the sealing portion from the member to the above-described desired height uniformly.

Figure 27A:
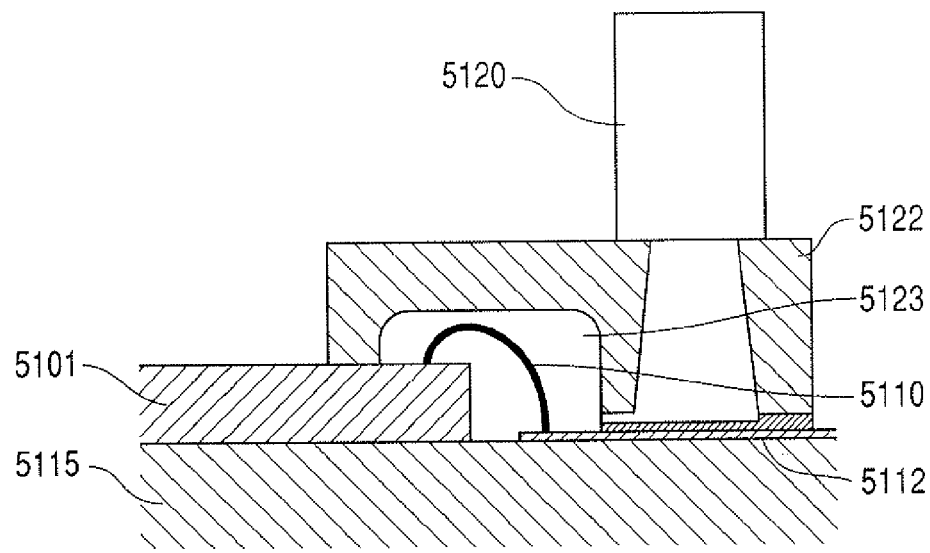
FIGS. 27A, 27B and 27C are views for explaining the manufacturing process of a recording head according to another aspect of the embodiment 2. More specifically.
Figure 27B:
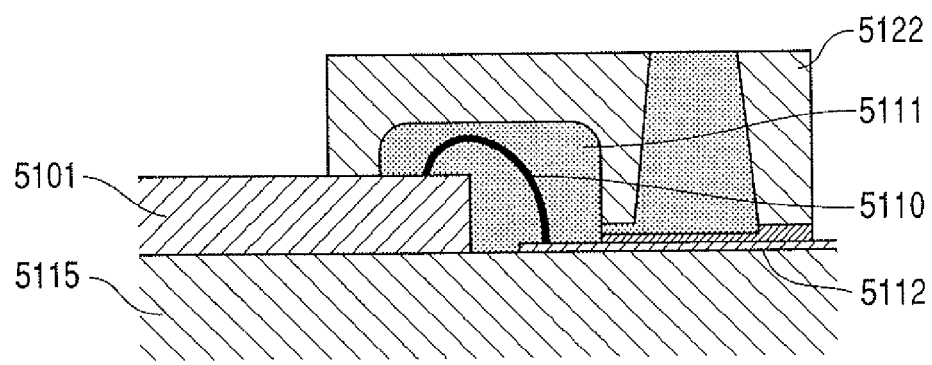
Figure 27C:
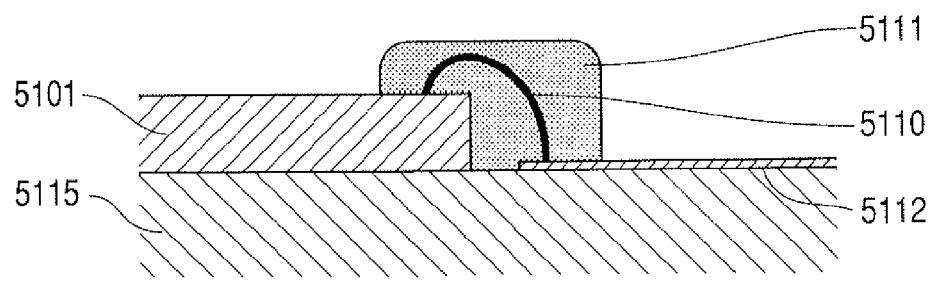

Subsequently, the process for manufacturing the recording head according to another aspect of the embodiment 2 will be explained with reference to FIGS. 27A, 27B and 27C. Here, FIG. 27A is the cross sectional view showing the state of applying the sealant, FIG. 27B is the cross sectional view showing the suppression of the height of the sealing portion and the reshaping process, and FIG. 27C is the cross sectional view showing the state of the sealing portion after curing. In the drawings, numeral 5122 denotes a sealing mold into which the sealant is poured, and numeral 5123 denotes a space into which the sealant is entered.

An inlet through which the sealant 5111 is poured and a linkage port (not shown) through which air remaining inside is effectively discharged are provided on the sealing mold 5122. An elastic body for securing adhesiveness is applied to the portions on the sealing mold 5122 which are in contact with the surface of the heater board 5101 and the surface of the TAB 5112 respectively. Further, the portion on the sealing mold 5122 which is in contact with the sealant 5111 is processed by Teflon™ or the like to prevent the sealant 5111 from being adhered. Furthermore, since a peelable tape is applied to the contact portion between the runner portion for entering the sealant and the TAB 5112, it is possible to easily eliminate the runner portion.

As shown in FIG. 27A, in the case where the sealant is applied, the sealing mold 5122 is put and fixed on the electrical connection portion 5110 so as to cover it. Then, as shown in FIG. 27B, the sealant 5111 is poured through the inlet provided on the sealing mold 5122, and the inside of the sealing mold 5122 is filled with the sealant 5111 until the sealant 5111 reaches the linkage port (not shown) through which the air remaining inside is discharged. After then, the sealant 5111 is cured in the state that the sealing mold 5122 is fixed.

FIG. 27C is the cross sectional view showing the state that the sealing mold 5122 and the unnecessary runner portion of the sealant are removed after the sealing portion was cured. As shown in FIG. 27C, by removing the sealing mold 5122 and the unnecessary runner portion of the sealant after curing, it is possible to form the sealing portion which conforms to the shape of the space 5123 (i.e., the shape of the cavity) of the sealing mold.

Next, the process for manufacturing the recording head according to another aspect of the embodiment 2 will be explained with reference to FIGS. 28A and 28B.

Figure 28A:
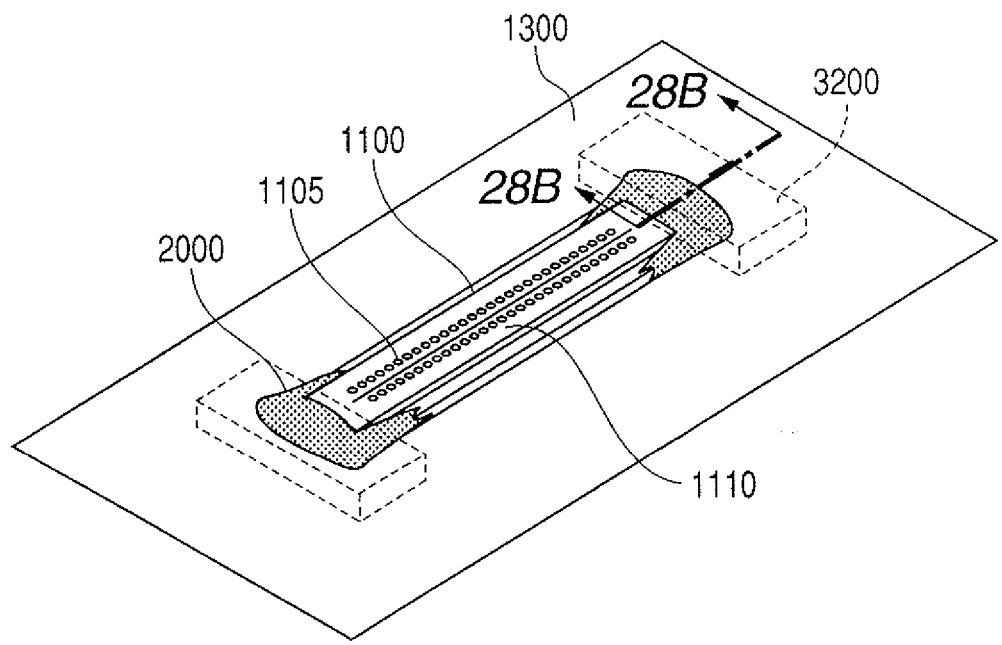
FIGS. 28A and 28B are views for explaining the manufacturing process of a recording head according to another aspect of the embodiment 2. More specifically.
Figure 28B:
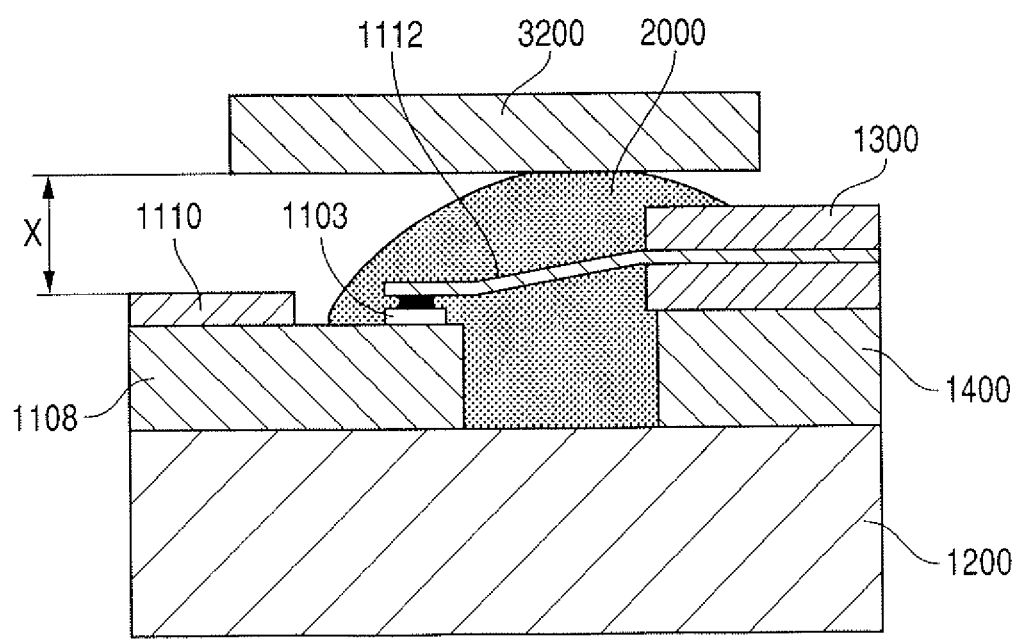

As shown in FIGS. 28A and 28B, the electrode 1103, through which inputting/outputting of electrical signals and supplying of electrical power are executed for the recording element substrate 1100, and the electrical wiring substrate 1300 are mutually connected by a bonding method of heating a flying lead 1112, and then adding ultrasonic waves and pressure thereto, whereby conductive connection is established between the electrode 1103 and the electrical wiring substrate 1300. Then, the sealing resin 2000 composed of a non-solvent epoxy resin and the like is applied so as to be able to coat the flying lead 1112 for protecting the electrical connection portion. Subsequently, the upper surface of the sealing resin 2000 is depressed by the depression member 3200. At that time, it is controlled to set a height X of the depressed sealing resin 2000 to the above-described desired distance from the uppermost surface layer of the discharge port formed surface 1110.

Next, heating of about 60° C. is executed to flux the sealing resin 2000, so that the sealing resin 2000 flows below the flying lead 1112 and into the gap between the recording element substrate 1100 and the electrical wiring substrate 1300. Here, it should be noted that the heating in this fluxing process is executed to expedite the fluxion and shorten the process. Although a heating temperature and a heating time depend on the material of the sealing resin 2000, it is necessary to set them insofar as cure of the resin does not start. Of course, since the sealing resin 2000 fluxes even if there is no heat, such a heating process might be omitted.

The sealing resin 2000 flows along the longitudinal side of the recording element substrate 1100, and the fluxion of the sealing resin 2000 approximately stops at this moment. Heating of about 80° C. is executed for five consecutive hours in this state to cure the sealing resin 2000. Incidentally, it should be noted that the heating temperature and the heating time depend on the material of the sealing resin 2000.

The depression member 3200 might be released after the surface of the sealing resin 2000 was cured (even if the inside thereof is not yet cured), or after the inside of the sealing resin 2000 was cured. Further, the depression of the sealing resin 2000 by the depression member 3200 might be executed before the sealing resin 2000 is cured completely, for example, the depression might be executed soon after the heating was started. If the depression member 3200 is released, the sealing resin 2000 comes into the state being controlled to have the desired height X.

Subsequently, the process for manufacturing the recording head according to another aspect of the embodiment 2 will be explained with reference to FIGS. 29A and 29B.

Figure 29A:
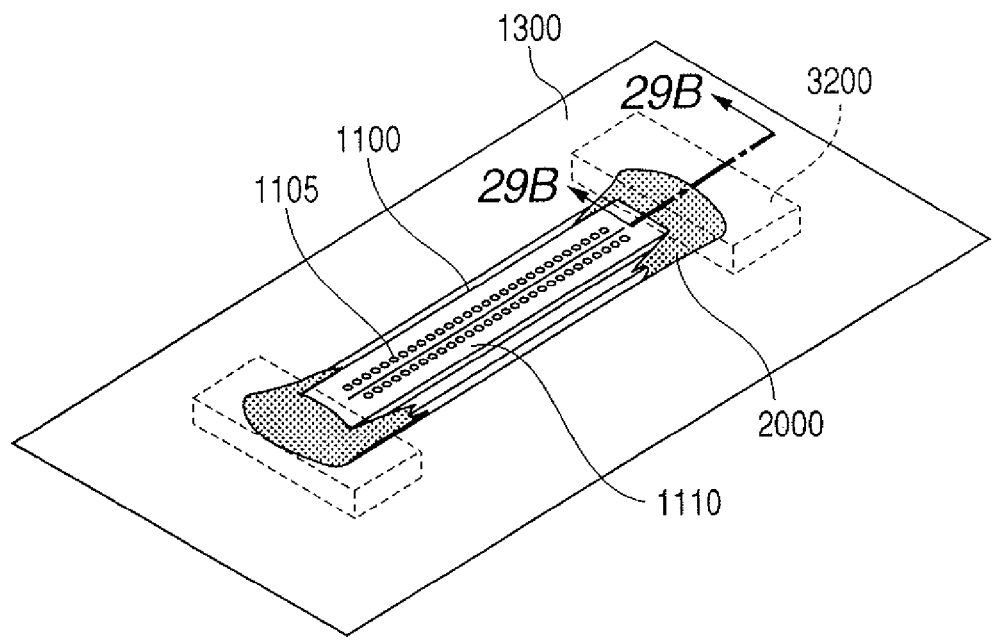
FIGS. 29A and 29B are views for explaining the manufacturing process of a recording head according to another aspect of the embodiment 2. More specifically.
Figure 29B:
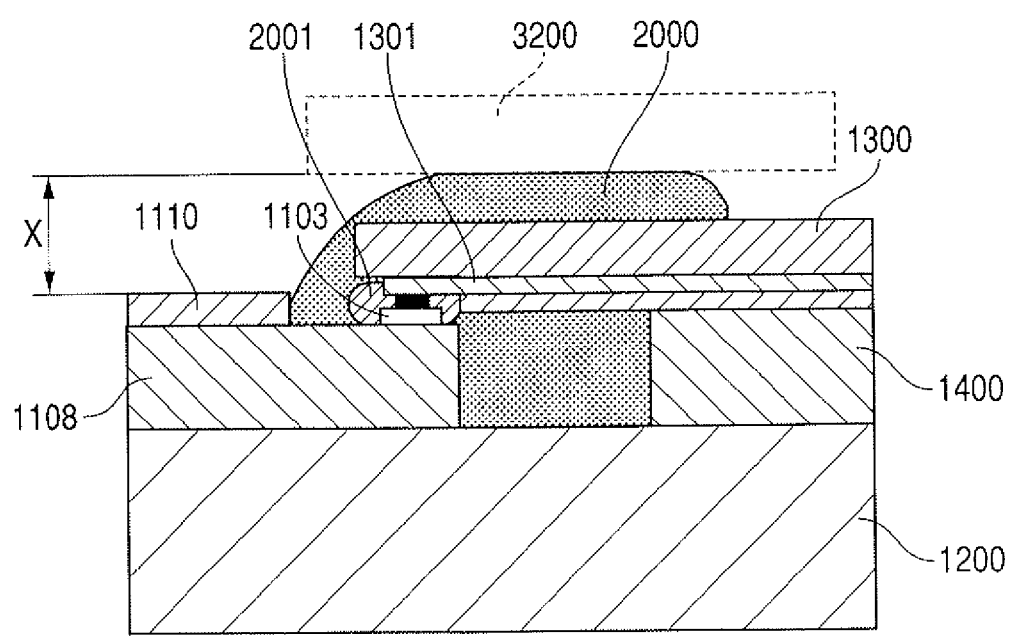

As shown in FIGS. 29A and 29B, the electrode 1103, through which inputting/outputting of electrical signals and supplying of electrical power are executed for the recording element substrate 1100, and a wiring 1301 of the electrical wiring substrate 1300 are mutually connected by an electrical bonding adhesive 2001 composed of an anisotropic conductive film (ACF), an anisotropic conductive paste (ACP), a nonconductive paste (NCP) or a nonconductive film (NCF), whereby conductive connection is established between the electrode 1103 and the electrical wiring substrate 1300.

As the next step in the electrical bonding method, as shown in FIGS. 29A and 29B, the sealing resin 2000 composed of a non-solvent epoxy resin and the like is applied so as to be able to coat the electrical connection portion. Then, the upper surface of the sealing resin 2000 is depressed by the depression member 3200. At that time, it is controlled to set a height X of the depressed sealing resin 2000 to the above-described desired distance from the uppermost surface layer of the discharge port formed surface 1110.

Subsequently, heating of about 60° C. is executed to flux the sealing resin 2000, so that the sealing resin 2000 flows into the gap between the recording element substrate 1100 and the electrical wiring substrate 1300. Here, it should be noted that the heating in this fluxing process is executed to expedite the fluxion and shorten the process. Although a heating temperature and a heating time depend on the material of the sealing resin 2000, it is necessary to set them insofar as cure of the resin does not start. Of course, since the sealing resin 2000 fluxes even if there is no heat, such a heating process might be omitted.

The sealing resin 2000 flows along the longitudinal side of the recording element substrate 1100, and the fluxion of the sealing resin 2000 approximately stops at this moment. Heating of about 80° C. is executed for five consecutive hours in this state to cure the sealing resin 2000. Incidentally, it should be noted that the heating temperature and the heating time depend on the material of the sealing resin 2000.

The depression member 3200 might be released after the surface of the sealing resin 2000 was cured (even if the inside thereof is not yet cured), or after the inside of the sealing resin 2000 was cured. Further, the depression of the sealing resin 2000 by the depression member 3200 might be executed before the sealing resin 2000 is cured completely, for example, the depression might be executed soon after the heating was started. If the depression member 3200 is released, the sealing resin 2000 comes into the state being reduced to the above-described desired height X.

Embodiment 3

Subsequently, a third embodiment of the present invention will be explained with reference to FIGS. 30A to 43B.

Figure 30A:
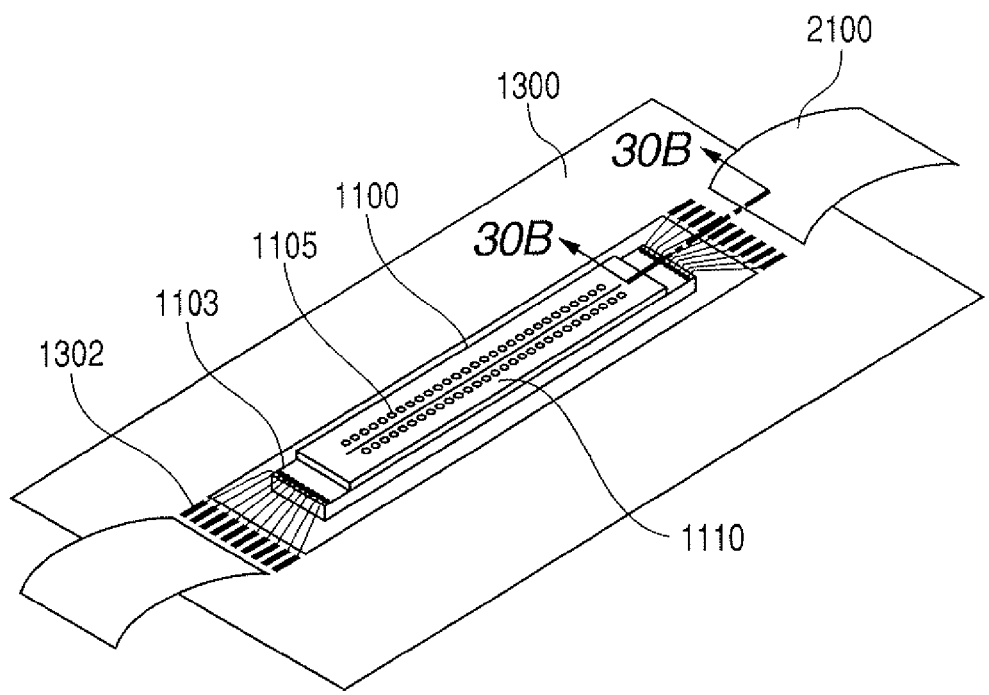
FIGS. 30A and 30B are views for explaining the manufacturing process of a recording head according to the embodiment 3. More specifically.
Figure 30B:
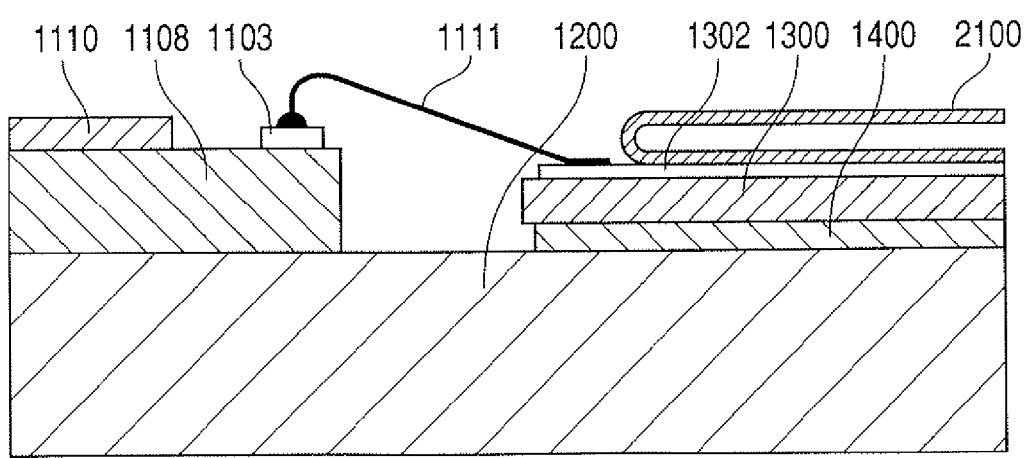

FIG. 30A is the perspective view showing one recording element substrate 1100 of the recording head 1000 and the enlarged periphery thereof, and FIG. 30B is the cross sectional view along the line 30B-30B shown in FIG. 30A. Here, it should be noted that each of FIGS. 31 and 43 is likewise composed of the perspective view and the cross sectional view.

Incidentally, although a method using wire bonding, a method using inner lead bonding (ILB), a method using an anisotropic conductive film (ACF) or the like is practically used as a concrete electrical connection method, it should be noted that the present embodiment is applicable to any method. Incidentally, when the wire bonding method is executed, the extension portion of a cover film 2100 of an electrical wiring substrate 1300 is folded and temporarily fixed to the position apart from the electrical connection portion, so that the relevant extension portion does not disturb operations.

First, the embodiment in which the electrical connection by the wire bonding is executed on the recording element substrate will be explained.

Figure 31A:
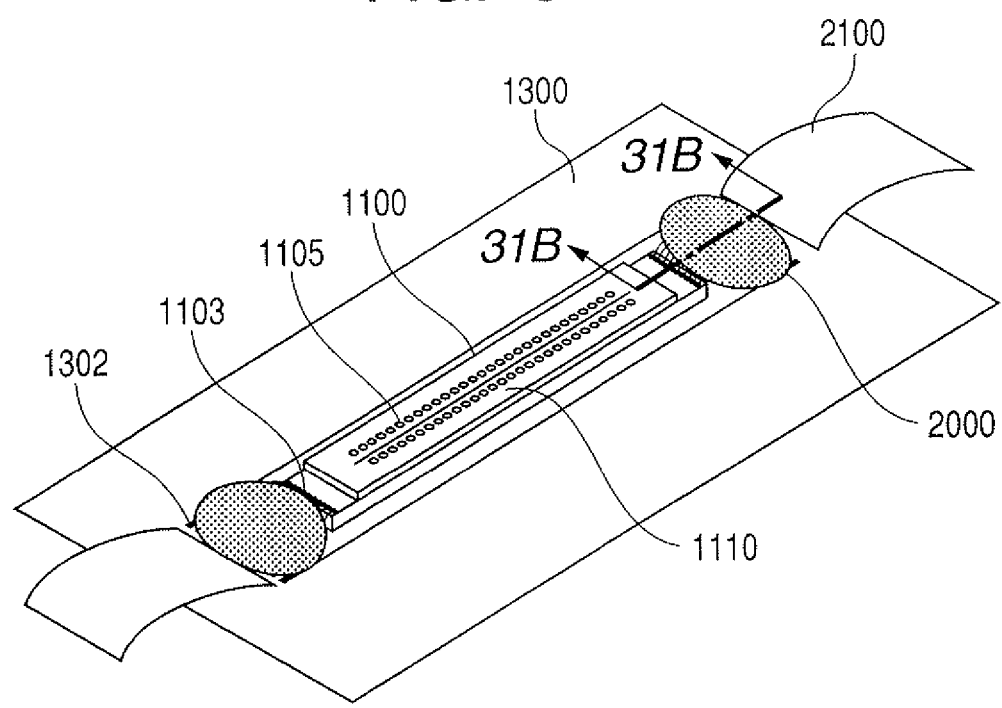
FIGS. 31A and 31B are views for explaining the manufacturing process of the recording head shown in FIGS. 30A and 30B. More specifically.
Figure 31B:
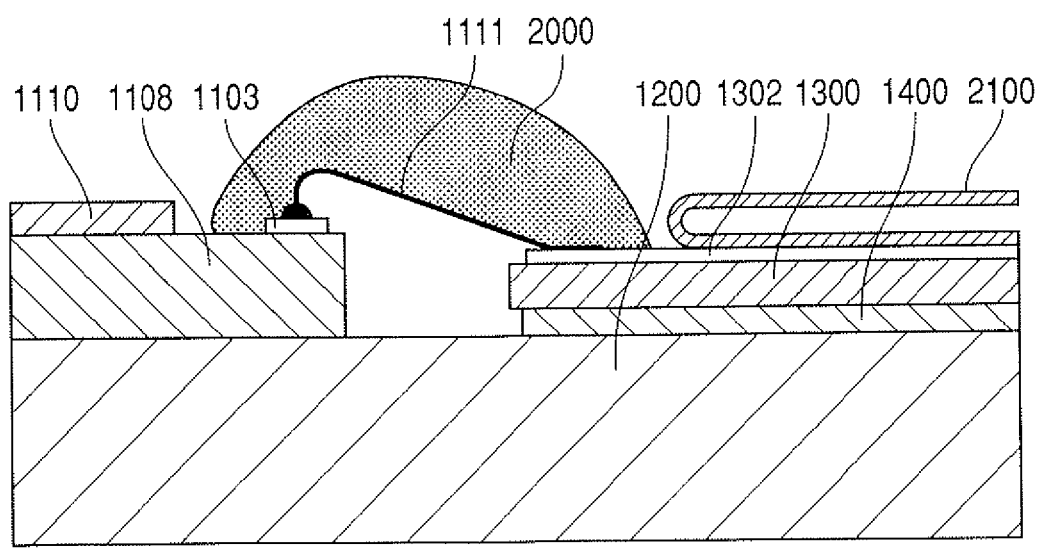

As the next step in the electrical connection process by the wire bonding, as shown in FIGS. 31A and 31B, a sealing resin 2000 composed of a non-solvent epoxy resin and the like is applied so as to be able to coat a bonding wires 1111 in the electrical connection portion.

Figure 32A:
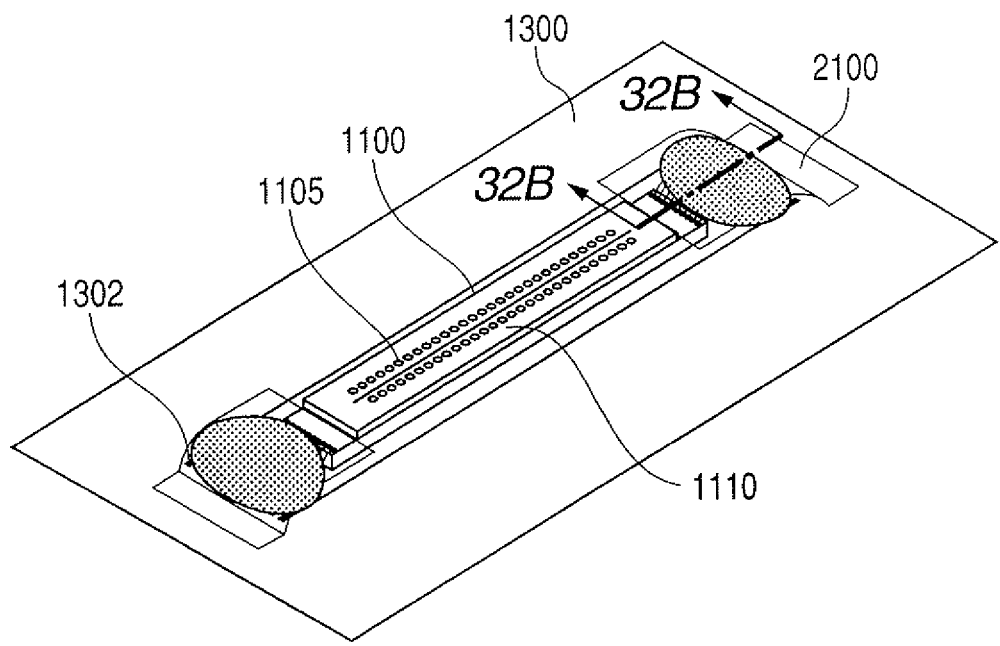
FIGS. 32A and 32B are views for explaining the manufacturing process of the recording head shown in FIGS. 30A and 30B. More specifically.
Figure 32B:
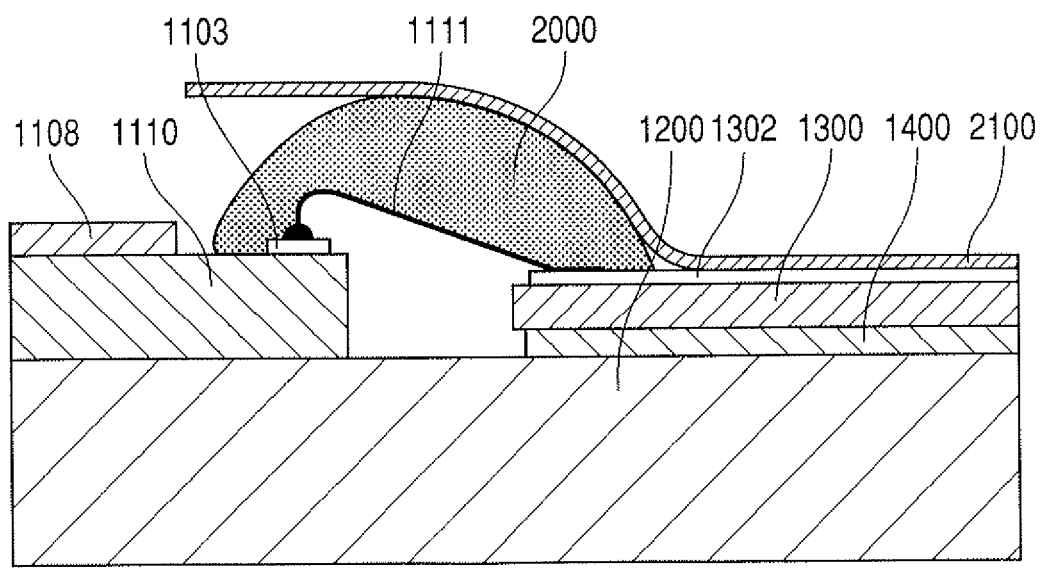

In the next step, as shown in FIGS. 32A and 32B, the extension portion of the cover film 2100 for covering the electrical wiring substrate 1300 is set so as to cover the sealing resin 2000. Here, as the extension portion of the cover film 2100 on the surface of the flexible wiring substrate, the film extended to be able to cover the electrical connection region between the recording element substrate 1110 and the electrical wiring substrate 1300 is used.

Incidentally, it should be noted that the length of the extension portion of the cover film 1200 is based on the premise that it does not reach and block the nozzles (discharge ports). The end of the extension portion of the cover film 2100 is extended up to the peripheral surface of a discharge port formed surface 1110. Then, as shown in FIGS. 34A and 34B, it is preferable to set the end of the extension portion to be held within the step-like portion between the discharge port formed surface 1110 and a Si substrate 1108 in the horizontal direction parallel to the main surface of the cover film 2100.

To recover the discharge characteristic of the recording head, a recovery process for slidably moving a blade-like member of elastic body on the discharge port formed surface 1110 including on the cover film 2100. At that time, since the step-like portion on the cover film 2100 does away by the recovery process, it is possible to prevent that the cover film 2100 is peeled off by the blade-like member. Further, the thickness of the sealant coated on the electrical connection portion to suppress the height of the sealing portion is lowered due to the cover film 2100. However, in this case, even if the blade-like member is slidably rubbed on the electrical connection portion and/or comes into contact with the electrical connection portion, the damage to the electrical connection portion can be suppressed.

Figure 33A:
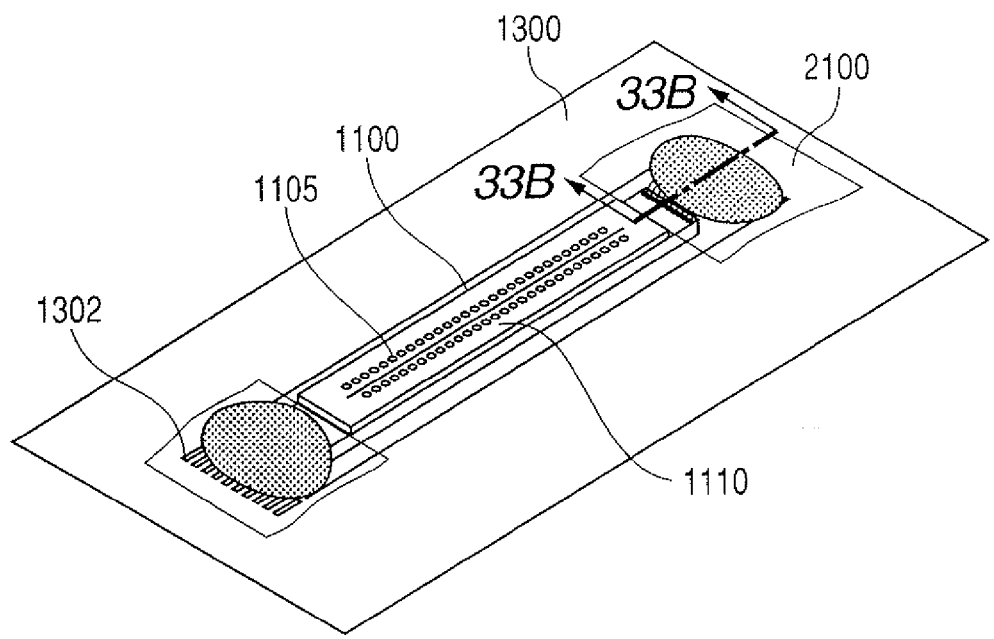
FIGS. 33A and 33B are views for explaining the manufacturing process of the recording head shown in FIGS. 30A and 30B. More specifically.
Figure 33B:
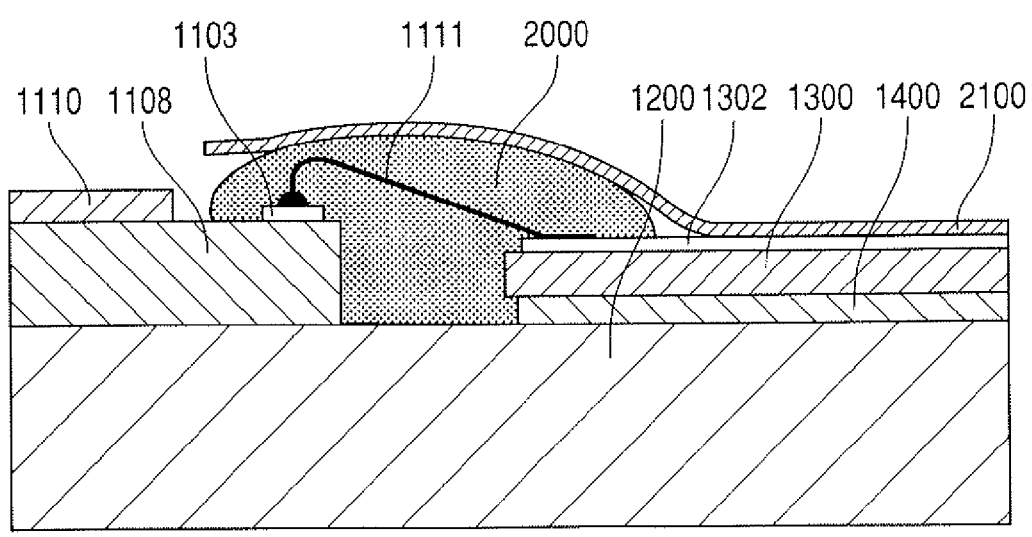

Next, as shown in FIGS. 33A and 33B, heating of about 60° C. is executed to flux the sealing resin 2000, so that the sealing resin 2000 flows below the bonding wires 1111 and into the gap between the recording element substrate 1100 and the electrical wiring substrate 1300. Then, according as the sealing resin 2000 comes down, the extension portion of the cover film 2100 likewise comes down, whereby the extension portion of the cover film 2100 comes close to the shape of the bonding wires 1111 through the sealing resin 2000. Here, it should be noted that the heating in this fluxing process is executed to expedite the fluxion and shorten the process. Although a heating temperature and a heating time depend on the physical property of the sealing resin 2000, it is necessary to set them insofar as cure of the sealing resin 2000 does not proceed. Of course, since the sealing resin 2000 fluxes even if there is no heat, such a heating process might be omitted.

Figure 34A:
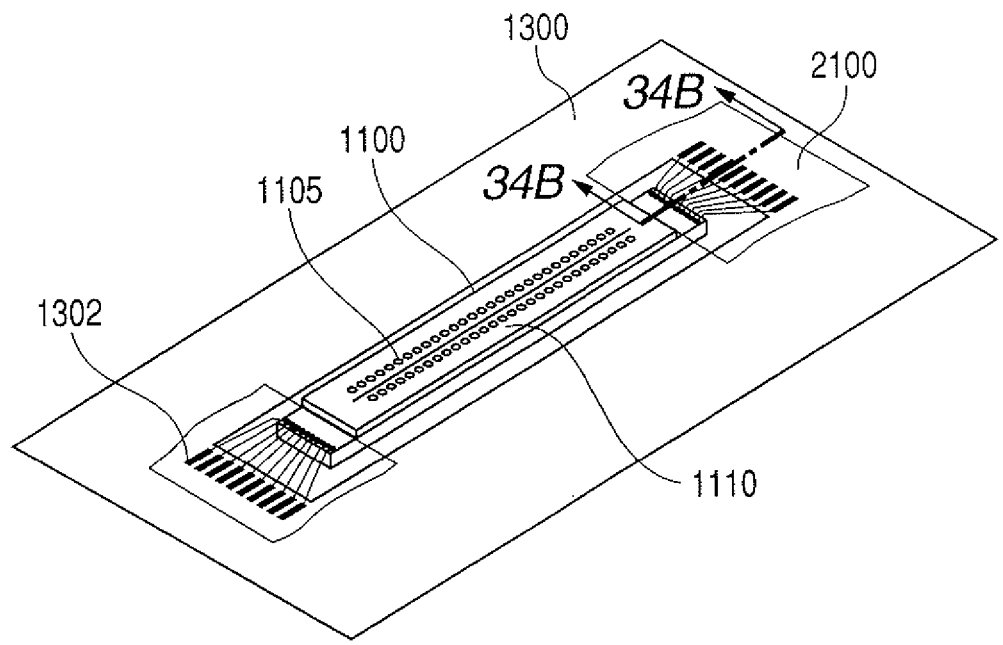
FIGS. 34A and 34B are views for explaining the manufacturing process of the recording head shown in FIGS. 30A and 30B. More specifically.
Figure 34B:
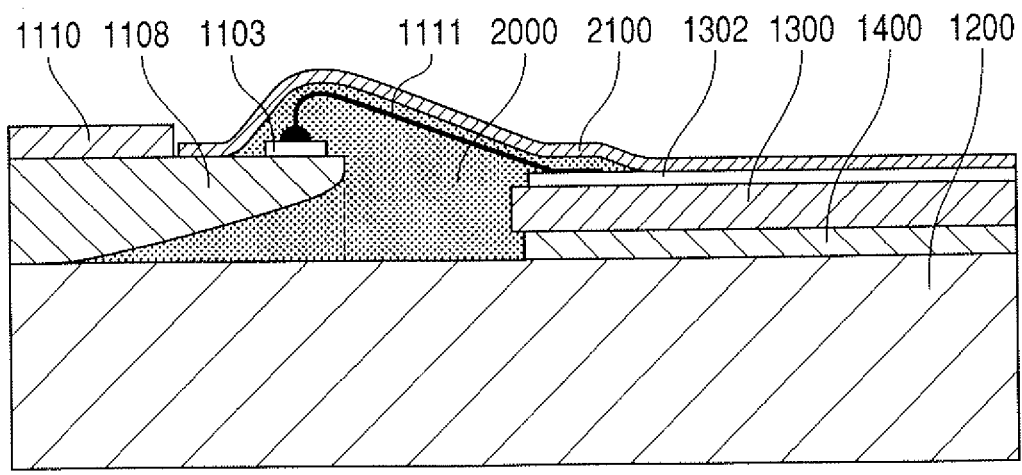

Further, if the sealing resin 2000 further fluxes, as shown in FIGS. 34A and 34B, the sealing resin 2000 flows respectively along the longitudinal sides on the peripheral portion of the recording element substrate 1100, whereby the extension portion of the cover film 2100 further comes down. Then, the extension portion of the cover film 2100 is cured in the shape adhered to the bonding wires 1111 being the electrical connection portion along the angular shape thereof, through the sealing resin 2000 coating the bonding wires 1111.

The fluxion of the sealing resin 2000 approximately stops at this moment. Heating of about 80° C. is executed for five consecutive hours in this state to cure the sealing resin 2000, and the process for coating the electrical connection portion by the extension portion of the cover film 2100 is then completed. Incidentally, it should be noted that the heating temperature and the heating time are properly changed according to the physical property of the sealing resin 2000. Besides, instead of the above process in which the sealing resin 2000 is applied to the electrical connection portion, the sealing resin 2000 might be applied to the extension portion of the cover film 2100. In that case, the electrical connection portion is covered by the extension portion of the cover film 2100 before the sealing resin 2000 applied to the extension portion is cured.

As described above, according to the recording head of the present embodiment, the sealing resin 2000 is covered or coated on the electrical connection portion by the extension portion provided by extending a part of the cover film 2100 of the electrical wiring substrate 1300. Consequently, the protrusion amount of the sealing portion by the sealing resin 2000 can be stably suppressed as small as possible, whereby the electrical connection portion can be protected certainly. Further, since the cover film 2100 of the electrical wiring substrate 1300 is extended and then used, it is unnecessary to separately provide a coating film and execute the positioning of this film, and it is further unnecessary to execute a process for provisionally adhering the coating film for the purpose of prevention of displacement or misregistration of this film. Therefore, the number of necessary parts can be reduced, whereby manufacturing costs of the recording head can be reduced resultingly. For this reason, according to the recording head of the present embodiment, the distance between the discharge port formed surface 1110 and the recording medium such as paper or the like can be shortened, thereby achieving high-quality recording.

Next, the process for manufacturing the recording head according to another aspect of the embodiment 3 will be explained with reference to FIGS. 35A and 35B. Here, the point that a flying lead is used in the electrical connection portion is different from the point of the above embodiment that the bonding wire is used. However, other constitutions such as the recording head, the recording device and the like are approximately the same as those in the above explanation, whereby the explanations thereof will be omitted.

Figure 35A:
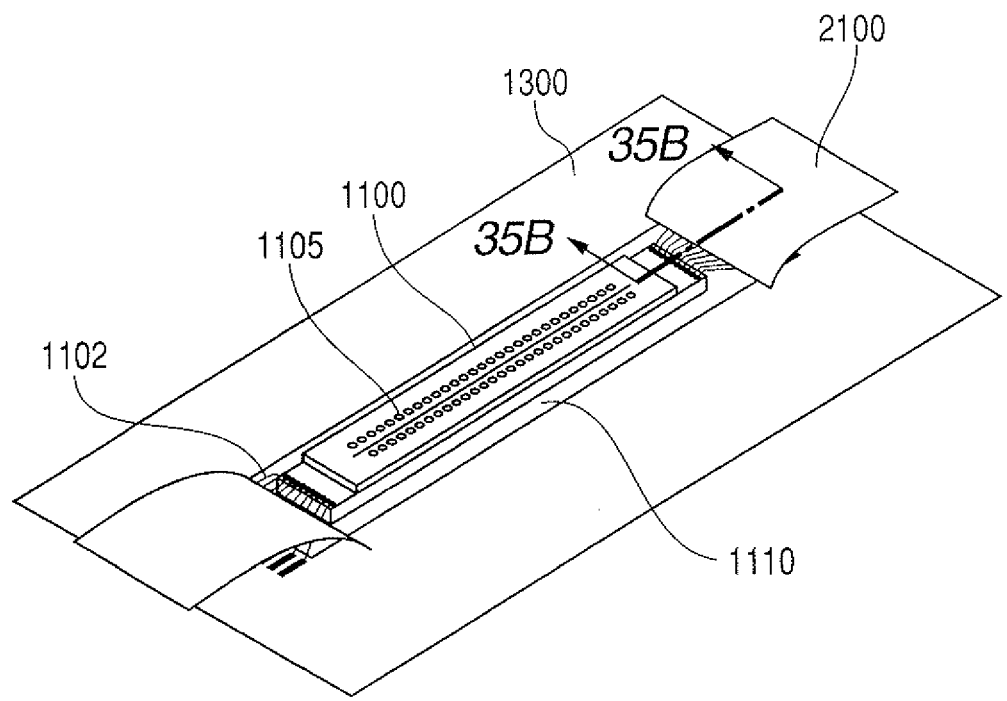
FIGS. 35A and 35B are views for explaining the manufacturing process of a recording head according to another aspect of the embodiment 3. More specifically.
Figure 35B:
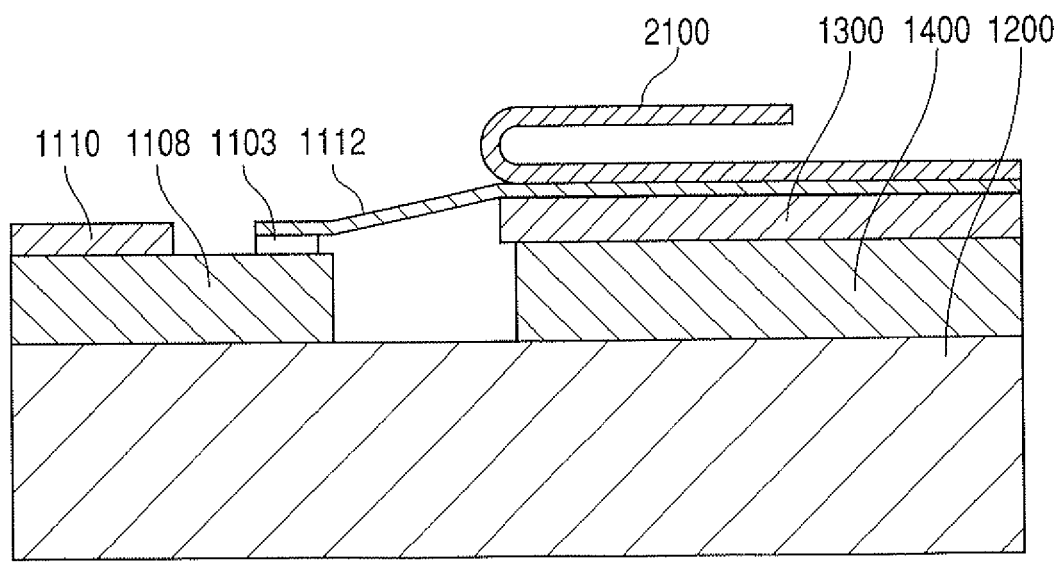

As shown in FIGS. 35A and 35B, the electrode 1103, through which inputting/outputting of electrical signals and supplying of electrical power are executed for the recording element substrate 1100, and the electrical wiring substrate 1300 are mutually connected and conducted electrically by a bonding method of heating a flying lead 1112, and then adding ultrasonic waves and pressure thereto. Incidentally, when the flying lead 1112 is implemented, the extension portion of the cover film 2100 of the electrical wiring substrate 1300 is folded and temporarily fixed to the position apart from the electrical connection portion, so that the relevant extension portion does not disturb operations.

Figure 36A:
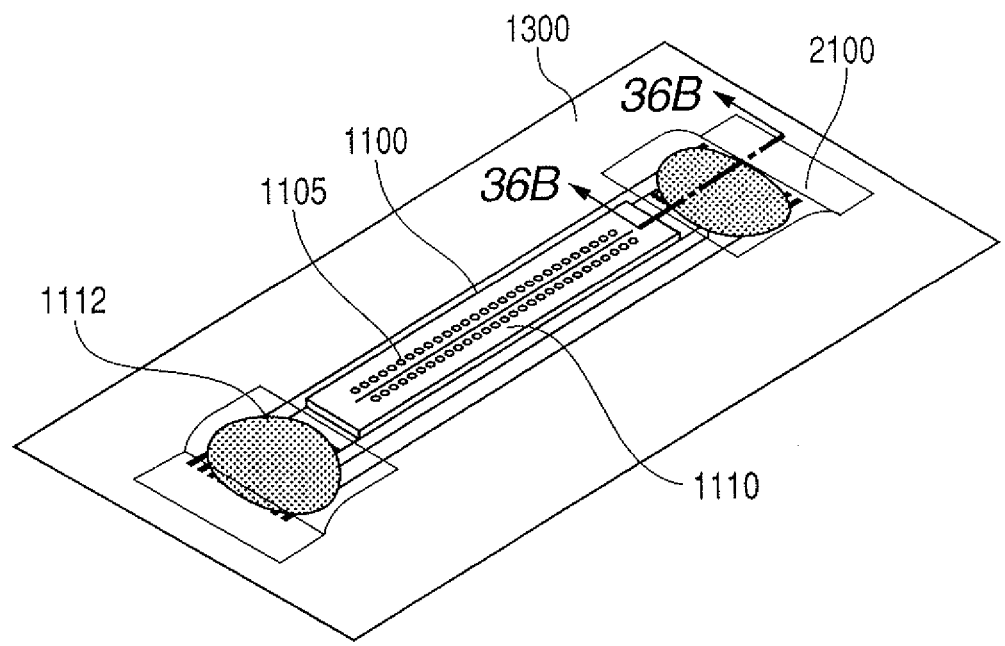
FIGS. 36A and 36B are views for explaining the manufacturing process of the recording head shown in FIGS. 35A and 35B. More specifically.
Figure 36B:
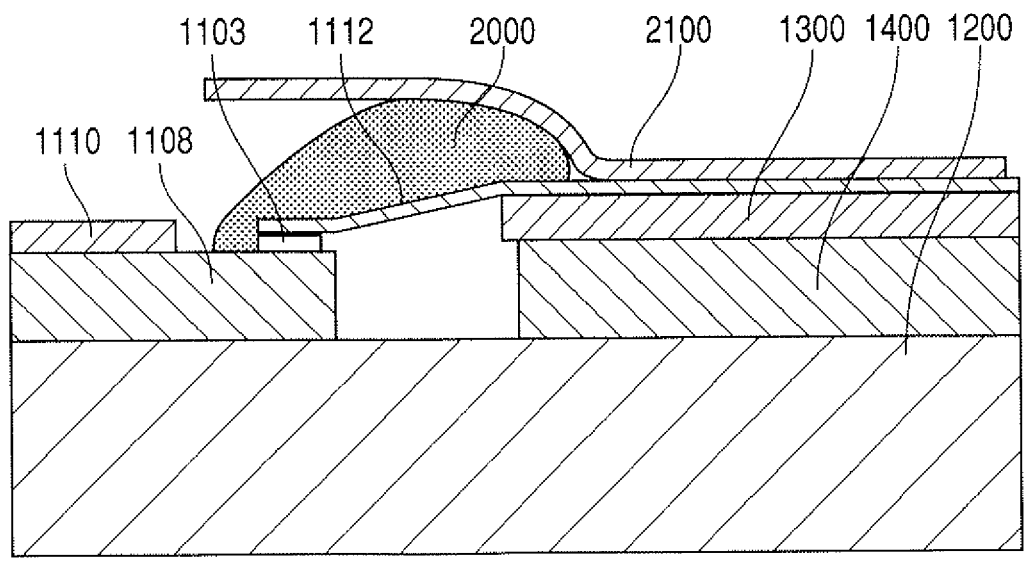

As the next step, as shown in FIGS. 36A and 36B, a sealing resin 2000 composed of a non-solvent epoxy resin and the like is applied so as to be able to coat the flying lead 1112, and the cover film 2100 of the electrical wiring substrate 1300 is put and set on the sealing resin 2000. As the cover film 2100 to be provided on the surface of the electrical wiring substrate 1300, the cover film which was acquired by extending the used cover film 2100 for the flexible wiring substrate as much as the length capable of covering over the area of the flying lead 1112 is used. In any case, the details are approximately the same as those in the above embodiment in which the wire bonding is used.

Figure 37A:
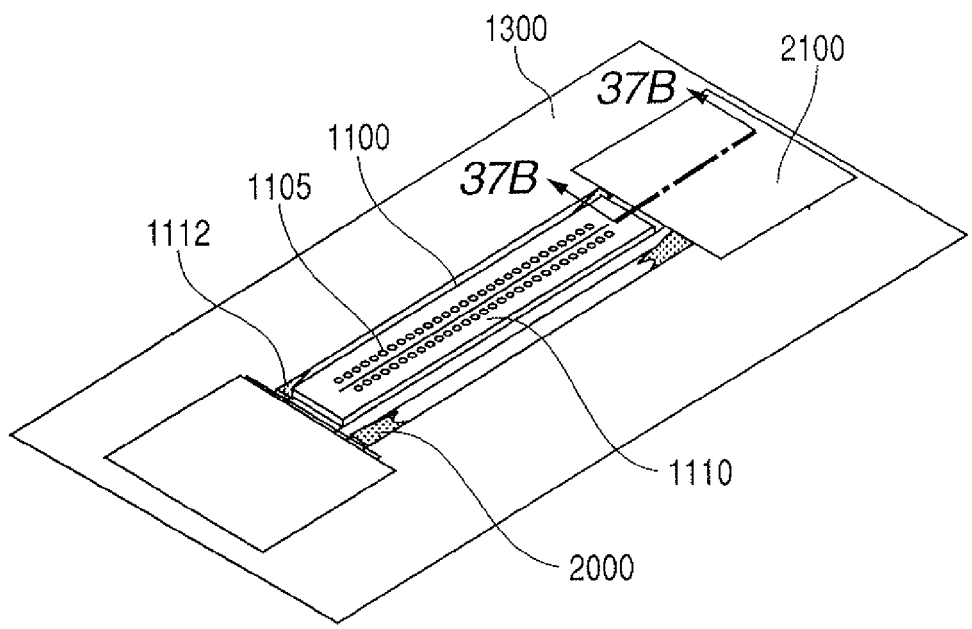
FIGS. 37A and 37B are views for explaining the manufacturing process of the recording head shown in FIGS. 35A and 35B. More specifically.
Figure 37B:
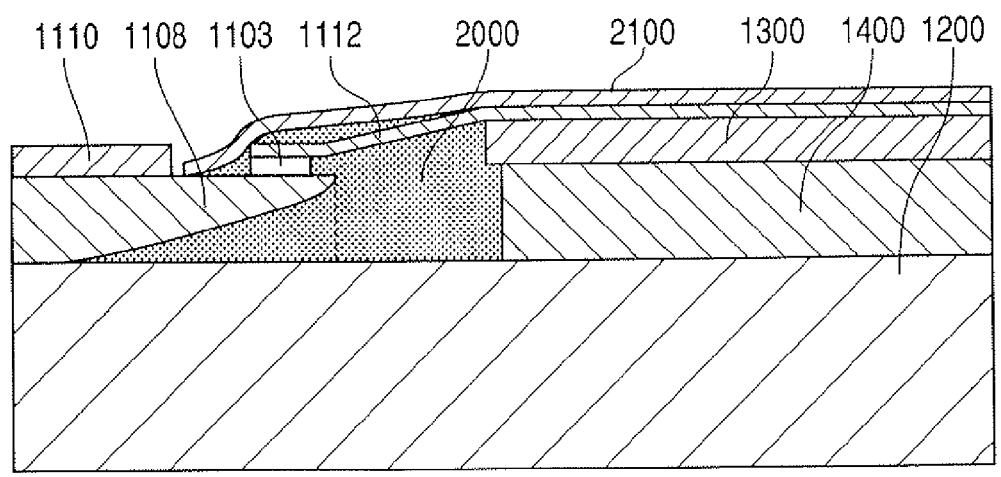

Subsequently, as shown in FIGS. 37A and 37B, heating of about 60° C. is executed to flux the sealing resin 2000, so that the sealing resin 2000 flows below the flying lead 1112 and into the gap between the recording element substrate 1100 and the electrical wiring substrate 1300. Then, according as the sealing resin 2000 comes down, a cover film 2100 likewise comes down, whereby the extension portion of the cover film 2100 comes close to the shape of the flying lead 1112. Here, it should be noted that the heating in this fluxing process is executed to expedite the fluxion and shorten the process. Although a heating temperature and a heating time depend on the physical property of the sealing resin 2000, it is necessary to set them insofar as cure of the sealing resin 2000 does not proceed. Of course, since the sealing resin 2000 fluxes even if there is no heat, such a heating process might be omitted.

Further, if the sealing resin 2000 further fluxes, the sealing resin 2000 flows respectively along the longitudinal sides on the peripheral portion of the recording element substrate 1100, whereby the extension portion of the cover film 2100 further comes down. Then, the extension portion of the cover film 2100 is cured in the shape adhered to the flying lead 1112 being the electrical connection portion along the angular shape thereof, through the sealing resin 2000 coating the flying lead 1112. The fluxion of the sealing resin 2000 approximately stops at this moment. Heating of about 80° C. is executed for five consecutive hours in this state to cure the sealing resin 2000, and the process for coating the electrical connection portion by the extension portion of the cover film 2100 is then completed. Incidentally, it should be noted that the heating temperature and the heating time are properly changed according to the physical property of the sealing resin 2000.

Next, the process for manufacturing the recording head according to another aspect of the embodiment 3 will be explained with reference to FIGS. 38A to 40B. Here, the electrical connection portion is formed in the pressure bonding in which an anisotropic conductive film (ACF) including anisotropic conductive particles, an anisotropic conductive paste (ACP), a nonshrinkable nonconductive paste (NCP), a nonconductive film (NCF) or the like is used. Here, other constitutions such as the recording head, the recording device and the like are approximately the same as those in the above explanation, whereby the explanations thereof will be omitted.

Figure 38A:
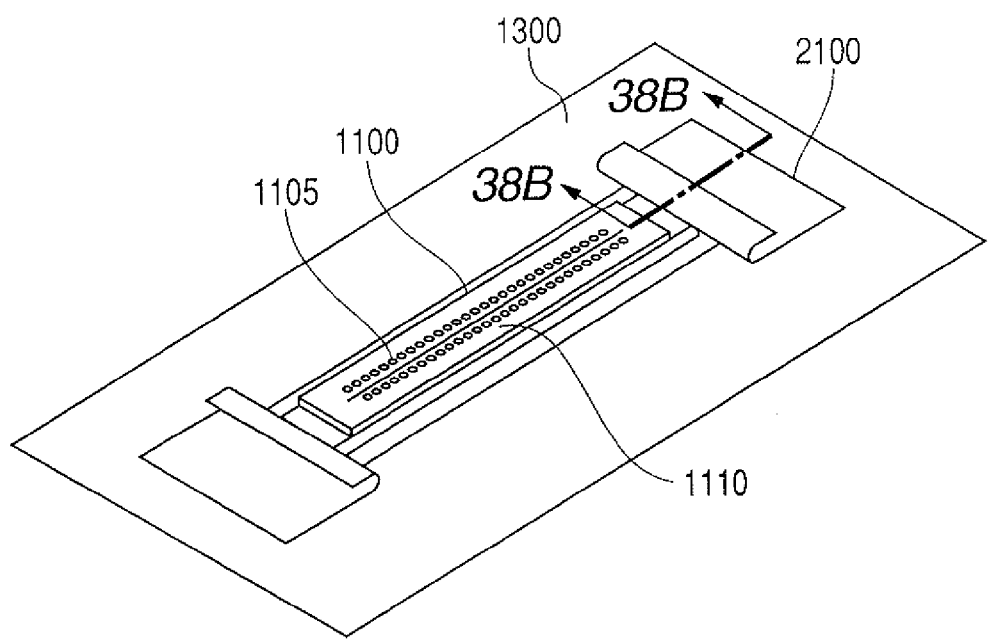
FIGS. 38A and 38B are views for explaining the manufacturing process of a recording head according to another aspect of the embodiment 3. More specifically.
Figure 38B:
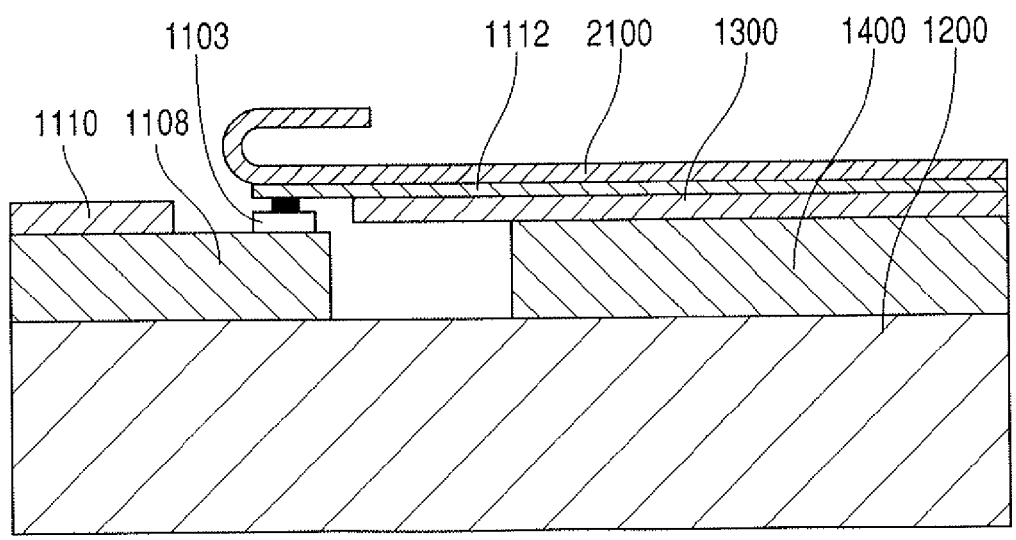

As shown in FIGS. 38A and 38B, the electrode 1103, through which inputting/outputting of electrical signals and supplying of electrical power are executed for the recording element substrate 1100, and the electrical wiring substrate 1300 are mutually connected by an electrical bonding adhesive 2001 composed of ACF, ACP, NCP or NCF, whereby conductive connection is established between the electrode 1103 and the electrical wiring substrate 1300. Incidentally, when the electrical bonding is executed, the extension portion of the cover film 2100 of the electrical wiring substrate 1300 is folded and temporarily fixed to the position apart from the electrical connection portion, so that the relevant extension portion does not disturb operations.

Figure 39A:
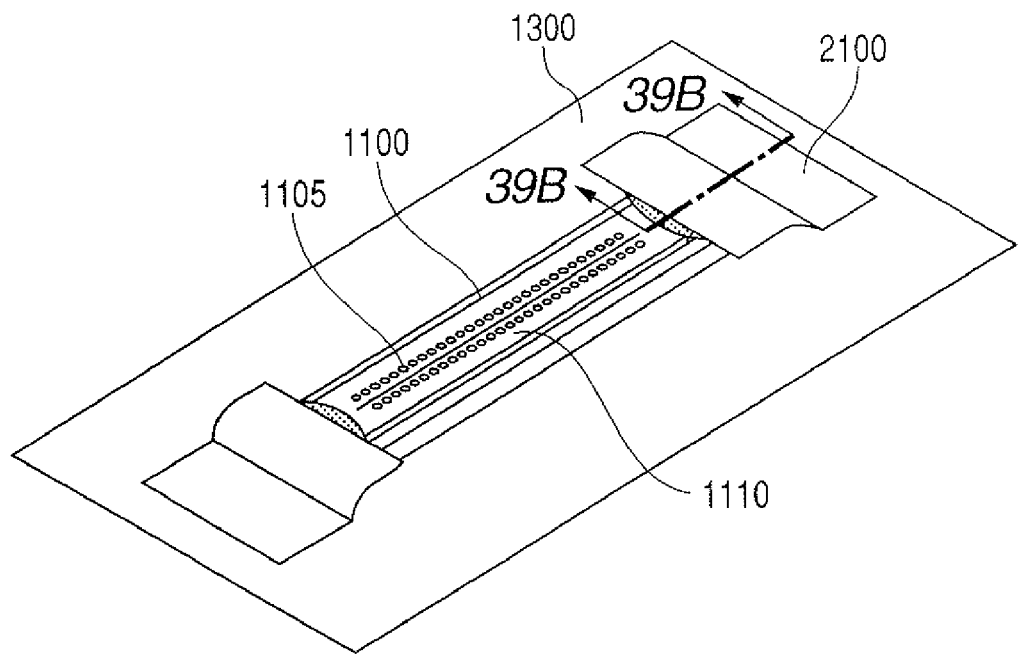
FIGS. 39A and 39B are views for explaining the manufacturing process of the recording head shown in FIGS. 38A and 38B. More specifically.
Figure 39B:
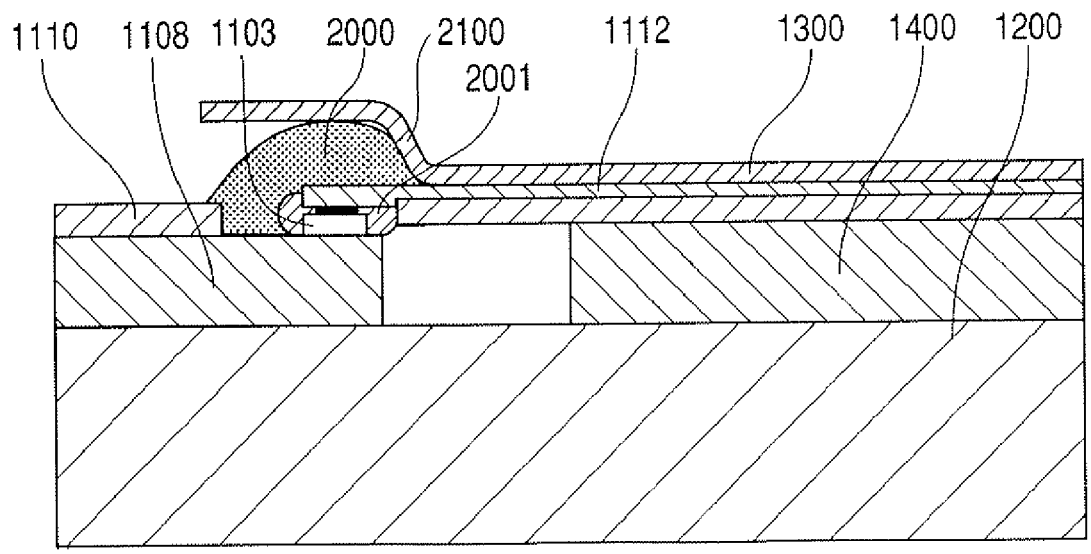

As the next step in the electrical bonding, as shown in FIGS. 39A and 39B, the sealing resin 2000 composed of a non-solvent epoxy resin and the like is applied so as to cover the electrical bonding point of the electrical connection portion, and the extension portion of the cover film 2100 is put and set on the sealing resin 2000.

As the cover film 2100, the cover film which was formed by extending the used cover film 2100 for the flexible wiring substrate as much as the length capable of covering over the electrical bonding portion is used.

Figure 40A:
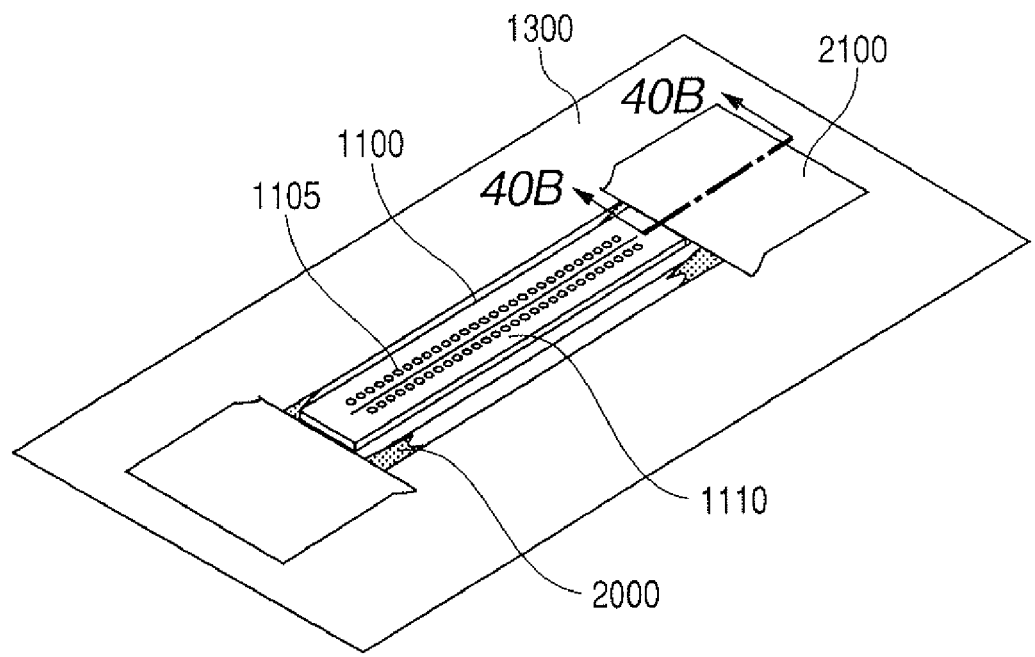
FIGS. 40A and 40B are views for explaining the manufacturing process of the recording head shown in FIGS. 38A and 38B. More specifically.
Figure 40B:
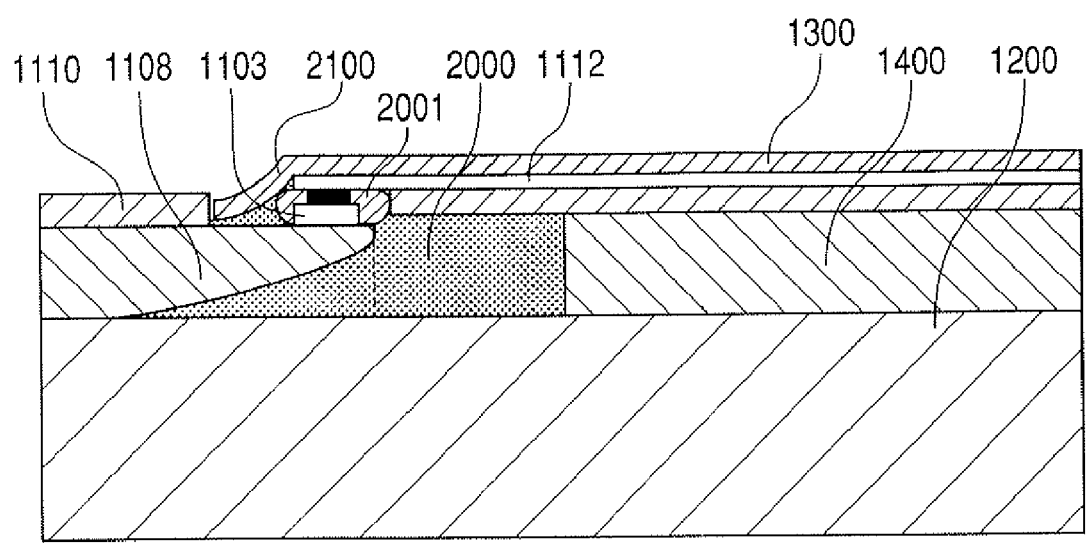
Figure 41A:
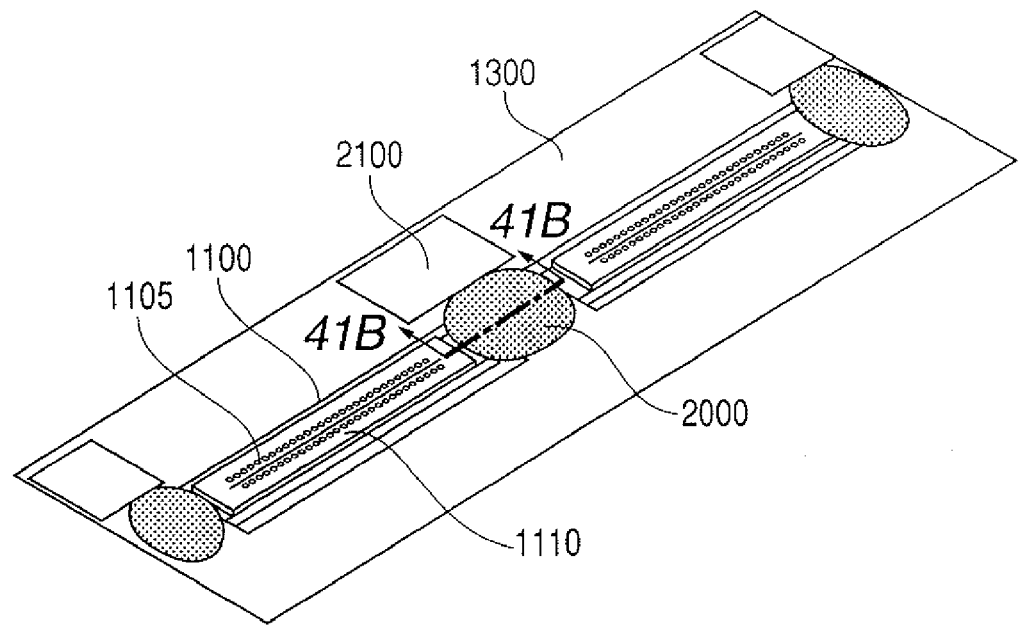
FIGS. 41A and 41B are views for explaining the manufacturing process of a recording head according to another aspect of the embodiment 3. More specifically.
Figure 41B:
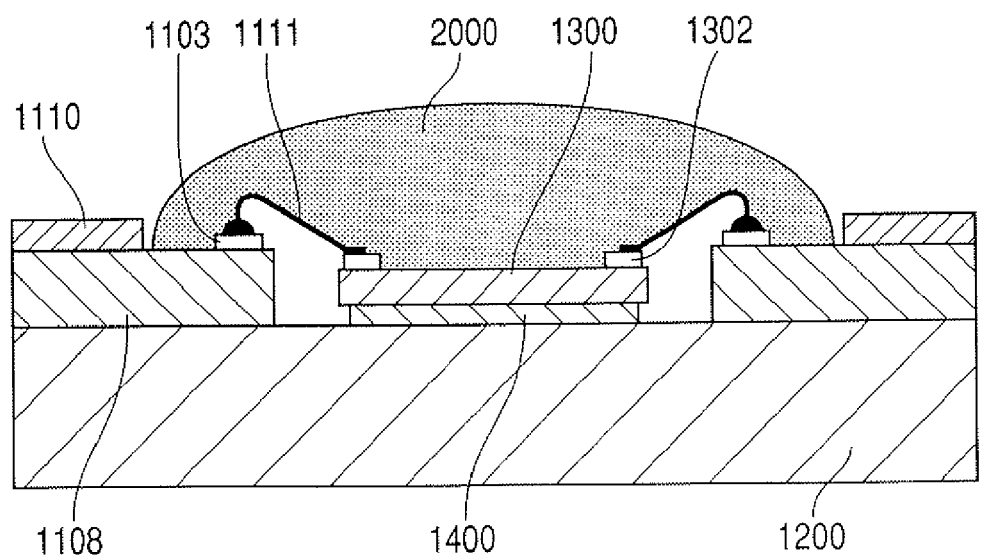

Next, as shown in FIGS. 40A and 40B, heating of about 60° C. is executed to flux the sealing resin 2000, so that the sealing resin 2000 flows into the gap between the recording element substrate 1100 and the electrical wiring substrate 1300. Then, according as the sealing resin 2000 comes down, the cover film 2100 likewise comes down, whereby the extension portion of the cover film 2100 comes close to the shape of the bonding wires 1111 through the sealing resin 2000. Here, it should be noted that the heating in this fluxing process is executed to expedite the fluxion and shorten the process. Although a heating temperature and a heating time depend on the physical property of the sealing resin 2000, it is necessary to set them insofar as cure of the sealing resin 2000 does not proceed. Of course, since the sealing resin 2000 fluxes even if there is no heat, such a heating process might be omitted.

Further, if the sealing resin 2000 further fluxes, the sealing resin 2000 flows respectively along the longitudinal sides on the peripheral portion of the recording element substrate 1100, whereby the extension portion of the cover film 2100 further comes down. Thus, the cover film 2100 has the shape adhered to the upper surfaces of the electrical wiring substrate 1300 and the recording element substrate 1100 along the shapes thereof through the sealing resin 2000 coating the electrical connection portion, so as to cover the electrical connection portion between the electrical wiring substrate 1300 and the recording element substrate 1100. The fluxion of the sealing resin 2000 approximately stops at this moment. Heating of about 80° C. is executed for five consecutive hours in this state to cure the sealing resin 2000, and the process for coating the electrical connection portion by the cover film 2100 is then completed. Incidentally, it should be noted that the heating temperature and the heating time are properly changed according to the physical property of the sealing resin 2000.

Next, the process for manufacturing the recording head according to another aspect of the embodiment 3 will be explained with reference to FIGS. 41A to 43B. Here, the extension portion of the cover film explained in each aspect of the embodiment 3 is arranged astride each electrical connection portion on the plural recording element substrates. Then, in this aspect, the point that, when the electrical connection portion is implemented, the direction in which the extension portion of the cover film 2100 of the electrical wiring substrate 1300 is fixed is changed so that the relevant extension portion does not disturb operations is different from the point in each aspect of the embodiment 3. Hereinafter, the electrical connection portion and the protection state thereof will be explained with reference to the attached drawings. Incidentally, other constitutions such as the recording head, the recording device and the like are approximately the same as those in the above explanation, whereby the explanations thereof will be omitted.

The electrode 1103, through which inputting/outputting of electrical signals and supplying of electrical power are executed for the recording element substrate 1100, and the electrical wiring substrate 1300 are mutually connected through the bonding wires 1111 formed by the wire bonding method, whereby conductive connection is established between the electrode 1103 and the electrical wiring substrate 1300. Incidentally, when the wire bonding is executed, the extension portion of the cover film 2100 of the electrical wiring substrate 1300 is folded and temporarily fixed to the position apart from the electrical connection portion, so that the relevant extension portion does not disturb operations.

In this aspect, the direction in which the extension portion is folded is different from that in each of the above aspects of the embodiment 3. That is, the extension portion of the cover film 2100 is folded in the direction perpendicular to the direction in which the recording element substrates 1100 are disposed, and the folded portion is temporarily fixed, so that the relevant extension portion does not disturb the mounting operations on the adjacent recording element substrates 1100.

Figure 42A:
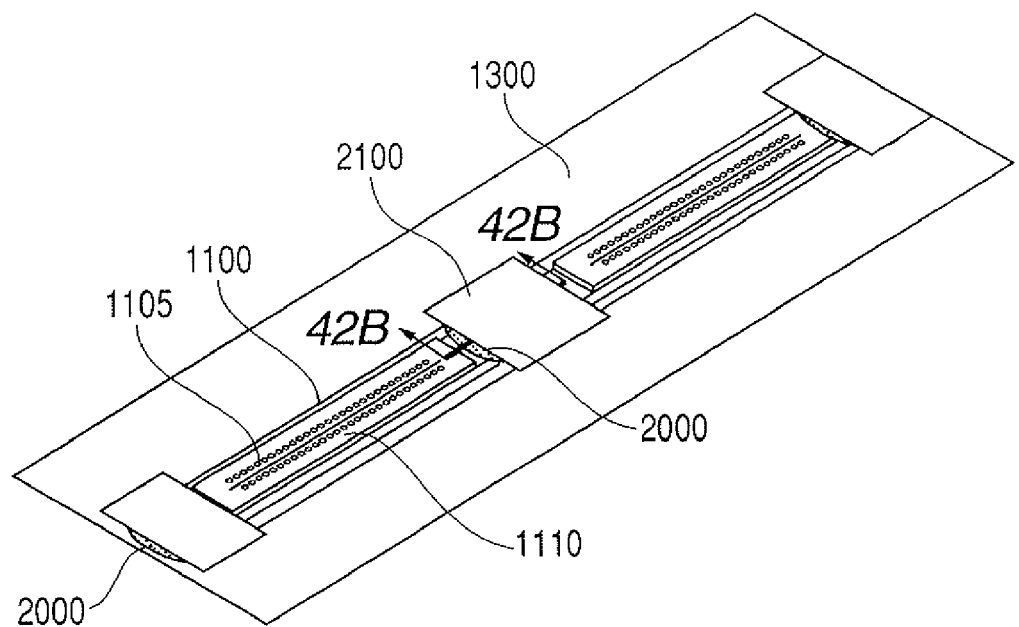
FIGS. 42A and 42B are views for explaining the manufacturing process of the recording head shown in FIGS. 41A and 41B. More specifically.
Figure 42B:
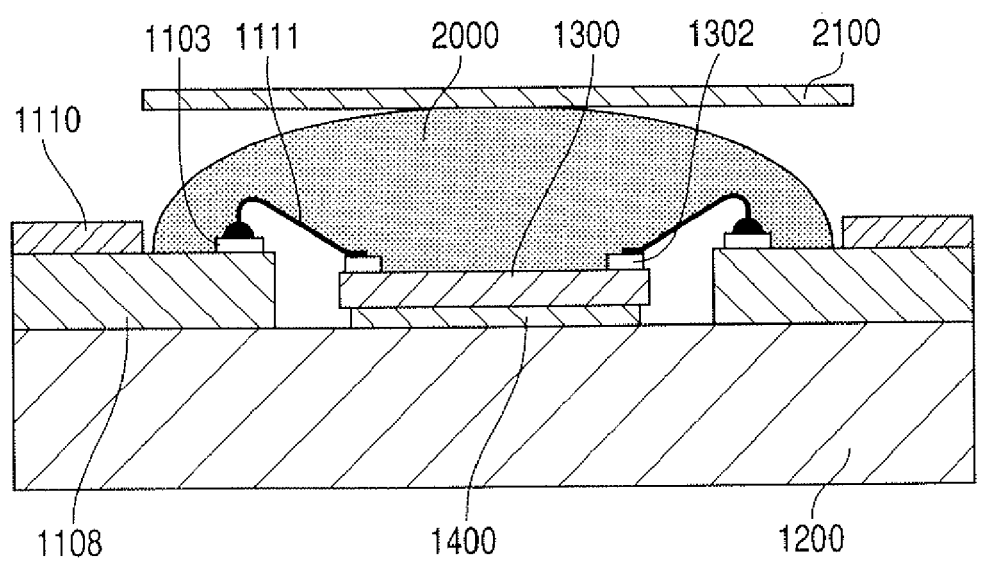

Next, the sealing resin 2000 composed of a non-solvent epoxy resin and the like is applied so as to coat the bonding wires 1111 on the adjacent two recording element substrates 1100. Then, as shown in FIGS. 42A and 42B, the extension portion of the cover film 2100 of the electrical wiring substrate 1300 is set so as to cover the sealing resin 2000. Here, it is preferable by the area of the extension portion to cover at least each electrical connection portion between the recording element substrate 1100 and the electrical wiring substrate 1300, and it is also preferable to set both the ends of the extension portion to be held within the step-like portion between the discharge port formed surface 1110 and the Si substrate 1108.

Figure 43A:
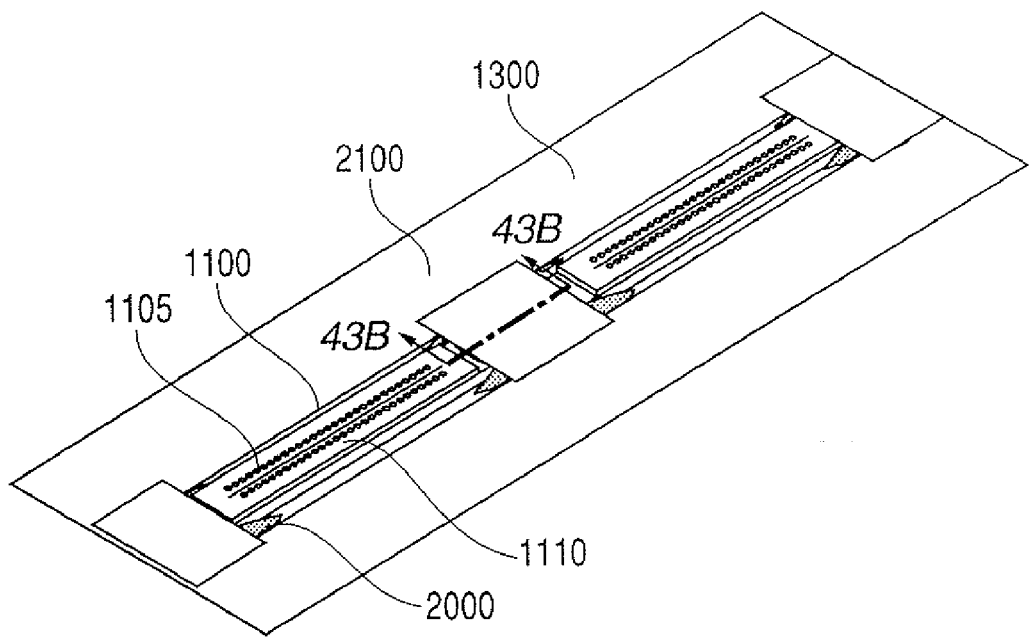
FIGS. 43A and 43B are views for explaining the manufacturing process of the recording head shown in FIGS. 41A and 41B. More specifically.
Figure 43B:
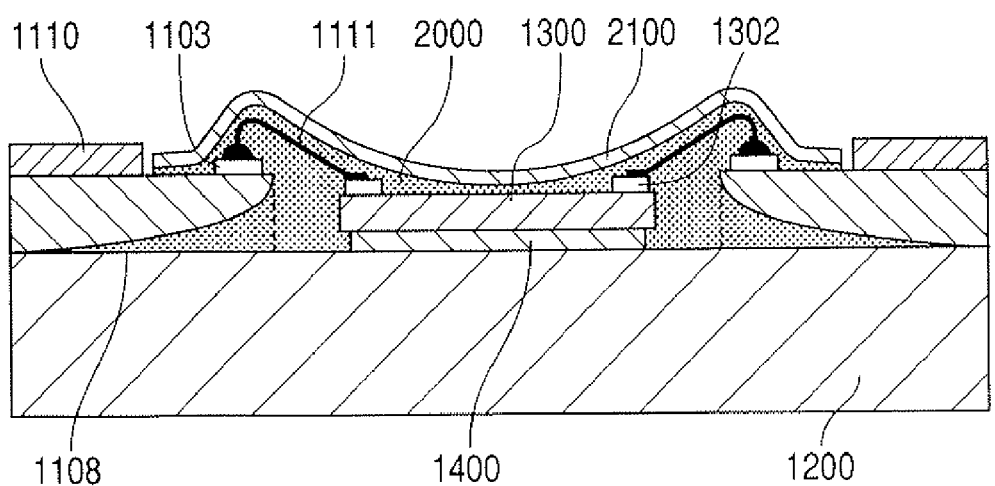
Figure 44:
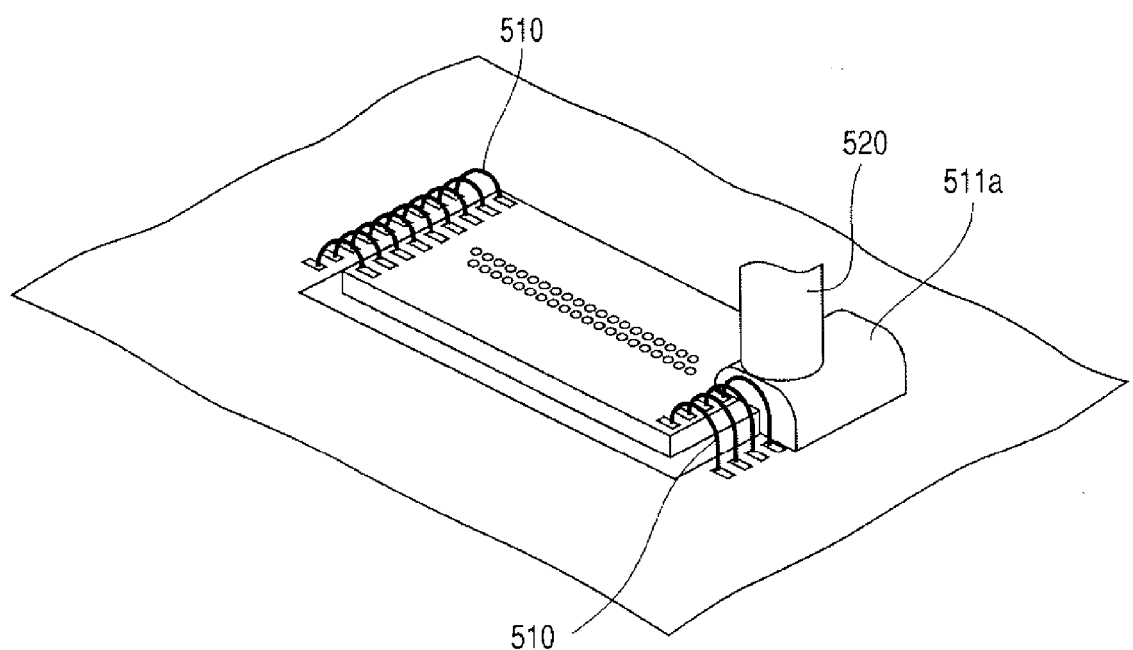
FIG. 44 is the perspective view for explaining a conventional method of applying a sealant to a recording head.

Subsequently, as shown in FIGS. 43A and 43B, heating of about 60° C. is executed to flux the sealing resin 2000, so that the sealing resin 2000 flows below the bonding wires 1111 and into the gap between the recording element substrate 1100 and the electrical wiring substrate 1300. Then, according as the sealing resin 2000 comes down, the extension portion of the cover film 2100 likewise comes down, whereby the extension portion of the cover film 2100 comes close to the shape of the bonding wires 1111 through the sealing resin 2000. Here, it should be noted that the heating in this fluxing process is executed to expedite the fluxion and shorten the process. Although a heating temperature and a heating time depend on the physical property of the sealing resin 2000, it is necessary to set them insofar as cure of the sealing resin 2000 does not proceed. Of course, since the sealing resin 2000 fluxes even if there is no heat, such a heating process might be omitted.

Further, if the sealing resin 2000 further fluxes, as shown in FIGS. 43A and 43B, the sealing resin 2000 flows respectively along the longitudinal sides on the peripheral portion of the recording element substrate 1100, whereby the extension portion of the cover film 2100 further comes down. Thus, the extension portion of the cover film 2100 has the shape adhered to the bonding wires 1111 being the electrical connection portion along the angular shape thereof, through the sealing resin 2000 coating the bonding wires 1111. The fluxion of the sealing resin 2000 approximately stops at this moment. Heating of about 80° C. is executed for five consecutive hours in this state to cure the sealing resin 2000, and the process for coating the electrical connection portion by the extension portion of the cover film 2100 is then completed. Incidentally, it should be noted that the heating temperature and the heating time are properly changed according to the physical property of the sealing resin 2000.

In each of the above respects of the embodiment 3, although a polyimide film, an aramid film or the like is applicable as the material of the cover film 2100, the material having high resistivity for the ink to be used in recording is preferable even in this case. Moreover, although the thickness of the cover film 2100 can be set arbitrarily, it is preferable in consideration of the object of this aspect to have the thickness of 100 µm or less. Besides, on the surface of the extension portion of the cover film 2100 to be adhered to the sealing resin 2000, it is preferable to execute plasma treatment, corona treatment, blasting treatment or the like as a preprocess. Namely, by doing so, it is possible to improve adhesiveness between the extension portion of the cover film 2100 and the sealing resin 2000, and it is thus possible to improve reliability for the slidable movement of the blade-like member.

Furthermore, although the method in which the wire bonding is used is explained as the electrical bonding method in the above, it is possible to use any of the method in which the flying lead is used, the method in which the electrical bonding adhesive (ACF, ACP, NCF, NCP) is used, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-361183 filed on Dec. 15, 2005, Japanese Patent Application No. 2006-066322 filed on Mar. 10, 2006, Japanese Patent Application No. 2006-283800 filed on Oct. 18, 2006, and Japanese Patent Application No. 2006-318358 filed on Nov. 27, 2006, which are hereby incorporated by reference herein in their entirety.

What is claimed is:

1. A liquid discharge head comprising:
    a discharge element substrate including a discharge port for discharging liquid and a discharge energy generating element;
    an electrical wiring substrate adapted to input an electrical signal to the discharge energy generating element;
    a supporting mechanism adapted to support said discharge element substrate and said electrical wiring substrate;
    an electrical connection portion adapted to electrically connect said discharge element substrate with said electrical wiring substrate;
    a sealing resin coated on said electrical connection portion; and
    a film-like member coating said electrical connection portion along a shape of said electrical connection portion through said sealing resin.

2. A liquid discharge head according to claim 1, wherein said film-like member is a polyimide having a thickness of 3 µm or more and 10 µm or less.

3. A liquid discharge head according to claim 1, wherein a part of said film-like member is fixed to said electrical wiring substrate.

4. A liquid discharge head comprising:
    a recording element substrate on which plural nozzles for discharging liquid are arranged and plural recording elements for generating discharge energy to discharge the liquid from the nozzles are arranged; and
    an electrical wiring substrate electrically connected with said recording element substrate, wherein an electrical connection portion between said recording element substrate and said electrical wiring substrate is coated with a sealing resin, and the sealing resin is coated with an extension portion formed by stretching a cover film provided on a surface of said electrical wiring substrate.

5. A liquid discharge head according to claim 4, wherein the extension portion of the cover film is formed so as to coat at least the electrical connection portion between said recording element substrate and said electrical wiring substrate and not reach the nozzles.

6. A liquid discharge head according to claim 4, wherein the extension portion of the cover film is fixed in a shape conformable to a shape of the electrical connection portion.

* * * * *